(12) United States Patent
Muro et al.

(10) Patent No.: US 9,664,827 B2
(45) Date of Patent: *May 30, 2017

(54) COLORED COMPOSITION, METHOD OF PRODUCING COLOR FILTER USING THE SAME, COLOR FILTER AND SOLID-STATE IMAGING DEVICE

(71) Applicant: FUJIFILM Corporation, Tokyo (JP)

(72) Inventors: Naotsugu Muro, Shizuoka (JP); Yasuo Sugishima, Shizuoka (JP); Kaoru Aoyagi, Shizuoka (JP); Mitsuji Yoshibayashi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 539 days.

This patent is subject to a terminal disclaimer.

(21) Appl. No.: 14/172,239

(22) Filed: Feb. 4, 2014

(65) Prior Publication Data

US 2014/0151614 A1 Jun. 5, 2014

Related U.S. Application Data

(63) Continuation of application No. PCT/JP2012/072827, filed on Aug. 31, 2012.

(30) Foreign Application Priority Data

Aug. 31, 2011 (JP) .................................. 2011-190185

(51) Int. Cl.
G02B 5/22 (2006.01)
G02B 13/00 (2006.01)
(Continued)

(52) U.S. Cl.
CPC ............... *G02B 5/22* (2013.01); *G02B 5/201* (2013.01); *G02B 13/0085* (2013.01);
(Continued)

(58) Field of Classification Search
CPC ...... G02B 5/22; G02B 5/201; H01L 27/14685
See application file for complete search history.

(56) References Cited

U.S. PATENT DOCUMENTS 8,343,365 B2 * 1/2013 Yoshibayashi ........ G03F 7/0007
216/2
9,442,373 B2 * 9/2016 Aoyagi ............. H01L 27/14621
(Continued)

FOREIGN PATENT DOCUMENTS

JP          8220743 A    8/1996
JP       2006222290 A    8/2006
(Continued)

OTHER PUBLICATIONS

Communication issued Feb. 5, 2016, issued by the Korean Intellectual Property Office in counterpart Korean Patent Application No. 10-2014-7005209.
(Continued)

*Primary Examiner* — Sanza McClendon
(74) *Attorney, Agent, or Firm* — Sughrue Mion, PLLC

(57) ABSTRACT

The invention is directed to a colored composition for forming a green color filter, containing a color pigment, wherein a content of the color pigment to a total solid content of the colored composition is 60% by weight or more, and a layer having a thickness of 0.6 μm formed from the colored composition has light transmittance of 80% or more at a wavelength of 550 nm and light transmittance of 50% or less at a wavelength of 450 nm, and a method of producing a color filter including (A) forming a first colored layer containing a first colored composition and (B) patterning with dry etching so as to from a through-hole group in the first colored layer, wherein the first colored composition is the colored composition as defined herein.

12 Claims, 12 Drawing Sheets

(51) Int. Cl.
  *G02B 5/20* (2006.01)
  *H01L 27/146* (2006.01)
  *G02B 3/00* (2006.01)

(52) U.S. Cl.
  CPC .. *H01L 27/14621* (2013.01); *H01L 27/14645* (2013.01); *H01L 27/14685* (2013.01); *G02B 3/0006* (2013.01)

(56) References Cited

U.S. PATENT DOCUMENTS

| | | | |
|---|---|---|---|
| 9,442,374 B2* | 9/2016 | Sugishima | H01L 27/14621 |
| 2007/0298164 A1 | 12/2007 | Ogata et al. | |
| 2008/0017607 A1* | 1/2008 | Yoshibayashi | G03F 7/0007 |
| | | | 216/24 |
| 2010/0119959 A1 | 5/2010 | Nakashima et al. | |
| 2011/0014401 A1 | 1/2011 | Fujimaki et al. | |

FOREIGN PATENT DOCUMENTS

| | | |
|---|---|---|
| JP | 2006349828 A | 12/2006 |
| JP | 200748774 A | 2/2007 |
| JP | 200846584 A | 2/2008 |
| JP | 2008-248120 A | 10/2008 |
| JP | 2009-227839 A | 10/2009 |
| JP | 201085701 A | 4/2010 |
| WO | 2009/116442 A1 | 9/2009 |

OTHER PUBLICATIONS

Communication from the Korean Intellectual Property Office dated Aug. 3, 2015 in a counterpart Korean application No. 10-2014-7005209.

International Search Report, dated for Dec. 4, 2012, issued by the International Searching Authority in counterpart International Application No. PCT/JP2012/072827.

Written Opinion, dated for Dec. 4, 2012, issued by the International Searching Authority in counterpart International Application No. PCT/JP2012/072827.

Office Action dated Sep. 2, 2014 issued by Japanese Patent Office in counterpart Japanese application No. 2011-190185.

Office Action dated Apr. 7, 2015 issued by Japanese Patent Office in counterpart Japanese Application No. 2011-190185.

Office Action dated May 4, 2016 issued by the Taiwanese Patent Office in counterpart Taiwanese Patent Application No. 101131352.

* cited by examiner

COLORED COMPOSITION, METHOD OF PRODUCING COLOR FILTER USING THE SAME, COLOR FILTER AND SOLID-STATE IMAGING DEVICE

CROSS REFERENCE TO RELATED APPLICATION

This is a continuation of International Application No. PCT/JP2012/072827 filed on Aug. 31, 2012, and claims priority from Japanese Patent Application No. 2011-190185 filed on Aug. 31, 2011, the entire disclosures of which are incorporated herein by reference.

TECHNICAL FIELD

The present invention relates to a colored composition, a method of producing a color filter using the same, a color filter and a solid-state imaging device.

BACKGROUND ART

For instance, in a solid-state imaging device, a color filter in which colored pixels of plural colors, for example, a red color pixel, a green color pixel or a blue color pixel are two-dimensionally arrayed on a support, for example, a semiconductor substrate is provided. As to the solid-state imaging device, in recent years, increase in the number of pixels is remarkable and when it is compared with a traditional solid-state imaging device having the same inch size, reduction of pixel size is noticeable. Further, along with the reduction of pixel size, performance demand on color separation becomes strict and in order to maintain device performances, for example, color shading performance or color mixing prevention, performances, for example, reduction in thickness, rectangularization or elimination of overlap area in which colors are overlapped between respective colored pixels are required for the color filter.

As a method of producing such a color filter, a photolitho method has been often employed. The photolitho method is a method in which a colored photosensitive composition is coated on a support and dried to form a colored layer and the colored layer is subjected to pattern exposure, development and the like to form a colored pixel of a first color (for example, green color), and then colored pixels of remaining colors are formed in the same manner as above.

However, along with the miniaturization of pixel in the solid-state imaging device, it becomes difficult for pattern formation by a so-called photolitho method to balance a spectral property with a pattern-forming property of color filter toward a request for miniaturization and reduction in thickness of color filter. Specifically, in a color filter for solid-state imaging device, there is a tendency to seek the miniaturization so as that as to the reduction in thickness of colored pattern, the thickness is, for example, 1 µm or less and the pixel pattern size is 2 µm or less (for example, from 0.5 to 2.0 µm).

In particular, together with the progress of reduction in thickness, a relative amount of a coloring agent, for example, pigment in a layer increases, on the other hand an amount of a component contributing a photolitho property other than the coloring agent in the layer relatively decreases. With respect to the pattern-forming property due to the decrease of amount of a component contributing a photolitho property, in case of the demand on pattern formation less than 2.0 µm there is a problem, for example, in that the pattern profile by cross-sectional observation has a round pattern edge and is lack of rectangularity even when correction, for example, OPC has been conducted, although the effect of improving the pattern profile is recognized when observed from above. It has been known that in a color filter using a pigment dispersion liquid (a color filter produced by a photolitho method using colored radiation-sensitive compositions in which a pigment is dispersed in various compositions) the round pattern edge becomes prominent owing to light scattering by the pigment at the time of exposure.

In particular, recently, based on the further demand on high-definition in a color filter for solid-state imaging device, for example, a forming property of 1.4 µm pattern has been requested, which is close to the limit of resolution in a hitherto known photolitho method.

Against the method of producing a color filter utilizing the photolitho method, a processing method using a dry etching method has been proposed as a method effective for realizing the miniaturization and reduction in thickness of pattern. The dry etching method has been adopted as a method of forming a pattern (each colored pixel) in a rectangular form, and a pattern-forming method with combination of the photolitho method and dry etching method or the like has been proposed (see, for example, JP-A-2006-222290 (the term "JP-A" as used herein means an "unexamined published Japanese patent application") and JP-A-2007-48774).

SUMMARY OF INVENTION

However, for the purpose of further improvement in performances of solid-state image sensing device, further improvement in performances of color filter has been demanded.

As a result of the extensive investigations, the inventors have found that when a green color layer is formed by using a specific colored composition, the green color layer highly excellent in color separation can be obtained. The inventors have also found that when a green color pixel is produced by forming a pattern with dry etching of the green color layer obtained, change in a spectral characteristic due to the dry etching is extremely inhibited.

Specifically, an object of the present invention is to provide a colored composition for forming a green color filter, which can form a green color layer for forming a green color pixel in a state where color separation is highly excellent and which when dry etching is applied to the green color layer to form a green color pixel, a difference between a spectral characteristic of the green color layer and a spectral characteristic of the green color pixel is small and the excellent color separation characteristic expressed by the green color layer can be surely passed to the green color pixel, and a method of producing a color filter using the colored composition, a color filter and a solid-state image sensing device.

The means for dissolving the problems are specifically described below.

(1) A colored composition for forming a green color filter containing a color pigment, wherein a content of the color pigment to a total solid content of the colored composition is 60% by weight or more, and a layer having a thickness of 0.6 µm formed from the colored composition has light transmittance of 80% or less at a wavelength of 550 nm and light transmittance of 50% or less at a wavelength of 450 nm.

(2) The colored composition for forming a green color filter as described in (1) above, wherein the color pigment is a green pigment.

(3) The colored composition for forming a green color filter as described in (2) above, wherein the green pigment is one or more pigments selected from a group consisting of C. I. Pigment Green 7, C. I. Pigment Green 36 and C. I. Pigment Green 58.

(4) The colored composition for forming a green color filter as described in (3) above, wherein the green pigment is C. I. Pigment Green 58.

(5) The colored composition for forming a green color filter as described in any one of (2) to (4) above, which further contains a yellow pigment.

(6) The colored composition for forming a green color filter as described in (5) above, wherein the yellow pigment is one or more pigments selected from a group consisting of C. I. Pigment Yellow 139, C. I. Pigment Yellow 150 and C. I. Pigment Yellow 185.

(7) The colored composition for forming a green color filter as described in any one of (1) to (6) above, which is used for a method of forming a pattern by dry etching.

(8) A method of producing a color filter comprising (A) a step of forming a first colored layer comprising a first colored composition and (B) a step of patterning with dry etching so as to from a through-hole group in the first colored layer, wherein the first colored composition is the colored composition as described in any one of (1) to (7) above.

(9) The method of producing a color filter as described in (8) above, wherein the through-hole group comprises a first through-hole part group and a second through-hole part group and the method further comprises (C) a step of stacking a second colored radiation-sensitive layer comprising a second colored radiation-sensitive composition on the first colored layer so as that an inside of each through-hole of the first through-hole part group and second through-hole part group is filled with the second colored radiation-sensitive composition to form a plurality of second colored pixels, (D) a step of exposing and developing a position of the second colored radiation-sensitive layer corresponding to the first through-hole part group provided in the first colored layer to remove the second colored radiation-sensitive layer and the plurality of second colored pixels formed in the inside of each through-hole of the second through-hole part group provided in the first colored layer, (E) a step of stacking a third colored radiation-sensitive layer comprising a third colored radiation-sensitive composition on the first colored layer so as that an inside of each through-hole of the second through-hole part group is filled with the third colored radiation-sensitive composition to form a plurality of third colored pixels, and (F) a step of exposing and developing a position of the third colored radiation-sensitive layer corresponding to the second through-hole part group provided in the first colored layer to remove the third colored radiation-sensitive layer.

(10) The method of producing a color filter as described in (8) above, wherein the through-hole group is a plurality of first through-holes and the method further comprises (C') a step of stacking a second colored layer comprising a second colored composition on the first colored layer so as that an inside of each of the first through-holes is filled with the second colored composition to form a plurality of second colored pixels, (D') a step of forming a plurality of first colored pixels by patterning with dry etching so as to form a plurality of second through-holes different from the plurality of first through-holes in the first colored layer, (D") a step of conducting a planarization treatment of the second colored layer until at least the first colored layer is revealed, (E) a step of stacking a third colored radiation-sensitive layer comprising a third colored radiation-sensitive composition on the first colored layer so as that an inside of each of plurality of second through-holes is filled with the third colored radiation-sensitive composition to form a plurality of third colored pixels, and (F) a step of exposing and developing a position of the third colored radiation-sensitive layer corresponding to the plurality of second through-holes provided in the first colored layer to remove the third colored radiation-sensitive layer, and wherein (D") the step of conducting a planarization treatment is conducted either after (C') the step of stacking a second colored layer and before (D') the step of patterning with dry etching or after (D') the step of patterning with dry etching and before (E) the step of stacking a third colored radiation-sensitive layer.

(11) The method of producing a color filter as described in (10) above, wherein (D") the step of conducting a planarization treatment is conducted after (C') the step of stacking a second colored layer and before (D') the step of patterning with dry etching.

(12) The method of producing a color filter as described in (10) above, wherein (D") the step of conducting a planarization treatment is conducted after (D') the step of patterning with dry etching and before (E) the step of stacking a third colored radiation-sensitive layer.

(13) The method of producing a color filter as described in (11) above, wherein each of (B) the step of patterning with dry etching and (D') the step of patterning with dry etching comprises a step of further forming a photoresist layer on the first colored layer, a step of patterning the photoresist layer by conducting exposure and development to obtain a resist pattern, and a step of conducting dry etching of the first colored layer using the resist pattern as an etching mask.

(14) The method of producing a color filter as described in (12) above, wherein (B) the step of patterning with dry etching comprises a step of further forming a photoresist layer on the first colored layer and (D') the step of patterning with dry etching comprises a step of further forming a photoresist layer on the second colored layer; and each of (B) the step of patterning with dry etching and (D') the step of patterning with dry etching further comprises a step of patterning the photoresist layer by conducting exposure and development to obtain a resist pattern and a step of conducting dry etching of the colored layer using the resist pattern as an etching mask.

(15) The method of producing a color filter as described in any one of (10) to (14) above, wherein (D") the step of conducting a planarization treatment is conducted by an etch back treatment or a chemical mechanical polishing treatment.

(16) The method of producing a color filter as described in (8) above, wherein the through-hole group is a plurality of first through-holes and the method further comprises (C') a step of stacking a second colored layer comprising a second colored composition on the first colored layer so as that an inside of each of the first through-holes is filled with the second colored composition to form a plurality of second colored pixels, (D') a step of forming a plurality of first colored pixel by patterning with dry etching so as to form a plurality of second through-holes different from the plurality of first through-holes in the first colored layer, (E') a step of stacking one or more colored layers including a third colored layer comprising a third colored composition on the first colored layer so as that an inside of each of plurality of second through-holes is filled with the third colored composition to form a plurality of third colored pixels, and (F') a step of conducting a planarization treatment of the one or more colored layers stacked on the first colored layer until at least the first colored layer is revealed.

(17) The method of producing a color filter as described in (16) above, which further comprises (D") a step of conducting a planarization treatment of the second colored layer until at least the first colored layer is revealed after (C') the step of stacking a second colored layer and before (D') the step of patterning with dry etching, and the one or more colored layers stacked on the first colored layer in the step (E') is the third colored layer.

(18) The method of producing a color filter as described in (17) above, wherein (D") the step of conducting a planarization treatment is conducted by an etch back treatment or a chemical mechanical polishing treatment.

(19) The method of producing a color filter as described in (16) above, wherein the one or more colored layers stacked on the first colored layer in the step (E') are layers comprising the second colored layer and the third colored layer.

(20) The method of producing a color filter as described in (17) above, wherein each of (B) the step of patterning with dry etching and (D') the step of patterning with dry etching comprises a step of further forming a photoresist layer on the first colored layer, a step of patterning the photoresist layer by conducting exposure and development to obtain a resist pattern, and a step of conducting dry etching of the first colored layer using the resist pattern as an etching mask.

(21) The method of producing a color filter as described in (19) above, wherein (B) the step of patterning with dry etching comprises a step of further forming a photoresist layer on the first colored layer and (D') the step of patterning with dry etching comprises a step of further forming a photoresist layer on the second colored layer; and each of (B) the step of patterning with dry etching and (D') the step of patterning with dry etching further comprises a step of patterning the photoresist layer by conducting exposure and development to obtain a resist pattern and a step of conducting dry etching of the first colored layer using the resist pattern as an etching mask.

(22) The method of producing a color filter as described in any one of (16) to (21) above, wherein (F') the step of conducting a planarization treatment is conducted by an etch back treatment or a chemical mechanical polishing treatment.

(23) The method of producing a color filter as described in any one of (8) to (22) above, wherein the first colored layer is a green color transmission layer.

(24) The method of producing a color filter as described in any one of (9) to (23) above, wherein one of the second colored pixel and the third colored pixel is a red color transmission part and the other is a blue color transmission part.

(25) The method of producing a color filter as described in any one of (9) to (23) above, wherein a content of the coloring agent to the second colored pixel is 30% by weight or more and a content of the coloring agent to the third colored pixel is 30% by weight or more.

(26) A color filter obtained by the method of producing a color filter as described in any one of (8) to (25) above.

(27) A solid-state imaging device having the color filter as described in (26) above.

According to the present invention, a colored composition for forming a green color filter, which can form a green color layer for forming a green color pixel in a state where color separation is highly excellent and which when dry etching is applied to the green color layer to form a green color pixel, a difference between a spectral characteristic of the green color layer and a spectral characteristic of the green color pixel is small and the excellent color separation characteristic expressed by the green color layer can be surely passed to the green color pixel, and a method of producing a color filter using the colored composition, a color filter and a solid-state image sensing device can be provided.

DESCRIPTION OF REFERENCE NUMERALS AND SIGNS

Figure 1:
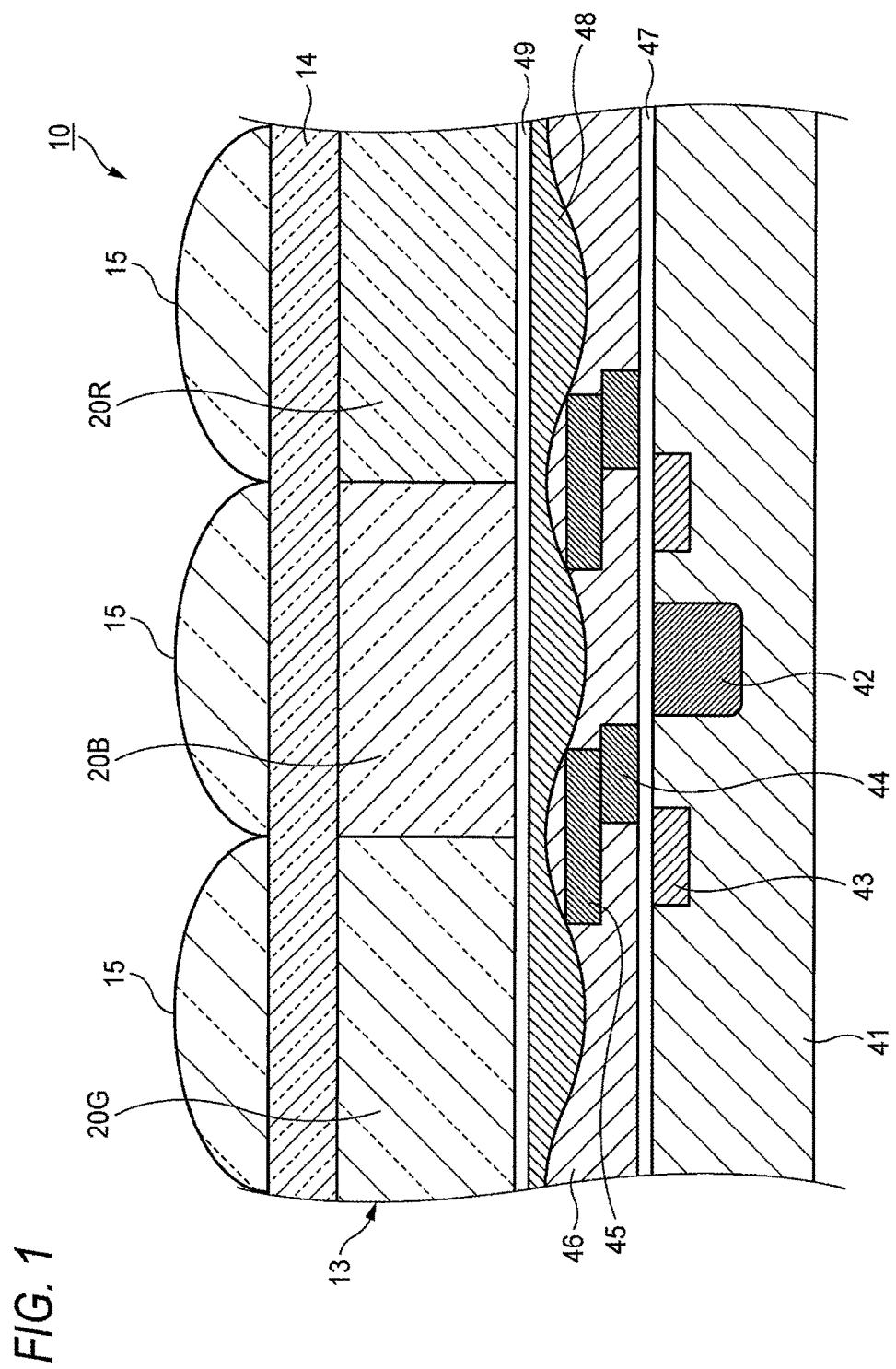
FIG. 1 is a schematic cross-sectional view showing a configuration example of a color filter and a solid-state imagine device.

10: Solid-state imaging device
11: First colored layer
12, 12°: First colored pattern
13, 100: Color filter
14: Planarizing film
15: Microlens
20G Green color pixel (first colored pixel)
20R Red color pixel (second colored pixel)
20B Blue color pixel (third colored pixel)
21: Second colored radiation-sensitive layer
21A: Position corresponding to the first through-hole part group 121
21': Second colored layer
22: Second colored pattern
22R: Plurality of second colored pixels formed in the inside of each through-hole of the second through-hole part group 122
31: Third colored radiation-sensitive layer
31A: Position corresponding to the second through-hole part group 122
31', 31": Third colored layer
32: Third colored pattern
41: P well
42: Photo detector (photo diode)
43: Impurity diffusion layer
44: Electrode
45: Wiring layer
46: BPSG film
47: Insulating film
48: P—SiN film
49: Planarizing layer
51: Photoresist layer
51A, 51A', 51B, 51C: Resist through-hale
52, 52', 52", 52''': Resist pattern (patterned photoresist layer)
120: Through-hole group
121: First through-hole part group (first through-hole)
122: Second through-hole part group (second through-hole)

DESCRIPTION OF EMBODIMENTS

The composition according to the invention will be described in detail below.

In the specification, with respect to the description of a group (atomic group), when the group is not indicated whether substituted or unsubstituted, the group includes the group which has a substituent as well as the group which does not have a substituent. For example, the description "an alkyl group" includes not only an alkyl group which does not have a substituent (an unsubstituted alkyl group) but also an alkyl group which has a substituent (a substituted alkyl group).

The description of the constituent element below is made based on the typical embodiment of the invention in some cases, but the invention should not be construed as being limited thereto. In the specification, a numerical value range represented by using the term "to" means a range which includes the numerical values described before and after the term "to" as a lower limit and an upper limit, respectively.

In the specification, the term "(meth)acrylate" represents acrylate and methacrylate, the term "(meth)acryl" represents acryl and methacryl, and the term "(meth)acryloyl" represents acryloyl and methacryloyl. The monomer in the invention is distinguished from an oligomer and a polymer and means a compound having a weight average molecular weight of 2,000 or less. In the specification, a polymerizable compound means a compound having a polymerizable group and may be a monomer or a polymer. The polymerizable group means a group involved in a polymerization reaction.

<Colored Composition for Forming Green Color Filter>

The colored composition for forming a green color filter according to the invention is a colored composition for forming a green color filter containing a color pigment, wherein a content of the color pigment to a total solid content of the colored composition is 60% by weight or more, and a layer having a thickness of 0.6 μm formed from the colored composition has light transmittance of 80% or more at a wavelength of 550 nm and light transmittance of 50% or less at a wavelength of 450 nm.

The light transmittance of the layer at a wavelength of 550 nm is preferably 85% or more, and more preferably 90% or more. The upper limit of the light transmittance of the layer at a wavelength of 550 nm is not particularly restricted and is ordinarily 95% or less.

The light transmittance of the layer at a wavelength of 450 nm is preferably 45% or less, more preferably 40% or less, and still more preferably 35% or less. The lower limit of the light transmittance of the layer at a wavelength of 450 nm is not particularly restricted and is ordinarily 5% or more.

By adjusting the light transmittance of the layer at a wavelength of 550 nm to 80% or more and the light transmittance of the layer at a wavelength of 450 nm to 50% or less, a green color layer for forming a green color pixel formed from the colored composition according to the invention is highly excellent in color separation because while the green color layer sufficiently transmits the green component of light, it sufficiently cuts the blue component of light.

Further, in case of forming a green color pixel by applying dry etching to the green color layer for forming a green color pixel formed from the colored composition for forming a green color filter according to the invention, a difference between a spectral characteristic of the green color layer and a spectral characteristic of the green color pixel is small and the excellent color separation characteristic expressed by the green color layer can be surely passed to the green color pixel. It is not quite clear whether this is caused by that the light transmittance of the layer at a wavelength of 550 nm is 80% or more and the light transmittance of the layer at a wavelength of 450 nm is 50% or less or that the content of the color pigment to the total solid content of the colored composition is 60% by weight or more.

Therefore, the colored composition for forming a green color filter according to the invention is preferably a colored composition for forming a pattern by dry etching.

The light transmittance of the layer obtained from the colored composition for forming a green color filter according to the invention can be measured in accordance with the method described below.

Specifically, the colored composition for forming a green color filter is coated on a glass substrate by a method, for example, spin coating, dried by a hot plate at 100° C. for 180 seconds, and after that subjected to a heat treatment (post bake) for 300 seconds using a hot plate of 200° C. to from a layer having a thickness of 0.6 µm.

As to the glass substrate having the layer thus-obtained, light transmittance at a wavelength of 450 nm and light transmittance at a wavelength of 550 nm are determined by a spectrophotometer (UV-3600 UV-VIS-NIR Spectrophotometer, produced by Shimadzu Corp.) using a glass substrate as reference.

Each component constituting the colored composition for forming a green color filter according to the invention will be described below.

[1] Color Pigment

The colored composition for forming a green color filter according to the invention contains a color pigment. As long as the filter obtained by the colored composition is a green filter, the color pigment is not particularly restricted and the color pigments may be used individually or as a mixture of two or more thereof.

As the pigment, heretofore known various organic pigments are exemplified. Considering that high transmittance is preferred, it is preferred to use a pigment having an average particle size as small as possible.

The colored composition for forming a green color filter according to the invention preferably contains a green pigment as the color pigment.

Examples of the green pigment include C. I. Pigment Green 7, 10, 36, 37 and 58.

The green pigment is preferably one selected from a group consisting of C. I. Pigment Green 7, C. I. Pigment Green 36 and C. I. Pigment Green 58.

The green pigment is more preferably C. I. Pigment Green 58 from the standpoint that a difference between a spectral characteristic of the green color layer and a spectral characteristic of the green color pixel is small and the excellent color separation characteristic expressed by the green color layer can be more surely passed to the green color pixel.

Further, it is preferred that the colored composition for forming a green color filter according to the invention further contains a yellow pigment as the color pigment in addition to the green pigment described above. Thus, the light transmittance at a wavelength of 450 nm of the layer having a thickness of 0.6 µm formed from the colored composition can be more surely controlled to 50% or less.

Examples of the yellow pigment include C. I. Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213 and 214.

The yellow pigment is preferably one selected from a group consisting of C. I. Pigment Yellow 139, C. I. Pigment Yellow 150 and C. I. Pigment Yellow 185.

The color pigment agent according to the invention is desirably a pigment having an average particle size (r) satisfying 20 nm≤r≤300 nm, preferably 25 nm≤r≤250 nm, particularly preferably 30 nm≤r≤200 nm. By using the pigment having such an average particle size, a pixel having a high contrast ratio and high light transmittance can be obtained. The term "average particle size" as used herein means an average particle size of a secondary particle formed by aggregation of primary particles (single fine crystal). The average particle size of primary particles is determined by observing the primary particles through SEM or TEM, measuring particle sizes of 100 particles in the portion where particles are not agglomerated, and calculating an average value of the particle sizes.

Also, as to particle size distribution (hereinafter, simply referred to as "particle size distribution") of secondary particle of the dye for use in the invention, it is desirable that secondary particles within a range of (average particle size ±100) am accounts for 70% by weight or more, preferably 80% by weight or more, of the total particles.

The pigment having the average particle size and particle size distribution described above can be prepared by mixing and dispersing with pulverization a commercially available pigment together with other pigment (its average particle size ordinarily exceeding 300 nm) used, if desired, preferably, as a pigment mixture solution prepared by mixing with a dispersing agent and a solvent, using a pulverizer, for example, a beads mill or a roll mill. The pigment obtained in the manner as above has a form of pigment dispersion liquid.

—Miniaturization of Pigment—

According to the invention, a fine and granulated color pigment may be used, if desired. Miniaturization of the pigment can be achieved through a process which comprises preparing a viscous liquid composition of the pigment together with a water-soluble organic solvent and a water-soluble inorganic salt and then applying stress to the composition using a wet type pulverizing apparatus or the like to grind the pigment.

Examples of the water-soluble organic solvent used in the step of miniaturization of the pigment includes methanol, ethanol, isopropanol, n-propanol, isobutanol, n-butanol, ethylene glycol, diethylene glycol, diethylene glycol monomethyl ether, diethylene glycol monoethyl ether, diethylene glycol monobutyl ether, propylene glycol and propylene glycol monomethyl ether acetate.

Another solvent having low water-solubility or no water-solubility may be used as long as the solvent is used in such a small amount that it is adsorbed onto the pigment and not discharged into waste water, and examples of such solvent include benzene, toluene, xylene, ethylbenzene, chlorobenzene, nitrobenzene, aniline, pyridine, quinoline, tetrahydrofuran, dioxane, ethyl acetate, isopropyl acetate, butyl acetate, hexane, heptane, octane, nonane, decane, undecane, dodecane, cyclohexane, methylcyclohexane, a halogenated hydrocarbon, acetone, methyl ethyl ketone, methyl isobutyl ketone, cyclohexanone, dimethylformamide, dimethylsulfoxide and N-methylpyrrolidone.

The solvents used in the step of miniaturization of the pigment may be employed only one kind or as a mixture of two or more kinds thereof, if desired.

Examples of the water-soluble inorganic salt used in the step of miniaturization of the pigment in the invention include sodium chloride, potassium chloride, calcium chloride, barium chloride and sodium sulfate.

The amount of the water-soluble inorganic salt used in the step of miniaturization is from 1 to 50 times by weight based on the amount of the pigment and a higher grinding effect is achieved when used in a larger amount. From the standpoint of productivity, the amount of the water-soluble inorganic salt is more preferably from 1 to 10 times by weight. The inorganic salt having water content of 1% or less is preferably used.

The amount of the water-soluble organic solvent used in the step of miniaturization is in a range from 50 to 300 parts by weight, more preferably in a range from 100 to 200 parts by weight, based on 100 parts by weight of the pigment.

The operation conditions of the wet type pulverizing apparatus in the step of miniaturization of the pigment are not particularly restricted. When the apparatus is a kneader, the operation conditions are that the number of revolutions of a blade in the apparatus is preferably from 10 to 200 rpm in order to efficiently promote grinding with pulverizing media, and the revolution ratio between two shafts is preferably relatively higher for a higher grinding effect. The operation time including a dry type pulverizing time is preferably from 1 to 8 hours, and the inner temperature of the apparatus is preferably from 50 to 150° C. The water-soluble inorganic salt which is pulverizing media preferably has a pulverizing particle size from 5 to 50 μm with a sharp particle size distribution and a spherical form.

—Blending of Pigments—(Color Matching)

The color pigments may be used individually or in combination of two or more thereof in order to increase color purity.

Specifically, as the green pigment, a halogenated phthalocyanine pigment can be used individually or as a mixture with a disazo yellow pigment, a quinophthalone yellow pigment, an azomethine yellow pigment or an isoindoline yellow pigment. For instance, examples of such a mixture include mixtures of C. I. Pigment Green 7, C. I. Pigment Green 36, C. I. Pigment Green 37 or C. I. Pigment Green 58 and C. I. Pigment Yellow 83, C. I. Pigment Yellow 138, C. I. Pigment Yellow 139, C. I. Pigment Yellow 150, C. I. Pigment Yellow 180 or C. I. Pigment Yellow 185.

A weight ratio of the green pigment to the yellow pigment is preferably from 100:5 to 100:200. In the weight ratio range described above, light transmittance in a wavelength region from 400 nm to 450 nm can be surely suppressed, color purity can be improved, and hues in the vicinity of target NTSC hues can be obtained as designed without shifting the main wavelength toward longer wavelengths. The weight ratio is particularly preferably in a range from 100:20 to 100:150.

In the colored composition according to the invention, the content of the color pigment to the total solid content of the colored composition is 60% by weight or more, preferably 62% by weight or more, and more preferably 65% by weight or more. Thus, the characteristic in that a layer having a thickness of 0.6 μm formed from the colored composition has light transmittance of 80% or more at a wavelength of 550 nm and light transmittance of 50% or less at a wavelength of 450 nm can be more surely achieved.

Further, the content of the color pigment to the total solid content of the colored composition is preferably 80% by weight or less. Thus, particularly in the case where the colored composition contains a curable compound, the curing can be sufficiently carried out and degradation of strength of the layer can be prevented.

[2] Dispersing Agent

The colored composition for forming a green color filter according to the invention preferably contains a dispersing agent.

The dispersing agent which can be used in the invention includes a polymer dispersing agent (for example, polyamidoamine and a salt thereof, polycarboxylic acid and a salt thereof, a high molecular weight unsaturated acid ester, a modified polyurethane, a modified polyester, a modified poly(meth)acrylate, a (meth)acrylic copolymer or a naphthalenesulfonic acid-formalin condensate) and a surfactant, for example, a polyoxyethylene alkyl phosphoric acid ester, polyoxyethylene alkyl amine or alkanolamine.

The polymer dispersing agent may be classified into a straight-chain polymer, a terminal-modified polymer, a graft polymer and a block polymer based on the structure thereof.

Examples of the terminal-modified polymer having an anchor moiety to the surface of the color pigment include polymers having a phosphoric acid group at a terminal described in JP-A-3-112992 and JP-T-2003-533455 (the term "JP-T" as used herein means a published Japanese translation of a PCT patent application), polymers having a sulfonic acid group at a terminal described in JP-A-2002-273191, polymers having a partial skeleton of organic dye or a hetero ring described in JP-A-9-77994, and polymers produced by modifying an oligomer or polymer having a hydroxy group or an amino group at one terminal with an acid anhydride described in JP-A-2008-29901. Polymers in which two or more anchor moieties (for example, an acid group, an basic group, a partial skeleton of organic dye or a hetero ring) to the infrared-blocking material surface are introduced into the terminals thereof described in JP-A-2007-277514 are also preferred because of their excellent dispersion stability.

Examples of the graft polymer having an anchor moiety to the surface include reaction products of a poly(lower alkyleneimine) and a polyester described in JP-A-54-37082. JP-T-8-507960 and JP-A-2009-258668, reaction products of a polyallylamine and a polyester described in JP-A-9-169821, amphoteric dispersing resins having a basic group and an acidic group described in JP-A-2009-203462, copolymers of a macromonomer and a nitrogen atom-containing monomer described in JP-A-10-339949 and JP-A-2004-37986, graft polymers having a partial skeleton of organic dye or a hetero ring described in JP-A-2003-238837. JP-A-2008-9426 and JP-A-2008-81732, and copolymers of a macromonomer and an acid group-containing monomer described in JP-A-2010-106268.

As to the macromonomer used in the production of a graft polymer having an anchor moiety to the surface by radical polymerization, a known macromonomer can be used, and examples thereof include Macromonomer AA-6 (polymethyl methacrylate having a methacryloyl group as a terminal group), AS-6 (polystyrene having a methacryloyl group as a terminal group), AN-6S (a copolymer of styrene and acrylonitrile having a methacryloyl group as a terminal group) and AB-6 (polybutyl acrylate having a methacryloyl group as a terminal group) produced by Toagosei Co., Ltd., PLACCEL FM5 (a 5 molar equivalent adduct of ε-caprolactone to 2-hydroxyethyl methacrylate) and FA10L (a 10 molar equivalent adduct of ε-caprolactone to 2-hydroxyethyl acrylate) produced by Daicel Corp., and polyester macromonomers described in JP-A-2-272009. Of the macromonomers, polyester macromonomers excellent in flexibility and solvent affinity are particularly preferred from the standpoint of dispersibility and dispersion stability of the pigment in the colored composition and polyester macromonomers represented by the polyester macromonomers described in JP-A-2-272009 are most preferred.

As to the block polymer having an anchor moiety to the surface, block polymers described, for example, in JP-A-2003-49110 and JP-A-2009-52010 are preferred.

The dispersing agent which can be used may be appropriately selected, for example, from known dispersing agents and surfactants.

Specific examples thereof include DISPERBYK-101 (polyamidoamine phosphate), 107 (carboxylic acid ester), 110 (copolymer containing acid group), 130 (polyamide), 161, 162, 163, 164, 165, 166, 170 (high-molecular copolymer) and BYK-P104, P105 (high-molecular weight unsaturated polycarboxylic acid) produced by BYK Chemie, EFKA 4047, 4050-4010-4165 (polyurethane), EFKA 4330-4340 (block copolymer), 4400-4402 (modified polyacrylate), 5010 (polyester amide), 5765 (high-molecular weight polycarboxylate), 6220 (fatty acid polyester) and 6745 (phthalocyanine derivative) produced by Efka Co., Ltd., AJISPER PB821, PB822, PB880, PB881 produced by Ajinomoto Fine-Techno Co., Inc., FLOWLEN TG-710 (urethane oligomer) and POLYFLOW No. 50E, No. 300 (acrylic copolymer) produced by Kyoeisha Chemical Co., Ltd., DISPARLON KS-860, 873SN, 874, #2150 (aliphatic polyvalent carboxylic acid), #7004 (polyetherester), DA-703-50, DA-705, DA-725 produced by Kusumoto Chemicals Ltd., DEMOL RN, N (naphthalenesulfonic acid-formalin polycondensate), MS, C, SN-B (aromatic sulfonic acid-formalin polycondensate), HOMOGENOL L-18 (high-molecular polycarboxylic acid), EMULGEN 920, 930, 935, 985 (polyoxyethylene nonylphenyl ether) and ACETAMIN 86 (stearylamine acetate) produced by Kao Corp., SOLSPERSE 5000 (phthalocyanine derivative), 13240 (polyesteramine), 3000, 17000, 27000 (polymer having a functional moiety in its terminal), 24000, 28000, 32000, 38500 (graft polymer) produce by Lubrizol Japan Ltd., NIKKOL T106 (polyoxyethylene sorbitan monooleate), MYS-IEX (polyoxyethylene monostearate) produced by Nikko Chemicals Co., Ltd., HINOACT T-8000E produced by Kawaken Fine Chemicals Co., Ltd., Organosiloxane Polymer KP341 produced by Shin-Etsu Chemical Co., Ltd., cationic surfactant W001, nonionic surfactant, for example, polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate or sorbitan fatty acid ester, anionic surfactant W004, W005, W017 produced by Yusho Co., Ltd., EFKA-46, EFKA-47, EFKA-47EA, EFKA Polymer 100, EFKA Polymer 400, EFKA Polymer 401, EFKA Polymer 450 produced by Morishita & Co., Ltd., polymer dispersing agent, for example, DISPERSE AID 6, DISPERSE AID 8, DISPERSE AID 15 or DISPERSE AID 9100 produced by San Nopco Ltd., ADEKA PLURONIC L31, F38, L42, L44, L61, L64, F68, L72, P95, F77, P84, F87, P94, L101, P103, F108, L121, P-123 produced by ADEKA Corp., and IONET S-20 produced by Sanyo Chemical Industries, Ltd.

The dispersing agents may be used individually or in combination of two or more thereof. As to the dispersing agent according to the invention, the terminal-modified polymer, graft polymer or block polymer having an anchor moiety to the surface of the color pigment described above may be also used in combination with an alkali-soluble resin. Examples of the alkali-soluble resin include a (meth)acrylic acid copolymer, an itaconic acid copolymer, a crotonic acid copolymer, a maleic acid copolymer, a partially esterified maleic acid copolymer, an acidic cellulose derivative having a carboxylic acid in its side chain and a resin obtained by modifying a polymer having a hydroxy group with an acid anhydride, and particularly, a (meth)acrylic acid copolymer is preferred. Also, N-position substituted maleimide monomer copolymers described in JP-A-10-300922, ether dimer copolymers described in JP-A-2004-300204, and alkali-soluble resins having a polymerizable group described in JP-A-7-319161 are preferred.

From the standpoint of dispersibility and precipitating property, resins described in JP-A-2010-106268 shown below are preferred. In particular, from the standpoint of dispersibility, a polymer dispersing agent having a polyester chain in its side chain is preferred, and a resin having an acid group and a polyester chain is more preferred. As to the acid group in the dispersing agent, from the standpoint of adsorptivity, an acid group having a pKa of 6 or less is preferred, and a carboxylic acid, a sulfonic acid or a phosphoric acid is particularly preferred.

The dispersing agents described in JP-A-2010-106268 are described below.

The dispersing agent is preferably a graft polymer having a graft chain in which the number of atoms exclusive of hydrogen atoms is in a range from 40 to 10,000.

The graft chain in this case means a portion from the position of the root (an atom which connects to the main chain in a group branching from the main chain) of main chain of the polymer to the terminal of the group branching from the main chain. The dispersing agent in the colored composition is a dispersing agent which imparts dispersibility to the color pigment and since the dispersing agent has affinity to the solvent due to the existence of the graft chain, the dispersing agent is excellent in dispersibility of the color pigment and dispersion stability after the lapse of time. Further, when the colored composition is formed, since the graft chain exhibits good interaction with the solvent, uniformity of thickness in the coated layer becomes better.

In the graft polymer, the number of atoms exclusive of hydrogen atoms is preferably from 40 to 10,000 per one graft chain, more preferably from 100 to 500 per one graft chain, and still more preferably from 150 to 260 per one graft chain.

When the number of atoms exclusive of hydrogen atoms per one graft chain is less than 40, since the graft chin is short, the steric repulsion effect decreases to result in deterioration of the dispersibility and dispersion stability in some cases. On the other hand, when the number of atoms exclusive of hydrogen atoms per one graft chain exceeds 10,000, the graft chain becomes too long and the adsorption force to the color pigment may be decreases to result in deterioration of the dispersibility and dispersion stability in some cases.

The term "number of atoms exclusive of hydrogen atoms per one graft chain" as used herein means a number of atoms exclusive of hydrogen atoms which is included in a portion from a root atom which connects to a polymer chain constituting the main chain to a terminal of the branched polymer which is branched from the main chain. When the graft polymer contains two or more kinds graft chains, it is sufficient that a number of atoms exclusive of hydrogen atoms of at least one kind of the graft chains fulfills the requirement described above.

As to the polymer structure of the graft chain, a poly(meth)acryl structure, a polyester structure, a polyurethane structure, a polyurea structure, a polyamide structure, a polyether structure or the like can be used. In order to increase the interaction property of the graft chain with the solvent and thus to enhance the dispersibility and dispersion stability, a graft chain having a poly(meth)acryl structure, polyester structure or a polyether structure is preferred, and a graft chain having a polyester structure or a polyether structure is more preferred.

The graft polymer preferably contains a structural unit (repeating unit) having the graft chain described above and can be obtained by performing polymerization of a macromonomer having a polymer structure as a graft chain according to a conventional method. The structure of macromonomer is not particularly restricted as long as the macromonomer has a substituent capable of reacting with a main chain portion of polymer and a graft chain fulfilling the requirement of the invention. Preferably, a macromonomer having a reactive double bond group can be suitably used.

Examples of a commercially available macromonomer which is suitably used for synthesizing the graft copolymer include AA-6 (produced by Toagosei Co., Ltd.), AA-10

(produced by Toagosei Co. Ltd.), AB-6 (produced by Toagosei Co., Ltd.), AS-6 (produced by Toagosei Co., Ltd.), AN-6 (produced by Toagosei Co., Ltd.), AW-6 (produced by Toagosei Co., Ltd.), AA-714 (produced by Toagosei Co., Ltd.), AY-707 (produced by Toagosei Co., Ltd.), AY-714 (produced by Toagosei Co., Ltd.), AK-5 (produced by Toagosei Co., Ltd.), AK-30 (produced by Toagosei Co., Ltd.), AK-32 (produced by Toagosei Co., Ltd.), BLEMMER PP-100 (produced by NOF Corp.), BLEMMER PP-500 (produced by NOF Corp.), BLEMMER PP-800 (produced by NOF Corp.), BLEMMER PP-1000 (produced by NOF Corp.), BLEMMER 55-PET-800 (produced by NOF Corp.), BLEMMER PME-4000 (produced by NOF Corp.), BLEMMER PSE-400 (produced by NOF Corp.), BLEMMER PSE-1300 (produced by NOF Corp.) and BLEMMER 43PAPE-600B (produced by NOF Corp.). Among them, AA-6 (produced by Toagosei Co., Ltd.), AA-10 (produced by Toagosei Co., Ltd.), AB-6 (produced by Toagosei Co., Ltd.), AS-6 (produced by Toagosei Co., Ltd.), AN-6 (produced by Toagosei Co., Ltd.), BLEMMER PME-4000 (produced by NOF Corp.) or the like is preferred.

The graft polymer contains as a structural unit having the graft chain described above, preferably at least a structural unit represented by any of formulae (1) to (4) shown below, more preferably at least a structural unit represented by any of formulae (1A), (2A), (3A), (3A) and (4).

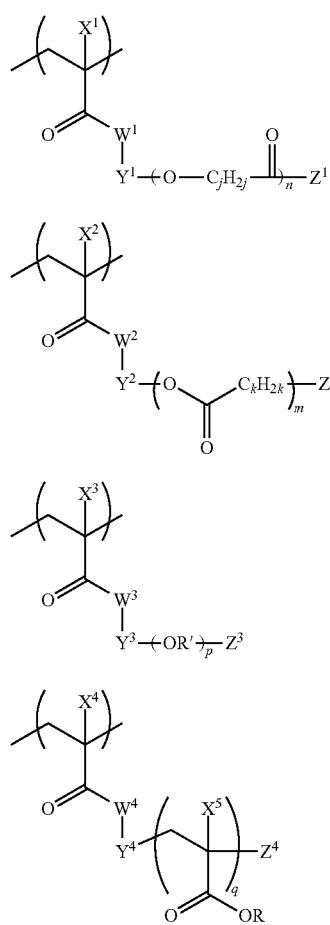

In formulae (1) to (4), $X^1$, $X^2$, $X^3$, $X^4$ and $X^5$ each independently represents a hydrogen atom or a monovalent organic group. From the standpoint of restriction on the synthesis, a hydrogen atom or an alkyl group having from 1 to 12 carbon atoms is preferred, a hydrogen atom or a methyl group is more preferred, and a methyl group is particularly preferred.

In formulae (1) to (4), $W^1$, $W^2$, $W^3$ and $W^4$ each independently represents an oxygen atom or NH, and particularly preferably an oxygen atom.

In formulae (1) to (4), $Y^1$, $Y^2$, $Y^3$ and $Y^4$ each independently represents a divalent connecting group and is not particularly restricted in its structure. Specific examples thereof include connecting groups of (Y-1) to (Y-20) shown below. In the structures shown below, A and B indicate bonds to the left terminal group and the right terminal group, respectively, in formulae (1) to (4). Of the structures shown below, (Y-2) and (Y-13) are preferred in view of ease in synthesis.

(Y-1)

(Y-2)

(Y-3)

(Y-4)

(Y-5)

(Y-6)

(Y-7)

(Y-8)

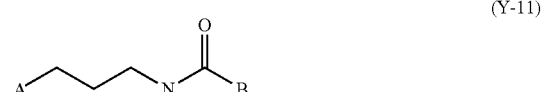

(Y-9)

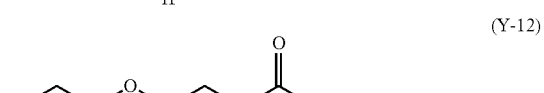

(Y-10)

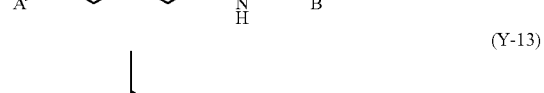

(Y-11)

(Y-12)

(Y-13)

(Y-14) 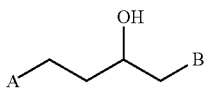

(Y-15) 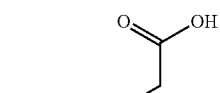

(Y-16) 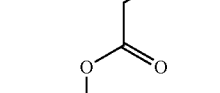

(Y-17) 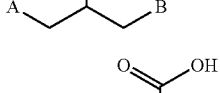

(Y-18) 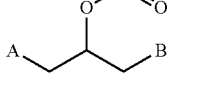

(Y-19) 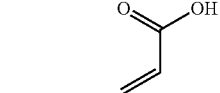

(Y-20) 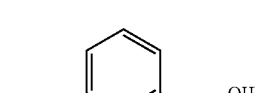

(Y-21) 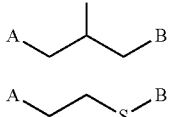

In formulae (1) to (4), $Z^1$, $Z^2$, $Z^3$ and $Z^4$ each independently represents a hydrogen atom or a monovalent substituent. The structure of the substituent is not particularly restricted and specific examples thereof include an alkyl group, a hydroxy group, an alkoxy group, an aryloxy group, a heteroaryloxy group, an alkylthioether group, an arylthioether group, a heteroarylthioether group and an amino group. Among them, from the standpoint of improvement in the dispersibility, those having a steric repulsion effect are preferred, and as the monovalent substituent represented by any of $Z^1$ to $Z^3$, an alkyl group having from 5 to 24 carbon atoms or an alkoxy group having from 5 to 24 carbon atoms is preferred, and an alkoxy group including a branched alkyl group having from 5 to 24 carbon atoms or an alkoxy group including a cyclic alkyl group having from 5 to 24 carbon atoms is particularly preferred. As the monovalent substituent represented by $Z^4$, an alkyl group having from 5 to 24 carbon atoms is preferred, and a branched alkyl group having from 5 to 24 carbon atoms or a cyclic alkyl group having from 5 to 24 carbon atoms is more preferred.

In formulae (1) to (4), n, m, p and q each represents an integer from 1 to 500.

In formulae (1) and (2), j and k each independently represents an integer from 2 to 8. From the standpoint of dispersion stability, j and k in formulae (1) and (2) each preferably represents an integer from 4 to 6, and most preferably represents 5.

In formulae (3), R' represents a branched or strait-chain alkylene group. R' in formula (3) is preferably an alkylene group having from 1 to 10 carbon atoms, and more preferably an alkylene group having from 2 or 3 carbon atoms.

Also, as to R' in formula (3), two or more R's having different structures may be used as a mixture in the graft polymer.

In formula (4), R represents a hydrogen atom or a monovalent organic group. R is not particularly restricted in its structure and is preferably a hydrogen atom, an alkyl group, an aryl group or a heteroaryl group, more preferably a hydrogen atom or an alkyl group. When R is an alkyl group, the alkyl group is preferably a straight-chain alkyl group having from 1 to 20 carbon atoms, a branched alkyl group having from 3 to 20 carbon atoms or a cyclic alkyl group having from 5 to 20 carbon atoms, more preferably a straight-chain alkyl group having from 1 to 20 carbon atoms, and particularly preferably a straight-chain alkyl group having from 1 to 6 carbon atoms.

As to R in formula (4), two or more Rs having different structures may be used as a mixture in the graft polymer.

From the standpoint of dispersion stability, the structural unit represented by formula (1) is preferably a structural unit represented by formula (1A) or (2A) shown below.

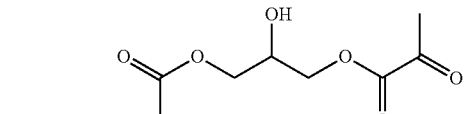

(1A)

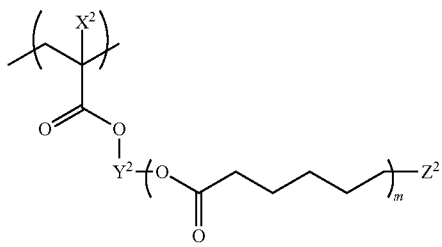
(2A)

In formula (1A), $X^1$, $Y^1$, $Z^1$ and n have the same meanings as $X^1$, $Y^1$, $Z^1$ and n in formula (1), respectively, and the preferred ranges are also the same.

In formula (2A), $X^2$, $Y^2$, $Z^2$ and m have the same meanings as $X^2$, $Y^2$, $Z^2$ and m in formula (2), respectively, and the preferred ranges are also the same.

From the standpoint of dispersion stability, the structural unit represented by formula (3) is preferably a structural unit represented by formula (3A) or (3B) shown below.

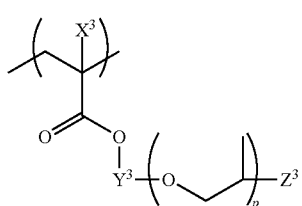
(3A)

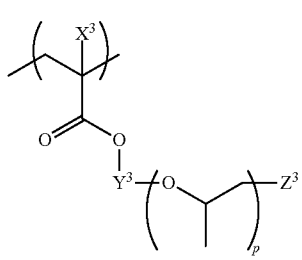
(3B)

In formula (3A) or (3B), $X^3$, $Y^3$, $Z^3$ and p have the same meanings as $X^3$, $Y^3$, $Z^3$ and p in formula (3), respectively, and the preferred ranges are also the same.

The graft polymer is more preferably that containing the structural unit represented by formula (1A).

In the graft polymer for use in the invention, the content of the structural unit (repeating unit) having the graft chain described above is preferably from 10 to 75% by weight, more preferably from 12 to 50% by weight, particularly preferably from 15 to 40% by weight, in terms of weight based on the total weight of the graft polymer. In the range described above, the dispersibility and dispersion stability of the coloring agent are high and the uniformity of thickness in the coated layer formed using the colored composition becomes much better. Moreover, the dispersing resin for use in the invention may be a combination of two or more graft polymers having different structures.

The graft polymer according to the invention may contain a structural unit (repeating unit) having an acid group. The content of the structural unit having an acid group is preferably from 25 to 90% by weight, more preferably from 30 to 80% by weight, most preferably from 40 to 60% by weight, based on the total weight of the graft polymer.

By adjusting the content of the structural unit having an acid group to the range described above, an acid value of the graft polymer is suitably controlled in a preferred range described below.

The acid group also functions as a functional group capable of undergoing interaction with the color pigment in addition to the graft chain.

Examples of the acid group include a carboxylic acid group, a sulfonic acid group, a phosphoric acid group and a phenolic hydroxy group. From the standpoint of adsorption power to a metal oxide particle and dispersibility and dispersion stability, it is preferably one selected from a carboxylic acid group, a sulfonic acid group and a phosphoric acid group and most preferably a carboxylic acid group.

Further, the acid group structure is preferably a structure which takes 5 atoms or more away from the main chain of the resin structure. Moreover, the acid group is most preferably a carboxylic acid connected to an aromatic ring.

The acid groups may be used individually or in combination of two or more thereof.

The acid value of the graft polymer is preferably in a range from 40 to 300 mg KOH/g, more preferably in a range from 50 to 200 mg KOH/g, and still more preferably in a range from 60 to 100 mg KOH/g.

The acid value of the graft polymer according to the invention can be determined, for example, from an average content of acid group in the graft polymer. Also, by changing the content of a monomer unit having an acid group constituting the graft polymer, the resin having the desired acid value can be obtained.

Further, the graft polymer according to the invention may contain, as a structural unit derived from a copolymerization component, other structural unit having various functions, for example, a structural unit having a functional group having an affinity to a dispersion medium used in the dispersion, for the purpose of improving various characteristics, for example, strength, as long as the effect of the invention is not impaired.

Examples of the copolymerization components copolymerizable in the graft polymer according to the invention include a radical polymerizable compound selected from an acrylic ester, a methacrylic ester, a styrene, acrylonitrile, methacrylonitrile, an acrylamide and a methacrylamide.

Specifically, examples thereof include an acrylic ester, for example, an alkyl acrylate in which the alkyl group is preferably an alkyl group having from 1 to 20 carbon atoms (for example, benzyl acrylate, 4-biphenyl acrylate, butyl acrylate, sec-butyl acrylate, tert-butyl acrylate, 4-tert-butylphenyl acrylate, 4-chlorophenyl acrylate, pentachlorophenyl acrylate, 4-cyanobenzyl acrylate, cyanomethyl acrylate, cyclohexyl acrylate, 2-ethoxyethyl acrylate, ethyl acrylate, 2-ethylhexyl acrylate, heptyl acrylate, hexyl acrylate, isobornyl acrylate, isopropyl acrylate, methyl acrylate, 3,5-dimethyladamantyl acrylate, 2-naphthyl acrylate, neopentyl acrylate, octyl acrylate, phenethyl acrylate, phenyl acrylate, propyl acrylate, tolyl acrylate, amyl acrylate, tetrahydrofurfuryl acrylate, 2-hydroxyethyl acrylate, 3-hydroxypropyl acrylate, 2-hydroxypropyl acrylate, 4-hydroxybutyl acrylate, 5-hydroxypentyl acrylate, allyl acrylate, 2-allyloxyethyl acrylate or propargyl acrylate), a methacrylic ester, for example, an alkyl methacrylate in which the alkyl group is preferably an alkyl group having from 1 to 20 carbon atoms (for example, benzyl methacrylate, 4-biphenyl methacrylate, butyl methacrylate, set-butyl methacrylate, tot-butyl methacrylate, 4-tert-butylphenyl methacrylate, 4-chlorophenyl methacrylate, pentachlorophenyl methacrylate, 4-cyanophenyl methacrylate, cyanomethyl methacrylate, cyclohexyl methacrylate, 2-ethoxyethyl methacrylate, ethyl methacrylate, 2-ethylhexyl methacrylate, heptyl methacrylate, hexyl methacrylate, isobornyl methacrylate, isopropyl methacrylate, methyl methacrylate, 3,5-dimethyladamantyl methacrylate, 2-naphthyl methacrylate, neopentyl methacrylate, octyl methacrylate, phenethyl methacrylate, phenyl methacrylate, propyl methacrylate, tolyl methacrylate, amyl methacrylate, tetrahydrofurfuryl methacrylate, 2-hydroxyethyl methacrylate, 3-hydroxypropyl methacrylate, 2-hydroxypropyl methacrylate, 4-hydroxybutyl methacrylate, 5-hydroxypentyl methacrylate, allyl methacrylate, 2-allyloxyethyl methacrylate, propargyl methacrylate, 2-diethylaminoethyl methacrylate or 2-dimethylaminoethyl methacrylate, and a styrene, for example, styrene, an alkyl styrene (for example, methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene or acetoxymethylstyrene), an alkoxy styrene (for example, methoxystyrene, 4-methoxy-3-methylstyrene or dimethoxystyrene), a halogenated styrene (for example, chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene or 4-fluoro-3-trifluoromethylstyrene), acrylonitrile, and methacrylonitrile.

Of the radical polymerizable compounds, a methacrylic acid ester, an acrylamide, a methacrylamide and a styrene are preferably used. Particularly preferred examples include benzyl methacrylate, tert-butyl methacrylate, 4-tert-buthyphenyl methacrylate, pentachlorophenyl methacrylate, 4-cyanophenyl methacrylate, cyclohexyl methacrylate, ethyl methacrylate, 2-ethylhexyl methacrylate, isobornyl methacrylate, isopropyl methacrylate, methyl methacrylate, 3,5-dimethyladamantyl methacrylate, 2-naphthyl methacrylate, neopentyl methacrylate, phenyl methacrylate, tetrahydrofurfuryl methacrylate, 2-hydroxyethyl methacrylate, 3-hydroxypropyl methacrylate, 2-hydroxypropyl methacrylate, allyl methacrylate, acrylamide, N-methylacrylamide, N-isopropylacrylamide, morpholylacrylamide, piperidylacrylamide, N-tert-butylacrylamide, N-cyclohexylacrylamide, N-phenylacrylamide, N-naphthylacrylamide, N-hydroxymethylacrylamide, N-hydroxyethylacrylamide, N-allylacrylamide, 4-hydroxyphenylacrylamide, 2-hydroxyphenylacrylamide N,N-dimethylacrylamide, N,N-diisopropylacrylamide, N,N-di-tert-butylacrylamide, N,N-dicyclohexylacrylamide, N,N-diphenylacrylamide, N,N-dihydroxyethylacrylamide, N,N-diallylacrylamide, methacrylamide, N-methylmethacrylamide, N-isopropylmethacrylamide, morpholylmethacrylamide, piperidylmethacrylamide, N-tert-butylmethacrylamide, N-cyclohexylmethacrylamide, N-phenylmethacrylamide, N-naphthylmethacrylamide, N-hydroxymethylmethacrylamide, N-hydroxyethylmethacrylamide, N-allylmethacrylamide, 4-hydroxyphenylmethacrylamide, 2-hydroxyphenylmethacrylamide, N,N-dimethylmethacrylamide, N,N-diisopropylmethacrylamide, N,N-di-tert-butylmethacrylamide, N,N-dicyclohexylmethacrylamide, N,N-phenylmethacrylamide, N,N-dihydroxyethylmethacrylamide, N,N-diallylmethacrylamide, styrene, methylstyrene, dimethylstyrene, trimethylstyrene, isopropylstyrene, butylstyrene, cyclohexylstyrene, chloromethylstyrene, trifluoromethylstyrene, ethoxymethylstyrene, acetoxymethylstyrene, methoxystyrene, 4-methoxy-3-methylstyrene, chlorostyrene, dichlorostyrene trichlorostyrene tetrachlorostyrene, pentachlorostyrene, bromostyrene, dibromostyrene, iodostyrene, fluorostyrene, trifluorostyrene, 2-bromo-4-trifluoromethylstyrene and 4-fluoro-3-trifluoromethyl styrene.

The radical polymerizable compounds may be used individually or a combination of two or more thereof. The graft polymer may or may not contain the radical polymerizable compound described above. In the case where the graft polymer contains the radical polymerizable compound, the content of the structural unit corresponding to the radical polymerizable compound in the dispersing resin is from 0.1 to 50% by weight, particularly preferably from 0.1 to 30% by weight, based on the total weight of the graft polymer.

The grail polymer according to the invention can be synthesized according to a heretofore known method. Examples of solvent used in the synthesis of the dispersing resin include ethylene dichloride, cyclohexanone, methyl ethyl ketone, acetone, methanol, ethanol, propanol, butanol, ethylene glycol monomethyl ether, ethylene glycol monoethyl ether, 2-methoxyethyl acetate, 1-methoxy-2-propanol, 1-methoxy-2-propyl acetate, N,N-dimethyl formamide, N,N-dimethyl acetamide, dimethyl sulfoxide, toluene, ethyl acetate, methyl lactate and ethyl lactate. The solvents may be used individually or as a mixture of two or more thereof.

As specific preferred examples of the graft polymer according to the invention, Compounds 1 to 32 are set forth below, but the invention should not be construed as being limited thereto. In the compounds set forth below, the numerical value attached to each structural unit (the numerical value attached to the repeating unit of the main chain) indicates the content (% by weight: shown as (wt %)) of the structural unit. The numerical value attached to the repeating portion of the side chain indicates the number of repetitions of the repeating portion.

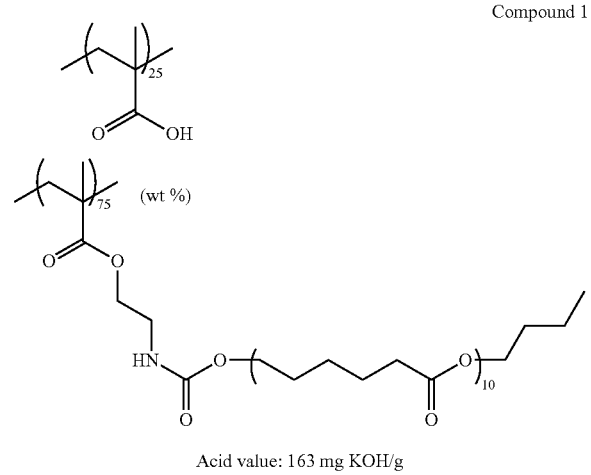

Compound 1

Acid value: 163 mg KOH/g

Compound 2

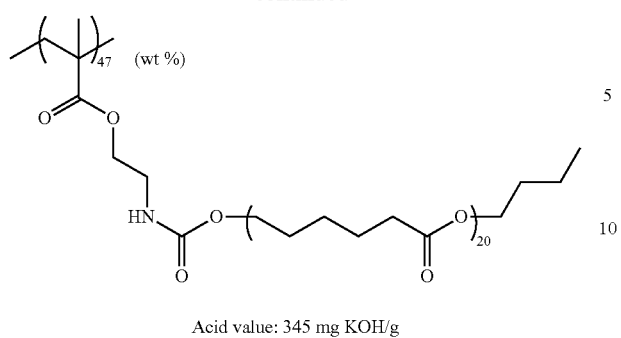
Acid value: 345 mg KOH/g
Compound 3
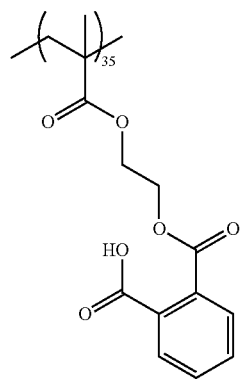
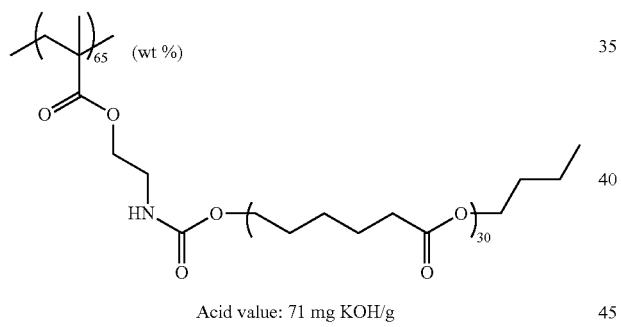
Acid value: 71 mg KOH/g
Compound 4
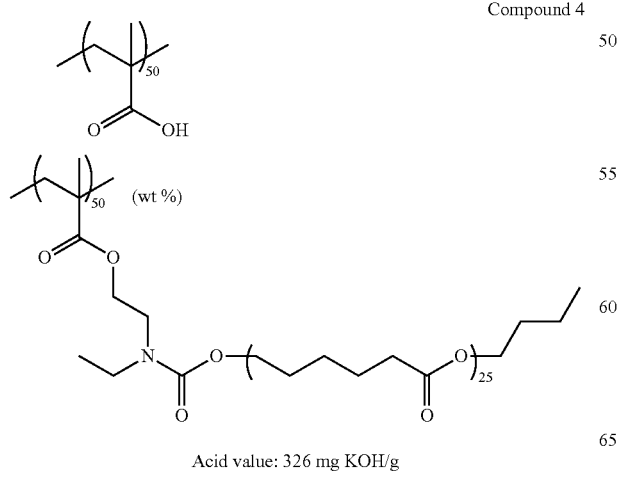
Acid value: 326 mg KOH/g
Compound 5
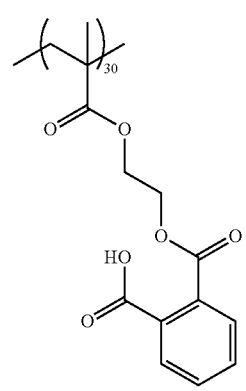
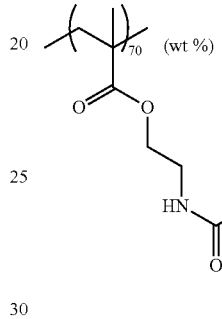
Acid value: 60 mg KOH/g
Compound 6
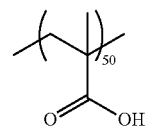
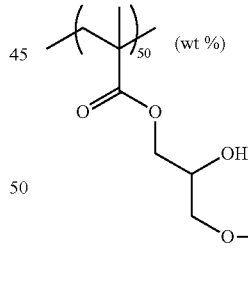
Acid value: 326 mg KOH/g
Compound 7
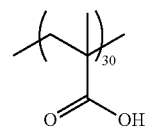

-continued
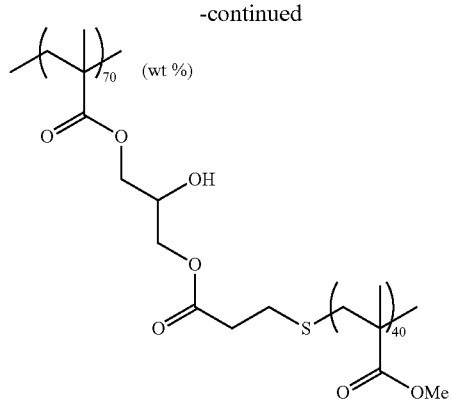
Acid value: 196 mg KOH/g
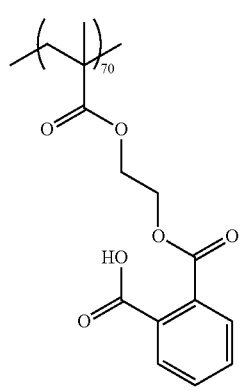
Compound 8
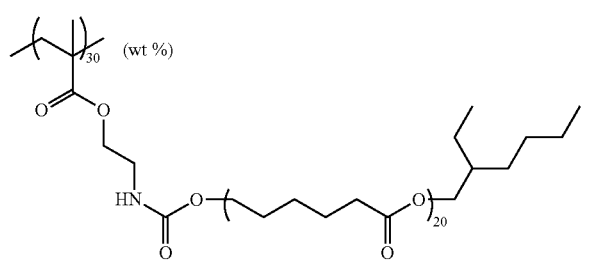
Acid value: 141 mg KOH/g
Compound 9
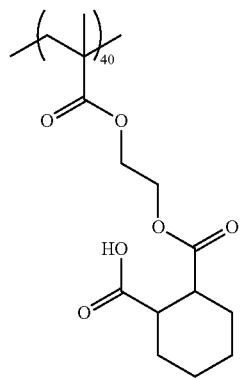
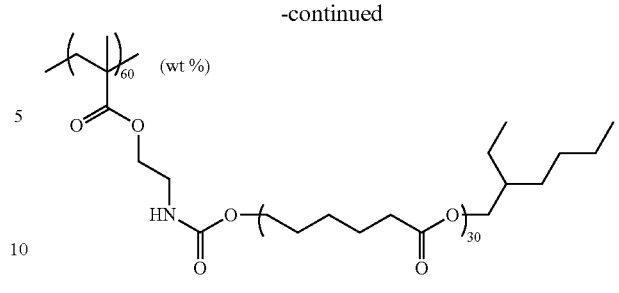
Acid value: 79 mg KOH/g
Compound 10
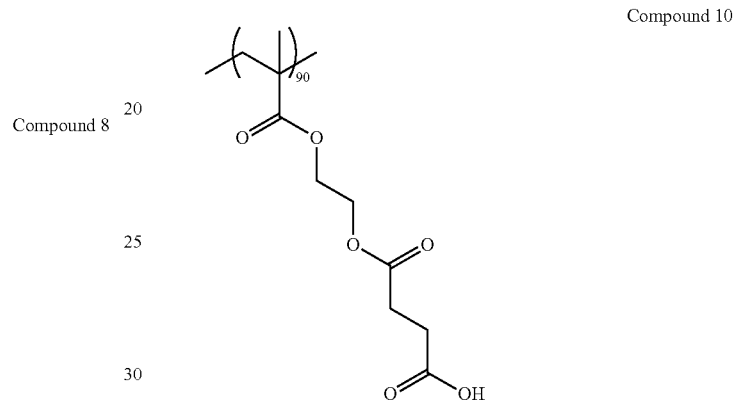
Acid value: 219 mg KOH/g
Compound 11
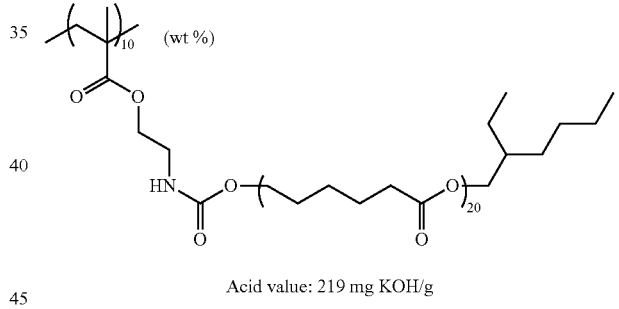
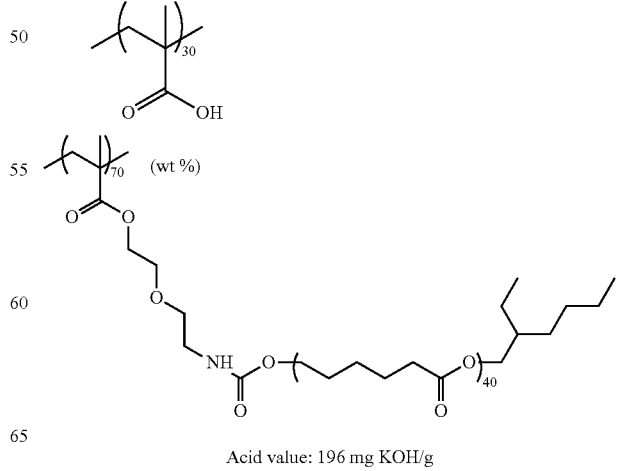
Acid value: 196 mg KOH/g Compound 12
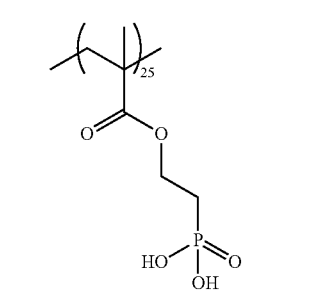
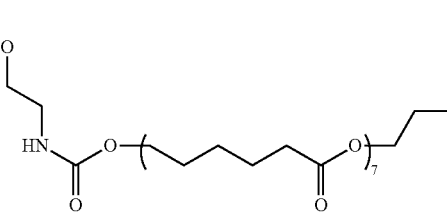
Acid value: 144 mg KOH/g
Compound 13
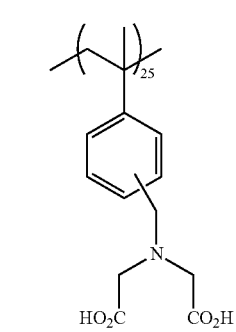
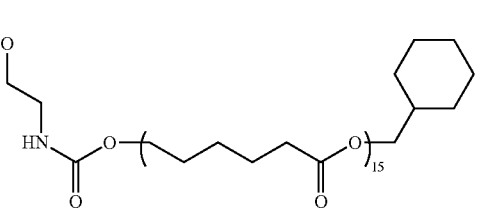
Acid value: 113 mg KOH/g
Compound 14
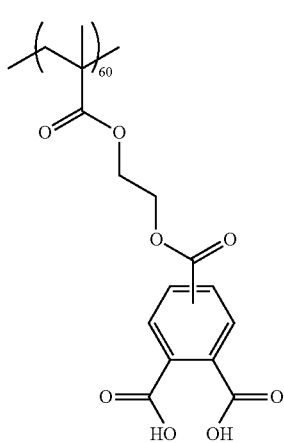
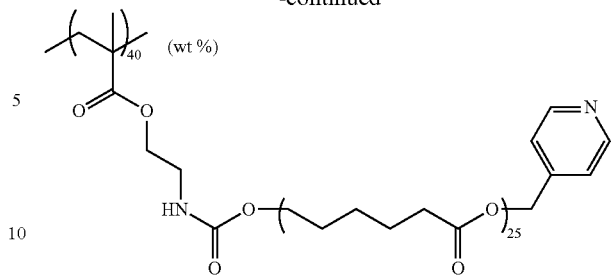
Acid value: 209 mg KOH/g
Compound 15
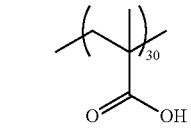
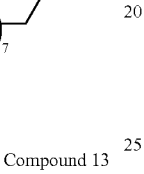
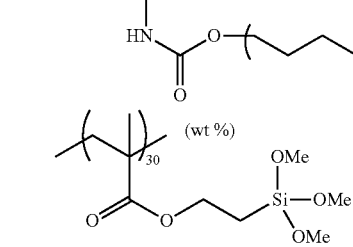
Acid value: 196 mg KOH/g
Compound 16
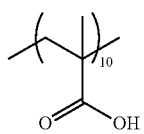
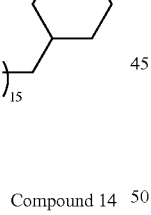
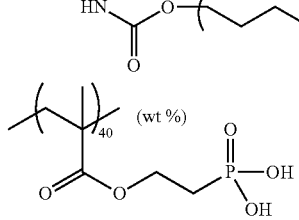
Acid value: 296 mg KOH/g
Compound 17
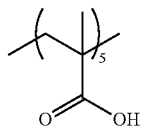

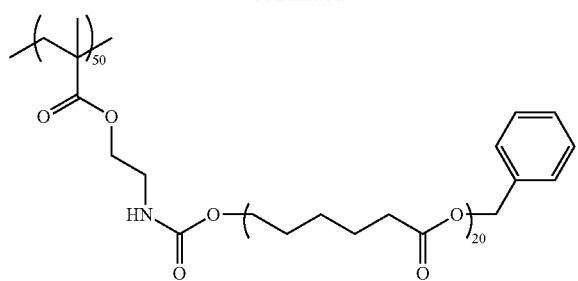
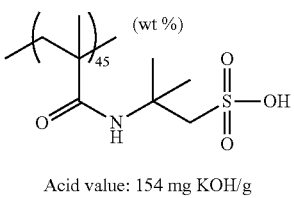
Acid value: 154 mg KOH/g
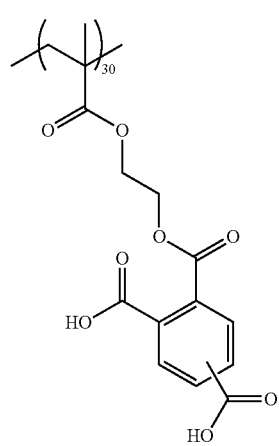
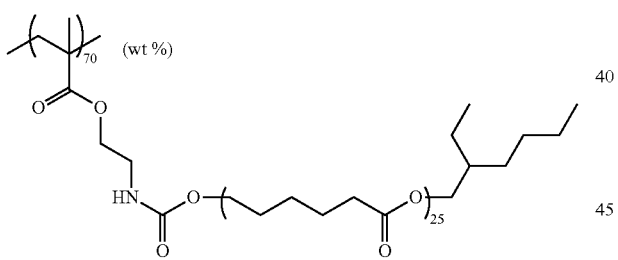
Acid value: 104 mg KOH/g
Compound 19
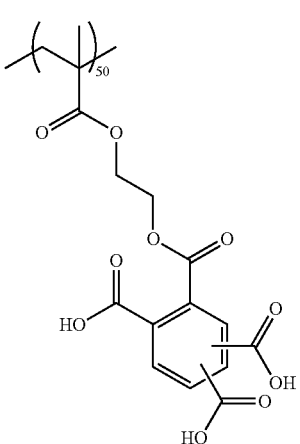
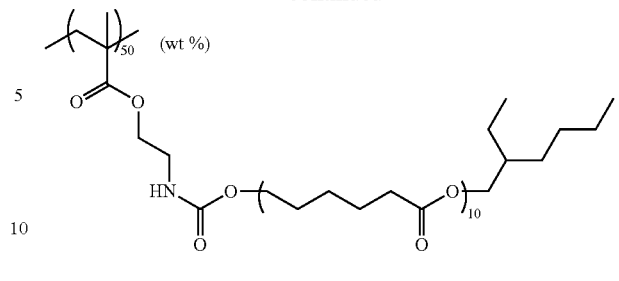
Acid value: 230 mg KOH/g
Compound 20
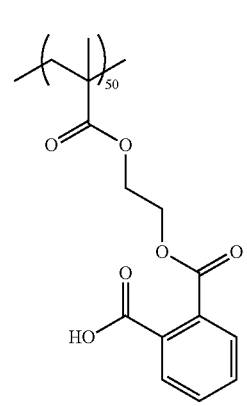
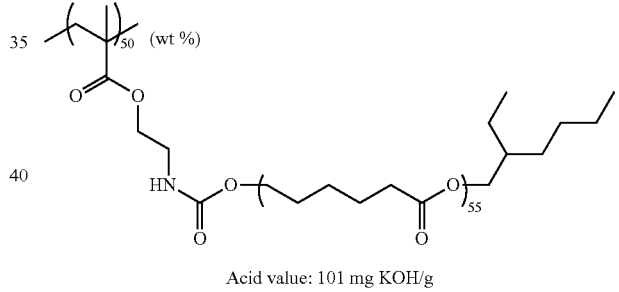
Acid value: 101 mg KOH/g
Compound 21
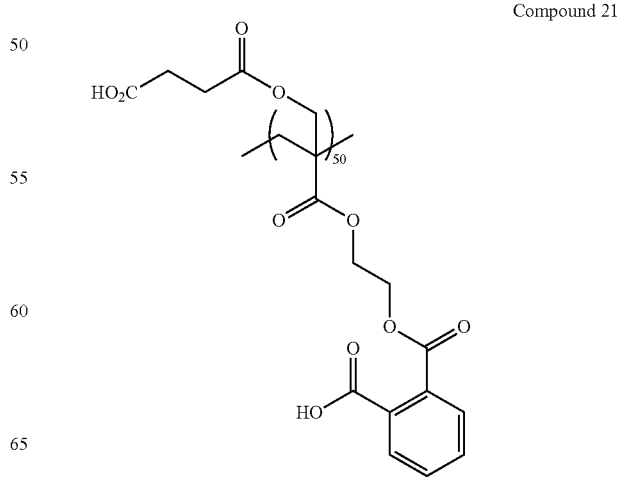

-continued
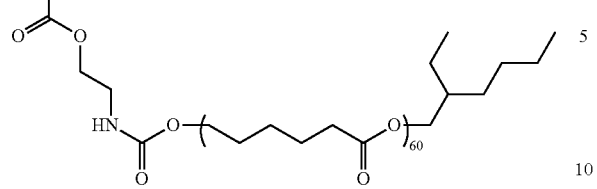
Acid value: 142 mg KOH/g
Compound 22
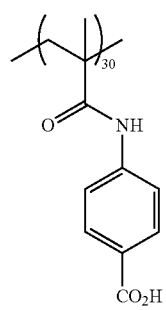
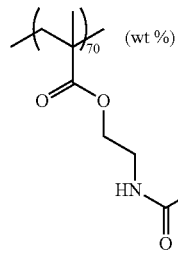
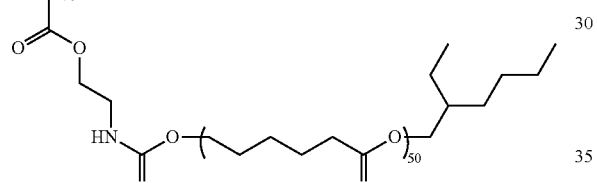
Acid value: 82 mg KOH/g
Compound 23
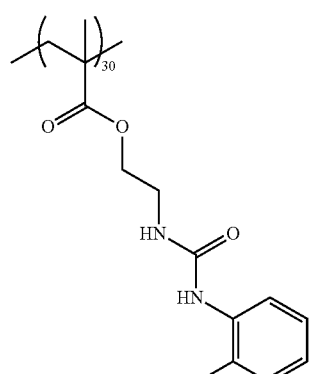
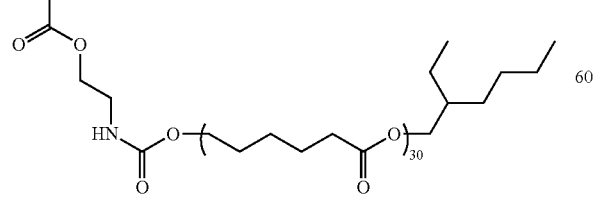
Acid value: 58 mg KOH/g
-continued
Compound 24
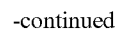
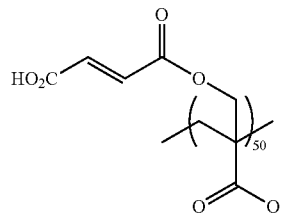
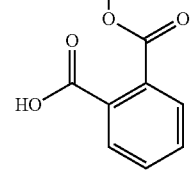
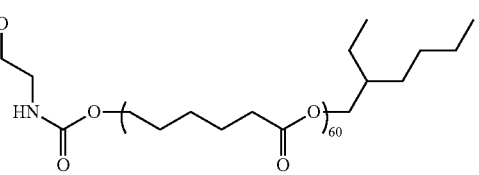
Acid value: 143 mg KOH/g
Compound 25
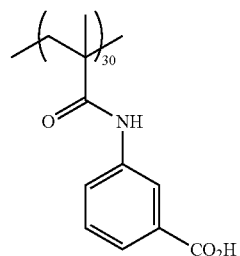
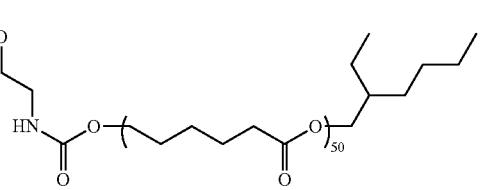
Acid value: 82 mg KOH/g Compound 26
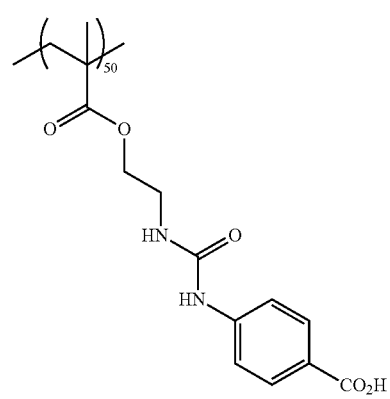
Compound 27
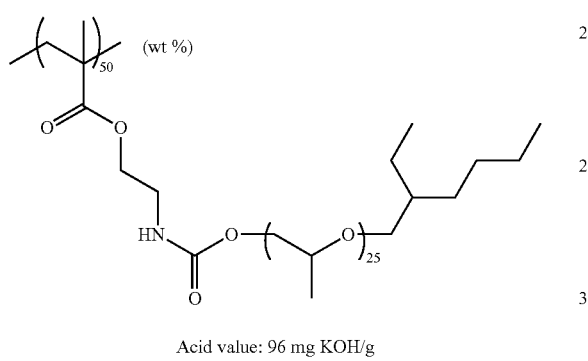
Acid value: 96 mg KOH/g
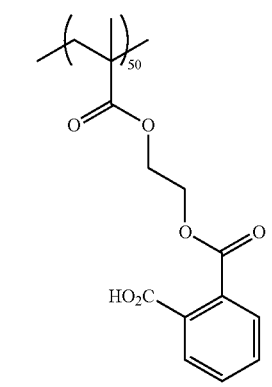
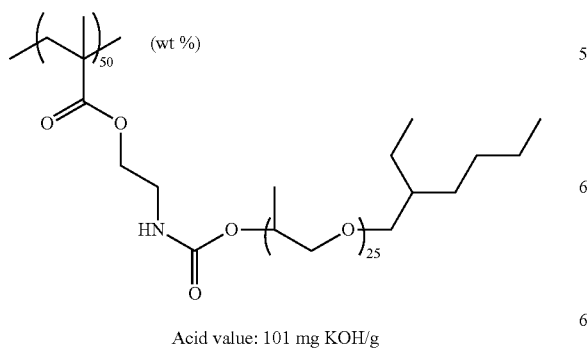
Acid value: 101 mg KOH/g
Compound 28
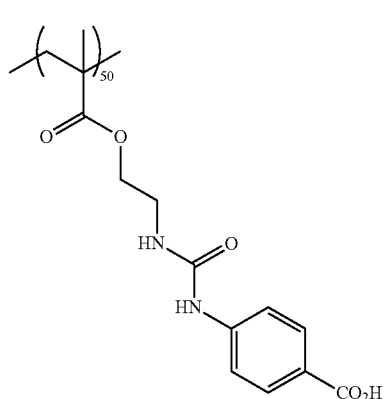
Acid value: 96 mg KOH/g
Compound 29
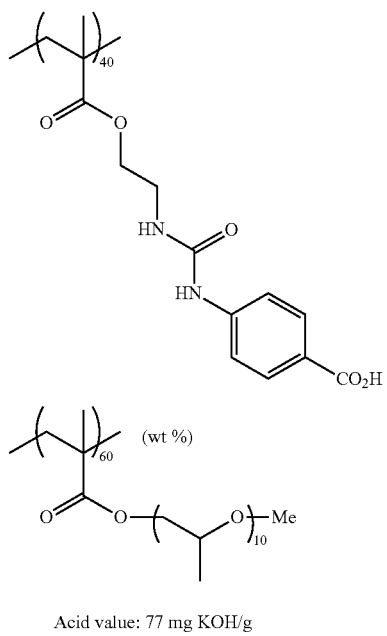
Acid value: 77 mg KOH/g
Compound 30
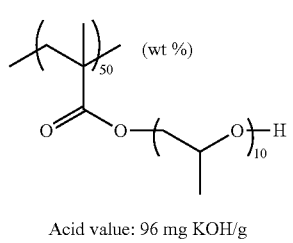

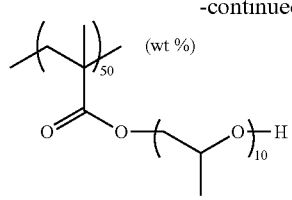

Acid value: 101 mg KOH/g

Compound 31

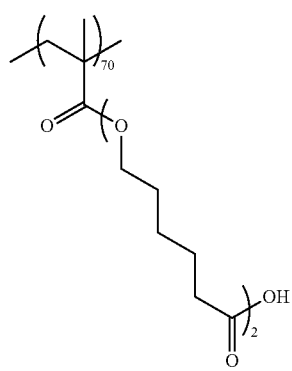

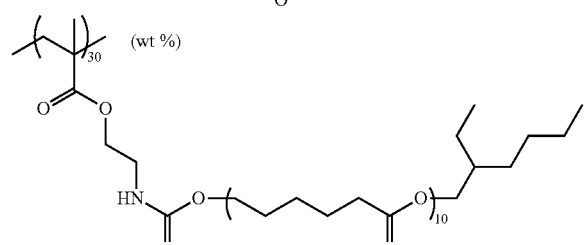

Acid value: 125 mg KOH/g

Compound 32

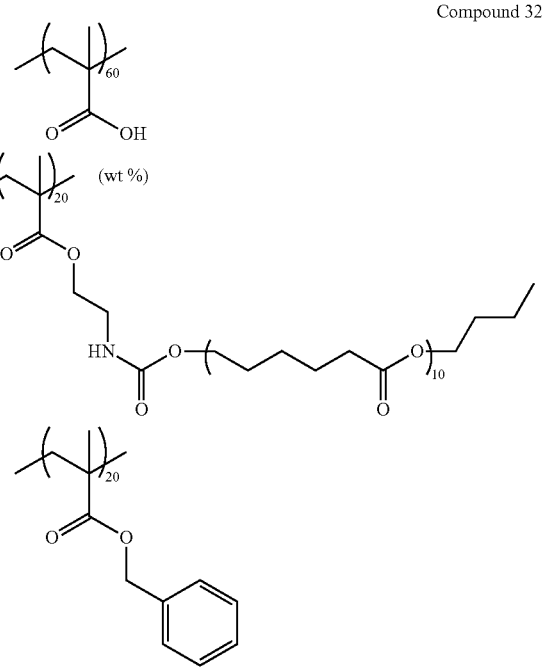

Acid value: 391 mg KOH/g

The weight average molecular weight (measured by a GPC method and calculated in terms of polystyrene) of the graft polymer according to the invention is preferably from 5,000 to 300,000, more preferably from 7,000 to 100,000, and particularly preferably from 10,000 to 50,000.

The dispersing agents may be used individually or in combination of two or more thereof in the colored composition according to the invention.

The content of the dispersing agent is preferably in a range from 10 to 50% by weight, more preferably in a range from 11 to 40% by weight, still more preferably in a range from 12 to 30% by weight, based on the total solid content of the colored composition according to the invention.

[3] Curable Compound

The colored composition according to the invention preferably contains at least one kind of curable compound.

As the curable compound, a compound capable of performing film curing by heating is preferred and, for example, a compound having a heat-curable functional group can be used. The heat-curable functional group is preferably at least one group selected from an epoxy group, a methylol group, an alkoxymethyl group, an acyloxymethyl group, a (meth)acryloyl group, an isocyanate group, a vinyl group and a mercapto group. The heat-curable compound is more preferably that having two or more heat-curable functional groups in the molecule thereof.

More preferably, an epoxy resin, an alkoxymethylated or acyloxymethylated melamine compound or resin, an alkoxymethylated or acyloxymethylated urea compound or resin, a hydroxymethylated or alkoxymethylated phenol compound or resin and an alkoxymethyl etherified phenol compound or resin are exemplified.

The curable compound particularly preferred includes a phenol derivative having a molecular weight of 1,200 or less, containing from three to five benzene rings in the molecule and further having two or more hydroxymethyl groups or alkoxymethyl groups in total, wherein the hydroxymethyl groups or alkoxymethyl groups are connected collectively to any one of the benzene rings, or separately to the benzene rings. By using such a phenol derivative, the effects of the invention are more remarkably achieved. The alkoxymethyl group connected to the benzene ring is preferably an alkoxymethyl group having 6 or less carbon atoms, specifically, for example, a methoxymethyl group, an ethoxymethyl group, an n-propoxymethyl group, an isopropoxymethyl group, an n-butoxymethyl group, an isobutoxymethyl group, a sec-butoxymethyl group or a tert-butoxymethyl group. An alkoxy-substituted alkoxy group, for example, 2-methoxyethoxy group or 2-methoxy-1-propoxy group is also preferred.

The curable compound is preferably a phenol compound containing a benzene ring in the molecule thereof, more preferably a phenol compound containing two or more benzene rings in the molecule thereof, and is preferably a phenol compound containing no nitrogen atom.

The curable compound is preferably a phenol compound having from 2 to 8 heat-curable functional groups in the molecule thereof, and more preferably a phenol compound having from 3 to 6 heat-curable functional groups in the molecule thereof.

Of the phenol derivatives, particularly preferred compounds are set forth below. In the formulae, $L^1$ to $L^8$, which may be the same or different, each represents a heat-curable functional group, preferably a hydroxymethyl group, a methoxymethyl group or an ethoxymethyl group.

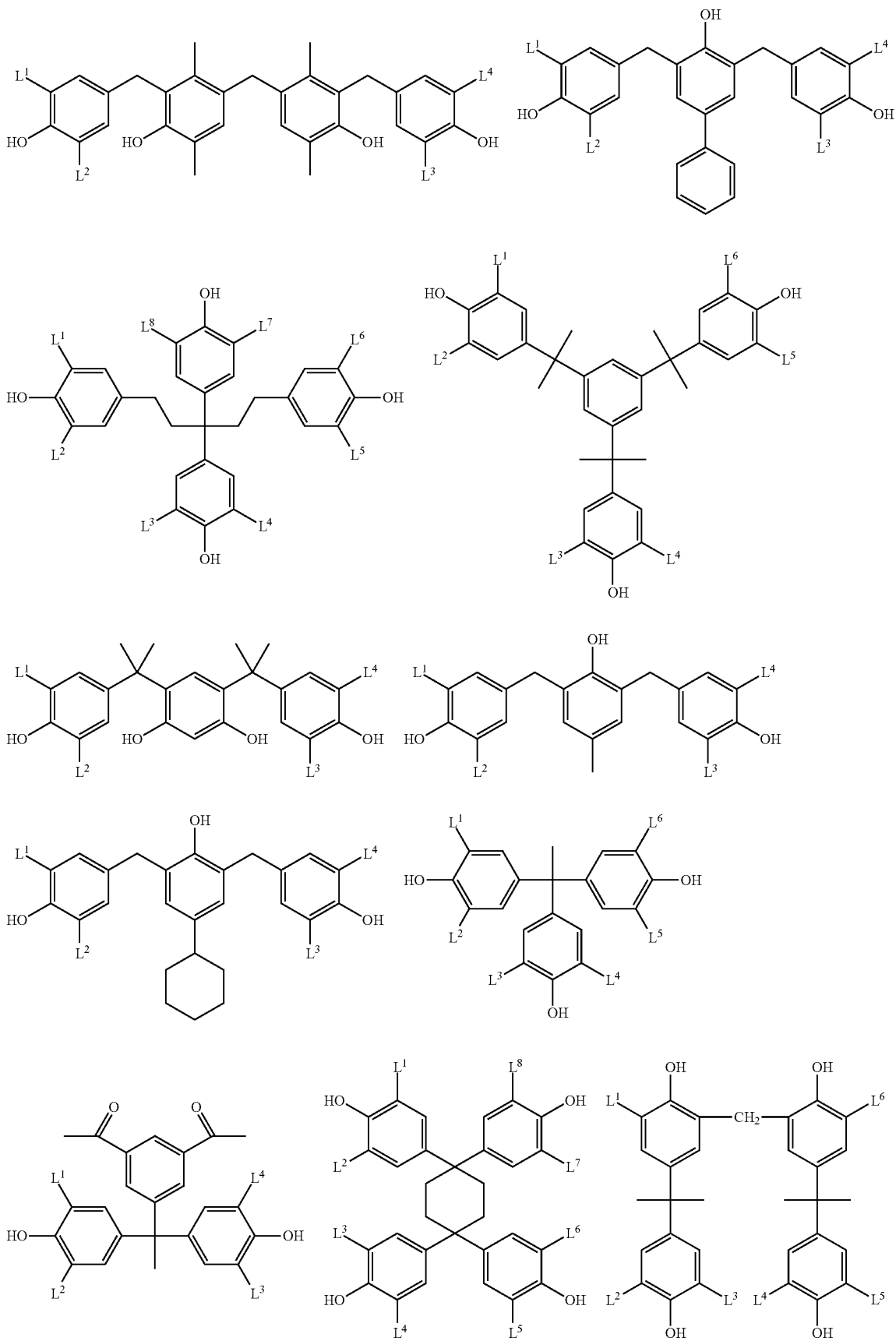

39 40
-continued
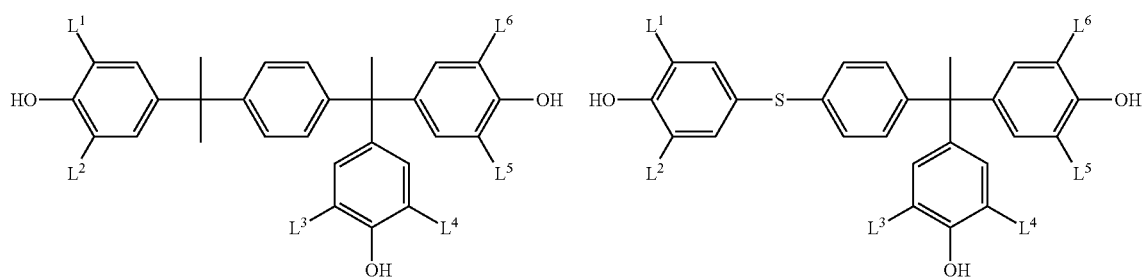
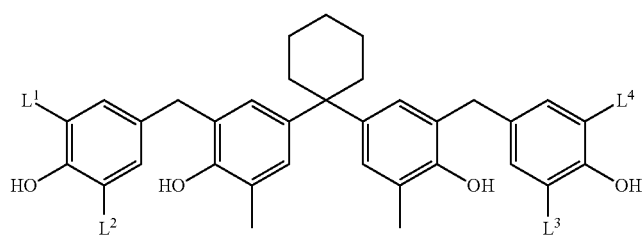
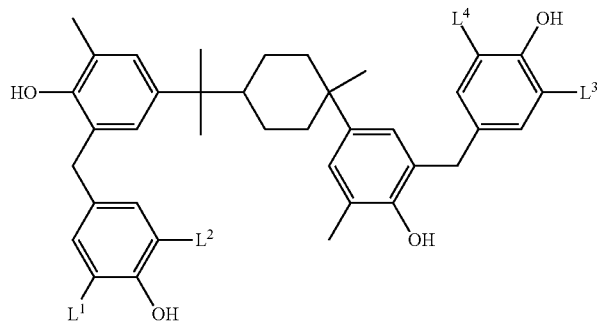
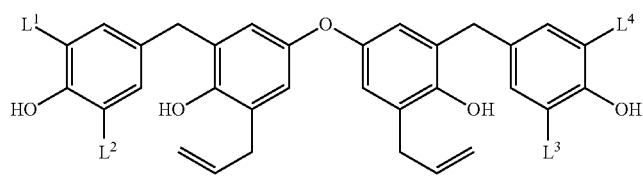
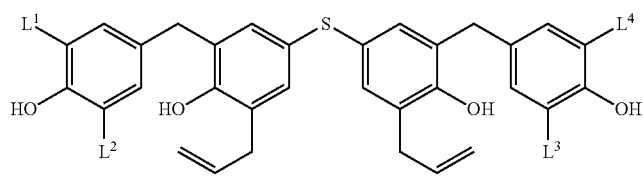
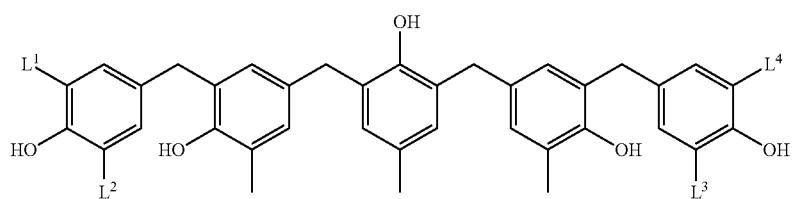

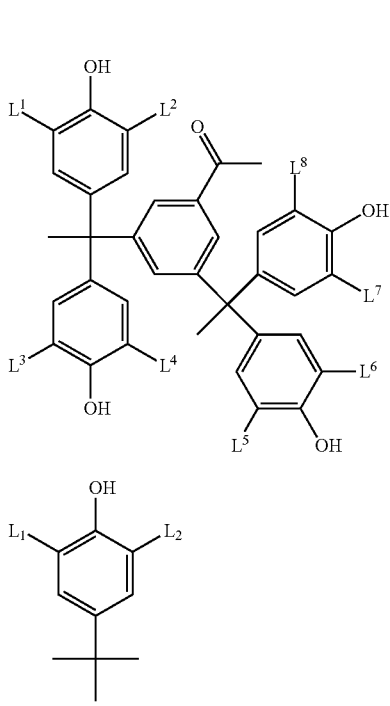

-continued

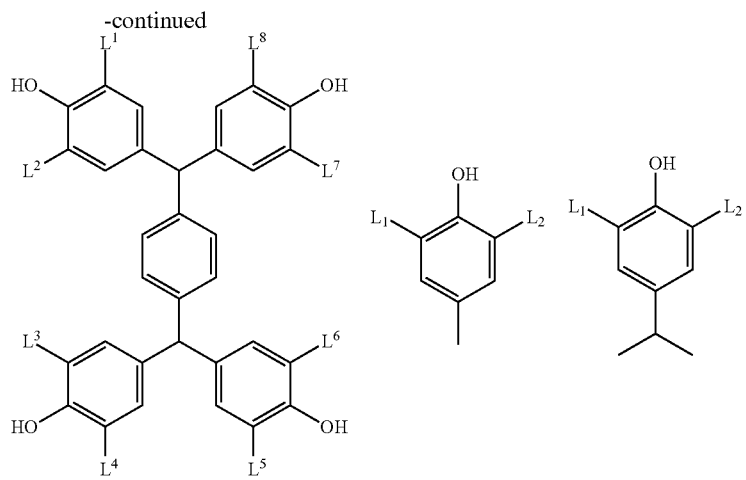

As to the curable compound, a commercially available compound may be used or the compound may be synthesized by a known method. For example, a phenol derivative having a hydroxymethyl group can be obtained by reacting a corresponding phenol compound having no hydroxymethyl group (a compound in the formulae above, wherein each of $L^1$ to $L^8$ is a hydrogen atom) with formaldehyde in the presence of a base catalyst. In this regard, in order to prevent resinification or gelation, the reaction is preferably performed at temperature of 64° C. or below. Specifically, the compound can be synthesized according to the method described, for example, in JP-A-6-282067 and 3P-A-7-64285.

A phenol derivative having an alkoxymethyl group can be obtained by reacting a corresponding phenol derivative having a hydroxymethyl group with an alcohol in the presence of an acid catalyst. In this regard, in order to prevent resin or gelation, the reaction is preferably performed at temperature of 100° C. or below. Specifically, the compound can be synthesized according to the method described, for example, in EP-A-632003. The phenol derivative having a hydroxymethyl group or an alkoxymethyl group thus-synthesized is preferred in view of stability during preservation, and the phenol derivative having an alkoxymethyl group is particularly preferred in view of the stability during preservation. The phenol derivative having two or more hydroxymethyl groups or alkoxymethyl groups, wherein the hydroxymethyl groups or alkoxymethyl groups are connected collectively to any one of the benzene rings, or separately to the benzene rings may be used individually or in combination of two or more thereof.

The curable compound also includes (i) a compound having an N-hydroxymethyl group, an N-alkoxymethyl group or an N-acyloxymethyl group and (ii) an epoxy compound shown below.

(i) The compound having an N-hydroxymethyl group, an N-alkoxymethyl group or an N-acyloxymethyl group is preferably a compound having two or mere (preferably from 2 to 8) partial structures represented by formula (CLNM-1) shown below.

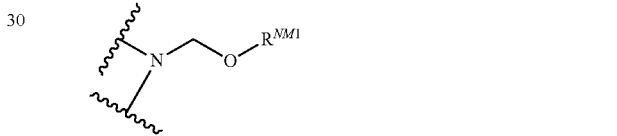

(CLNM-1)

In formula (CLNM-1), $R^{NM1}$ represents a hydrogen atom, an alkyl group, a cycloalkyl group or an oxoalkyl group.

The alkyl group for $R^{NM1}$ in formula (CLNM-1) is preferably a straight-chain or branched alkyl group having from 1 to 6 carbon atoms. The cycloalkyl group for $R^{NM1}$ is preferably a cycloalkyl group having from 5 to 6 carbon atoms. The oxoalkyl group for $R^{NM1}$ is preferably an oxoalkyl group having from 3 to 6 carbon atoms, and examples thereof include a β-oxopropyl group, a β-oxobutyl group, a β-oxopentyl group and a β-oxohexyl group.

More preferred embodiments of the compound having two or more partial structures represented by formula (CLNM-1) include a urea-based crosslinking agent represented by formula (CLNM-2) shown below, an alkylene urea-based crosslinking agent represented by formula (CLNM-3) shown below, a glycoluril-based crosslinking agent represented by formula (CLNM-4) shown below and a melamine-based crosslinking agent represented by formula (CLNM-5) shown below.

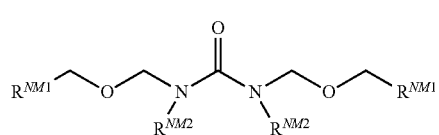

(CLNM-2)

In formula (CLNM-2), $R^{NM1}$ each independently has the same meaning as $R^{NM1}$ in formula (CLNM-1).

$R^{NM2}$ each independently represents a hydrogen atom, an alkyl group (preferably having from 1 to 6 carbon atoms) or a cycloalkyl group (preferably having from 5 to 6 carbon atoms).

Specific examples of the urea-based crosslinking agent represented by formula (CLNM-2) include N,N-di(methoxymethyl) urea, N,N-di(ethoxymethyl) urea, N,N-di(propoxymethyl) urea, N,N-di(isopropoxymethyl) urea, N,N-di(butoxymethyl) urea, N,N-di(tert-butoxymethyl) urea, N,N-di(cyclohexyloxymethyl) urea, N,N-di(cyclopentyloxymethyl) urea, N,N-di(adamantyloxymethyl) urea and N,N-di(norbornyloxymethyl) urea.

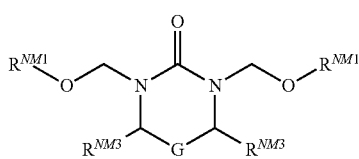

(CLNM-3)

In formula (CLNM-3), $R^{NM1}$ each independently has the same meaning as $R^{NM1}$ in formula (CLNM-1).

$R^{NM3}$ each independently represents a hydrogen atom, a hydroxy group, a straight-chain or branched alkyl group (preferably having from 1 to 6 carbon atoms), a cycloalkyl group (preferably having from 5 to 6 carbon atoms), an oxoalkyl group (preferably having from 1 to 6 carbon atoms), an alkoxy group (preferably having from 1 to 6 carbon atoms) or an oxoalkoxy group (preferably having from 1 to 6 carbon atoms).

G represents a single bond, an oxygen atom, a sulfur atom, an alkylene group (preferably having from 1 to 3 carbon atoms) or a carbonyl group. Specific examples of the alkylene group include a methylene group, an ethylene group, a propylene group, a 1-methylethylene group, a hydroxymethylene group and a cyanomethylene group.

Specific examples of the alkylene urea-based crosslinking agent represented by formula (CLNM-3) include N,N-di(methoxymethyl)-4,5-di(methoxymethyl) ethylene urea, N,N-di(ethoxymethyl) 4,5-di(ethoxymethyl)ethylene urea, N,N-di(propoxymethyl)-4,5-di(propoxymethyl)ethylene urea, N,N-di(isopropoxymethyl)-4,5-di(isopropoxymethyl) ethylene urea, N,N-di(butoxymethyl)-4,5-di(butoxymethyl) ethylene urea, N,N-di(tert-butoxymethyl)-4,5-di(tert-butoxymethyl)ethylene urea, N,N-di(cyclohexyloxylmethyl)-4,5-di(cyclohexyloxymethyl)ethylene urea, N,N-di(cyclopentyloxymethyl)-4,5-di(cyclopentyloxymethyl) ethylene urea, N,N-di(adamantyloxymethyl)-4,5-di(adamantyloxymethyl)ethylene urea and N,N-di(norbornyloxymethyl)-4,5-di(norbornyloxymethyl)ethylene urea.

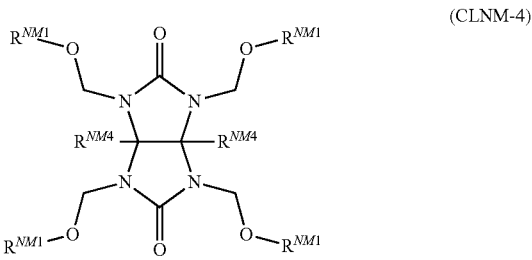

(CLNM-4)

In formula (CLNM-4), $R^{NM1}$ each independently has the same meaning as $R^{NM1}$ in formula (CLNM-1).

$R^{NM4}$ each independently represents a hydrogen atom, a hydroxy group, an alkyl group, a cycloalkyl group or an alkoxy group.

Specific examples of the alkyl group (preferably having from 1 to 6 carbon atoms), cycloalkyl group (preferably having from 5 to 6 carbon atoms) and alkoxy group (preferably having from 1 to 6 carbon atoms) for $R^{NM4}$ include a methyl group, an ethyl group, a butyl group, a cyclopentyl group, a cyclohexyl group, a methoxy group, an ethoxy group and a butoxy group.

Specific examples of the glycoluril-based crosslinking agent represented by formula (CLNM-4) include N,N,N,N-tetra(methoxymethyl)glycoluril, N,N,N,N-tetra(ethoxymethyl)glycoluril, N,N,N,N-tetra(propoxymethyl)glycoluril, N,N,N,N-tetra(isopropoxymethyl)glycoluril, N,N,N,N-tetra(butoxymethyl)glycoluril, N,N,N,N-tetra(tert-butoxymethyl)glycoluril, N,N,N,N-tetra(cyclohexyloxymethyl)glycoluril, N,N,N,N-tetra(cyclopentyloxymethyl)glycoluril, N,N,N,N-tetra(adamantyloxymethyl)glycoluril and N,N,N,N-tetra(norbornyloxymethyl)glycoluril.

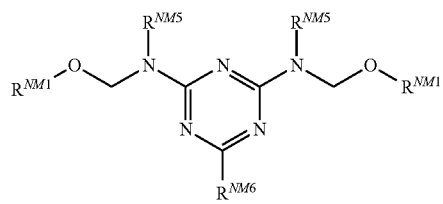

(CLNM-5)

In formula (CLNM-5), $R^{NM1}$ each independently has the same meaning as $R^{NM1}$ in formula (CLNM-1).

$R^{NM5}$ each independently represents a hydrogen atom, an alkyl group, a cycloalkyl group, an aryl group or an atomic group represented by formula (CLNM-5') shown below.

$R^{NM6}$ represents a hydrogen atom, an alkyl group, a cycloalkyl group, an aryl group or an atomic group represented by formula (CLNM-5") shown below.

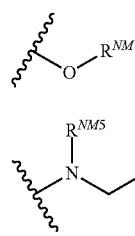

(CLNM-5')

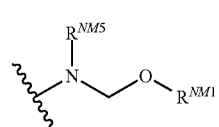

(CLNM-5")

In formula (CLNM-5'), $R^{NM1}$ has the same meaning as $R^{NM1}$ in formula (CLNM-1).

In formula (CLNM-5"), $R^{NM1}$ has the same meaning as $R^{NM1}$ in formula (CLNM-1), and $R^{NM5}$ has the same meaning as $R^{NM5}$ in formula (CLNM-5).

More specific examples of the alkyl group (preferably having from 1 to 6 carbon atoms), cycloalkyl group (preferably having from 5 to 6 carbon atoms) and aryl group (preferably having from 6 to 10 carbon atoms) of $R^{NM5}$ and $R^{NM6}$ include a methyl group, an ethyl group, a propyl group, an isopropyl group, a butyl group, an isobutyl group, a tert-butyl group, a pentyl group, a cyclopentyl group, a hexyl group, a cyclohexyl group, a phenyl group and a naphthyl group.

Examples of the melamine-based crosslinking agent represented by formula (CLNM-5) include N,N,N,N,N,N-hexa(methoxymethyl)melamine, N,N,N,N,N,N-hexa(ethoxymethyl)melamine, N,N,N,N,N,N-hexa(propoxymethyl)melamine, N,N,N,N,N,N-hexa(isopropoxymethyl)melamine, N,N,N,N,N,N-hexa(butoxymethyl)melamine, N,N,N,N,N,N-hexa(tert-butoxymethyl)melamine, N,N,N,N,N,N-hexa(cyclohexyloxymethyl)melamine, N,N,N,N,N,N-hexa(cyclopentyloxymethyl)melamine, N,N,N,N,N,N-hexa(adamantyloxymethyl)melamine, N,N,N,N,N,N-hexa(norbornyloxymethyl)melamine, N,N,N,N,N,N-hexa(methoxymethyl)acetoguanamine, N,N,N,N,N,N-hexa(ethoxymethyl)acetoguanamine, N,N,N,N,N,N-hexa(propoxymethyl)acetoguanamine, N,N,N,N,N,N-hexa(isopropoxymethyl)acetoguanamine, N,N,N,N,N,N-hexa(butoxymethyl)acetoguanamine, N,N,N,N,N,N-hexa(tert-butoxymethyl)acetoguanamine, N,N,N,N,N,N-hexa(methoxymethyl)benzoguanamine, N,N,N,N,N,N-hexa(ethoxymethyl)benzoguanamine, N,N,N,N,N,N-hexa(propoxymethyl)benzoguanamine, N,N,N,N,N,N-hexa(isopropoxymethyl)benzoguanamine, N,N,N,N,N,N-hexa(butoxymethyl)benzoguanamine and N,N,N,N,N,N-hexa(tert-butoxymethyl)benzoguanamine.

The groups represented by $R^{NM1}$ to $R^{NM6}$ in formulae (CLNM-1) to (CLNM-5) may further have a substituent. Examples of the substituent which $R^{NM1}$ to $R^{NM6}$ may have include a hydrogen atom, a hydroxy group, a nitro group, a cyano group, a carboxyl group, a cycloalkyl group (preferably having from 3 to 20 carbon atoms), an aryl group (preferably having from 6 to 14 carbon atoms), an alkoxy group (preferably having from 1 to 20 carbon atoms), a cycloalkoxy group (preferably having from 3 to 20 carbon atoms), an acyl group (preferably having from 2 to 20 carbon atoms) and an acyloxy group (preferably having from 2 to 20 carbon atoms).

Specific examples of the compound having two or more partial structures represented by formula (CLNM-1) are set forth below, but the invention should not be construed as being limited thereto.

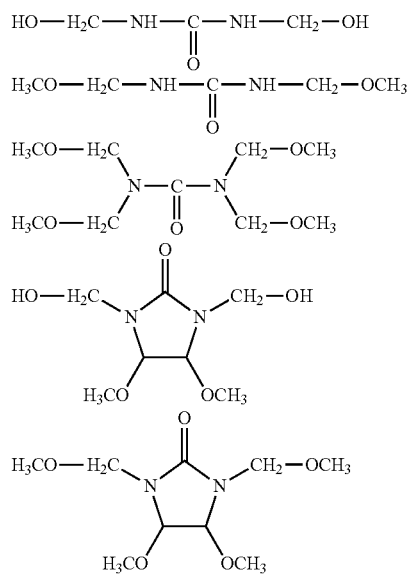

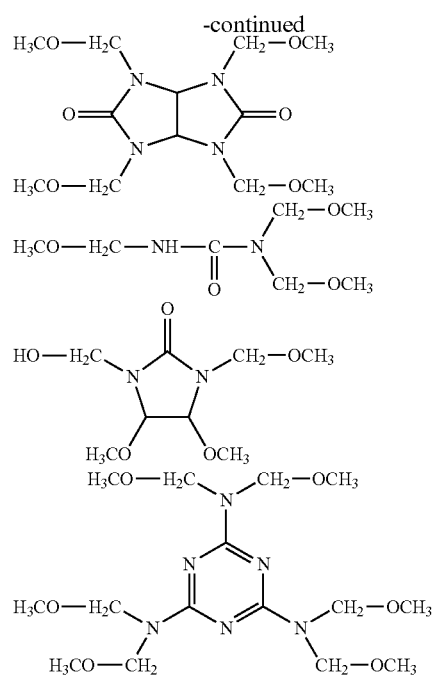

(ii) The epoxy compound includes a compound represented by formula (EP1) shown below.

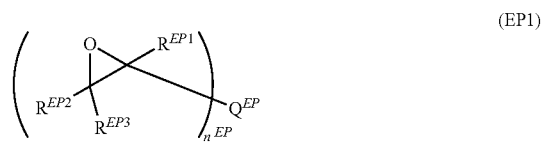

(EP1)

In formula (EP1), $R^{EP1}$ to $R^{EP3}$ each independently represents a hydrogen atom, a halogen atom, an alkyl group or a cycloalkyl group. The alkyl group and cycloalkyl group may have a substituent. Also, $R^{EP1}$ and $R^{EP2}$ or $R^{EP2}$ and $R^{EP3}$ may be combined with each other to form a ring structure.

Examples of the substituent which the alkyl group and cycloalkyl group may have include a hydroxy group, a cyano group, an alkoxy group, an alkylcarbonyl group, an alkoxycarbonyl group, an alkylcarbonyloxy group, an alkylthio group, an alkylsulfone group, an alkylsulfonyl group, an alkylamino group and an alkylamido group.

$Q^{EP}$ represents a single bond or an $n^{EP}$-valent organic group. $R^{EP1}$ to $R^{EP3}$ may be combined not only with each other but also with $Q^{EP}$ to form a ring structure.

$n^{EP}$ represents an integer of 2 or more and is preferably an integer from 2 to 10, and more preferably an integer from 2 to 6. However, when $Q^{EP}$ is a single bond, $n^{EP}$ is 2.

In the case where $Q^{EP}$ is an $n^{EP}$-valent organic group, the organic group is preferably, for example, a straight-chain or cyclic $n^{EP}$-valent saturated hydrocarbon group (preferably having from 2 to 20 carbon atoms), an $n^{EP}$-valent aromatic ring group (preferably having from 6 to 30 carbon atoms), or an $n^{EP}$-valent organic group having a structure wherein a divalent connecting group, for example, an ether, an ester, an amido, a sulfonamido or an alkylene (preferably an alkylene having from 1 to 4 carbon atoms, more preferably methylene), a trivalent connecting group, for example, —N(—)$_2$, or a combination thereof is connected to a straight-chain or cyclic saturated hydrocarbon or aromatic hydrocarbon.

Specific examples of the compound having an epoxy structure are set forth below, but the invention should not be construed as being limited thereto.

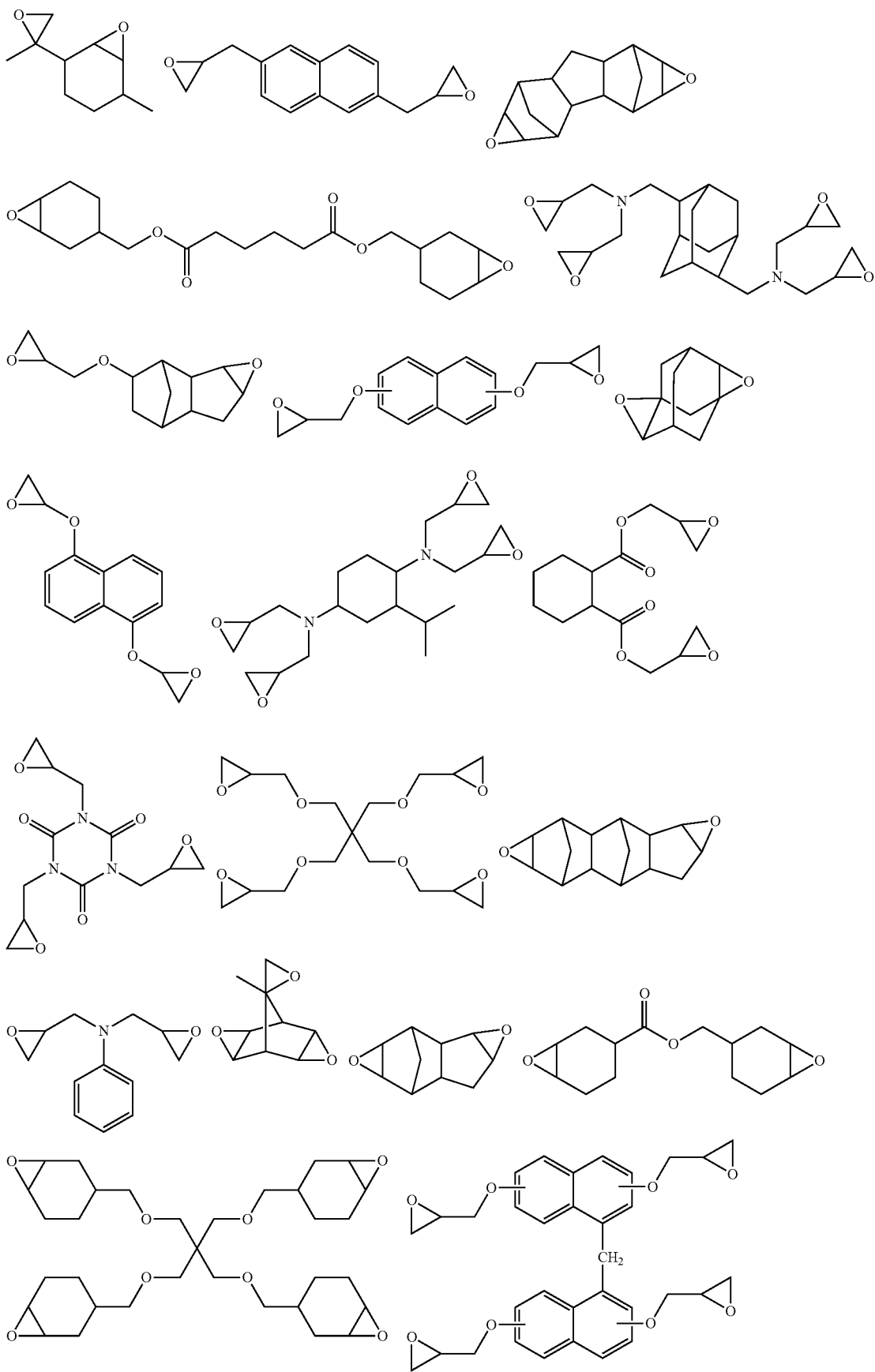

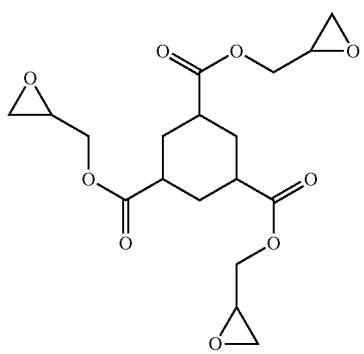
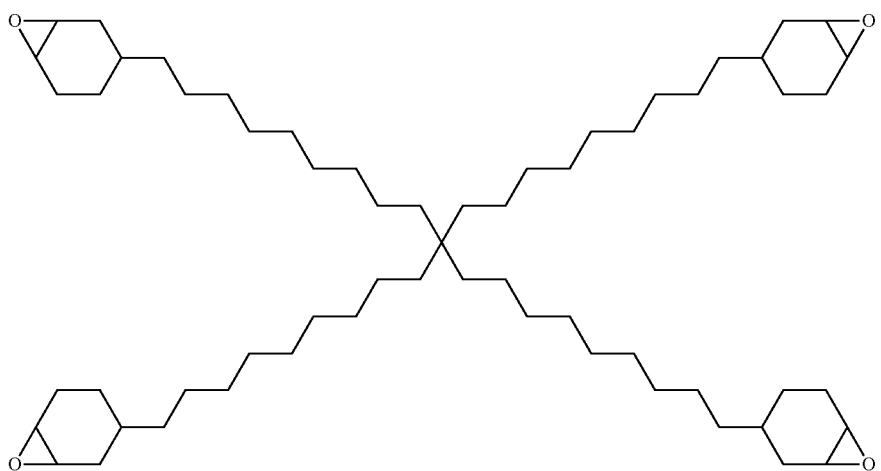
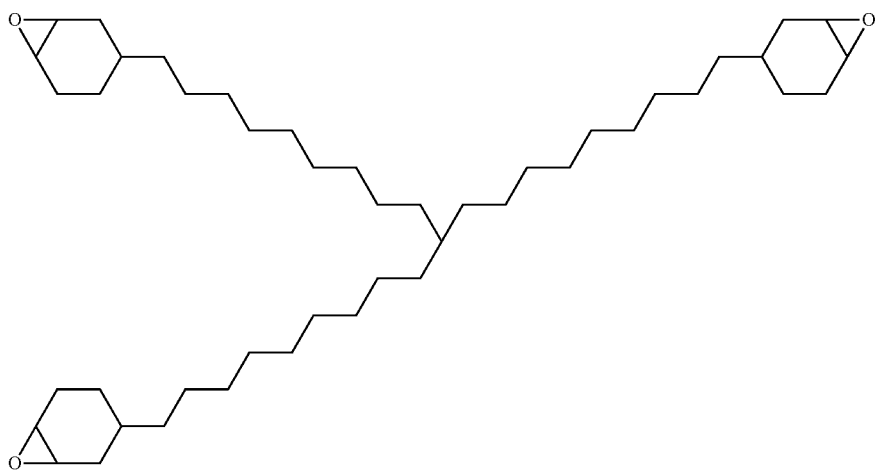
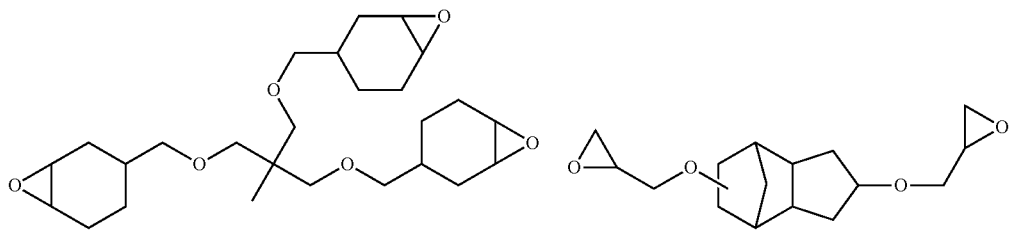

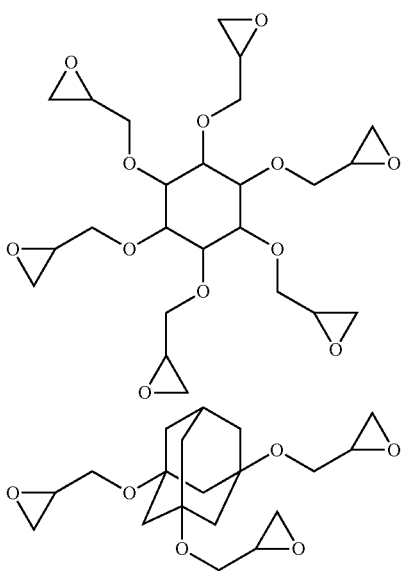

In the invention, the curable compounds may be used individually or in combination of two or more thereof.

The total content of the curable compound in the colored composition may be varied depending on the material and is preferably from 0.1 to 30% by weight, more preferably from 0.2 to 20% by weight, particularly preferably from 1 to 10% by weight, based on the total solid content (weight) of the colored composition.

[4] Pigment Derivative

The colored composition according to the invention, which contains a pigment as the coloring agent, preferably further contains a pigment derivative in order to increase adsorption property of the dispersing resin to the pigment.

The pigment derivative is a compound having a structure in which a part of an organic pigment is substituted with an acidic group, a basic group or a phthalimidomethyl group. From the standpoint of dispersibility and dispersion stability, it is preferable that as the pigment derivative, a pigment derivative having an acidic group or a basic group is contained.

Examples of the organic pigment for constituting the pigment derivative include a diketopyrrolopyrrole pigment, an azo pigment, a phthalocyanine pigment, an anthraquinone pigment, a quinacridone pigment, a dioxazine pigment, a perynone pigment, a perylene pigment, a thio indigo pigment, an isoindoline pigment, an isoindolinone pigment, a quinophthalone pigment, a threne pigment and a metal complex pigment.

Further, the acidic group included in the pigment derivative is preferably a sulfonic acid, a carboxylic acid or a quaternary ammonium salt thereof, is more preferably a carboxylic acid group or a sulfonic acid group, and is particularly preferably a sulfonic acid group. The basic group included in the pigment derivative is preferably an amino group, and particularly preferably a tertiary amino group.

As the pigment derivative, in particular, pigment derivatives of quinoline, benzimidazolone and isoindoline are preferred, and pigment derivatives of quinoline and imidazolone are more preferred. In particular, a pigment derivative having a structure represented by formula (P) shown below is preferred.

In formula (P), A represents a partial structure selected from formulae (PA-1) to (PA-3) shown below, B represents a single bond or a (t+1)-valent connecting group, C represents a single bond, —NH—, —CONH—, —CO$_2$—, —SO$_2$NH—, —O—, —S— or —SO$_2$—, D represents a single bond, an alkylene group, a cycloalkylene group or an arylene group, E represents —SO$_3$H, —SO$_3$M (M represents an alkali metal atom), —CO$_2$H or —N(Rpa)(Rpb), Rpa and Rpb each independently represents an alkyl group, an eyeball group or an aryl group or Rpa and Rpb may be combined with each other to form a ring, and t represents an integer from 1 to 5.

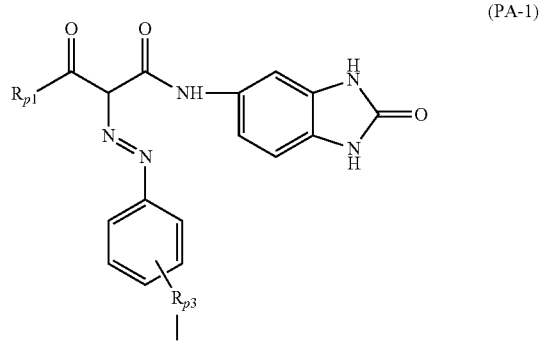

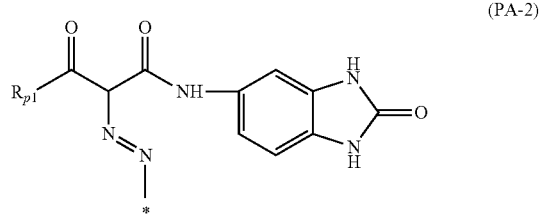

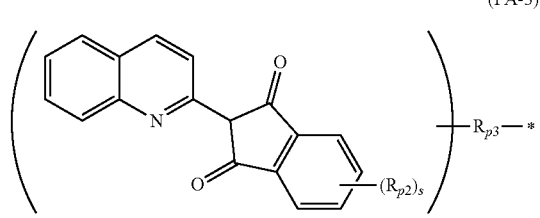

In formulae (PA-1) and (PA-2), Rp1 represents an alkyl group having from 1 to 5 carbon atoms or an aryl group. In formula (PA-3), Rp2 represents a halogen atom, an alkyl group or a hydroxy group, and s represents an integer from 1 to 4, and when s is 2 or more, plural Rp2s may be the same or different from each other. In formulae (PA-1) and (PA-3). Rp3 represents a single bond, —NH—, —CONH—, —CO$_2$—, —SO$_2$NH—, —O—, —S— or —SO$_2$—, and * represents a connecting portion with B.

In formula (P), Rp1 is particularly preferably a methyl group or a phenyl group, and most preferably a methyl group. In formula (PA-3), Rp2 is preferably a halogen atom, and most preferably a chlorine atom.

In formula (P), examples of the (t+1)-valent connecting group represented by B include an alkylene group, a cycloalkylene group, an arylene group and a hetero arylene group. Among them, connecting groups represented by structural formulae (PA-4) to (PA-9) shown below are particularly preferred.

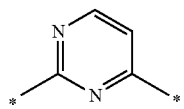
(PA-4)

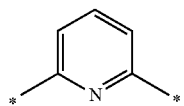
(PA-5)

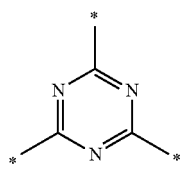
(PA-6)

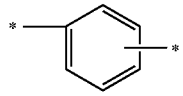
(PA-7)

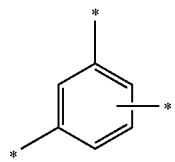
(PA-8)

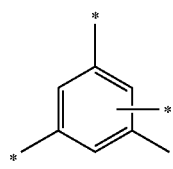
(PA-9)

Of the pigment derivative represented by formula (P), those having a connecting group represented by the structural formula (PA-5) or (PA-8) among the structural formulae (PA-4) to (PA-9) as B are particularly preferred in view of excellent dispersibility.

In formula (P), examples of the alkylene group, cycloalkylene group and arylene group represented by D include methylene, ethylene, propylene, butylene, pentylene, hexylene, decylene, cyclopropylene, cyclobutylene, cyclopentylene, cyclohexylene, cyclooctylene, cyclodecylene, phenylene and naphthylene. Among them, an alkylene group is particularly preferred as D, and an alkylene group having from 1 to 5 carbon atoms is most preferred.

In formula (P), when E represents —N(Rpa)(Rpb), examples of the alkyl group, cycloalkyl group and aryl group in Rpa and Rpb include methyl, ethyl, propyl, isopropyl, butyl, sec-butyl, tert-butyl, pentyl, isopentyl, neopentyl, hexyl, octyl, decyl, cyclopropyl, cyclobutyl, cyclopentyl, cyclohexyl, cyclooctyl, cyclodecyl, phenyl and naphthyl. As any of Rpa and Rpb, an alkyl group is particularly preferred, and an alkyl group having from 1 to 5 carbon atoms is most preferred. The t is preferably 1 or 2.

Specific examples of the pigment derivative are set forth below, but the invention should not be construed as being limited thereto. In the following specific examples, M represents an alkali metal (Na, K, or the like).

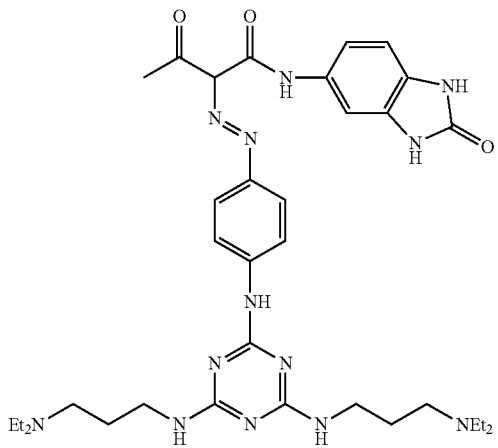
(A-1)

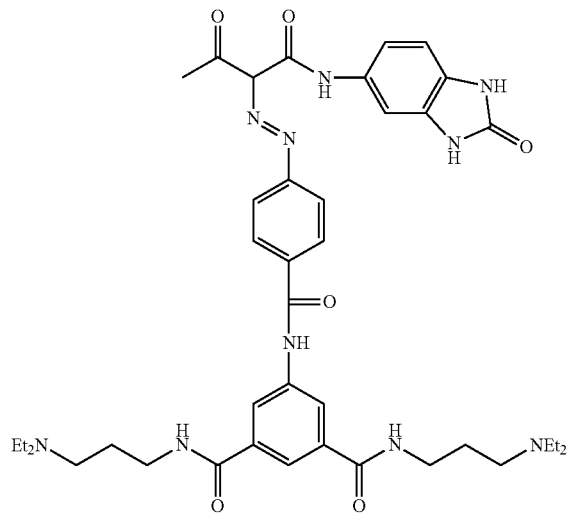
(A-2)

-continued
(A-3)
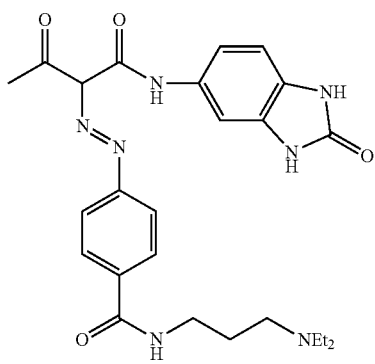
(A-4)
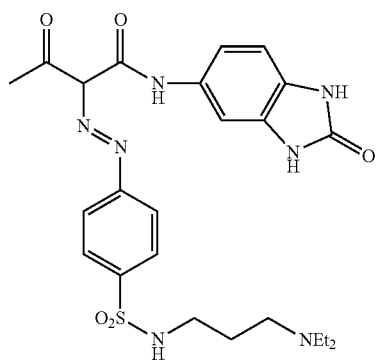
(A-5)
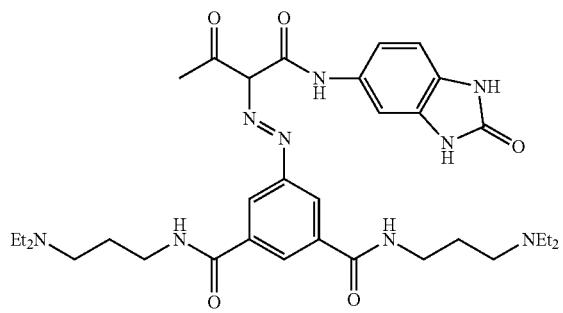
(A-6)
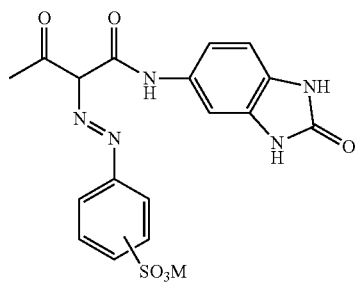
(A-7)
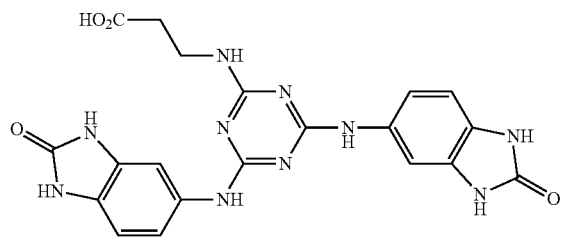
(A-8)
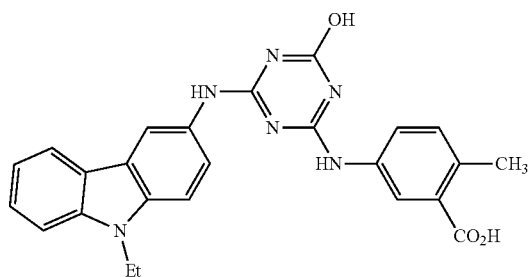
(A-9)
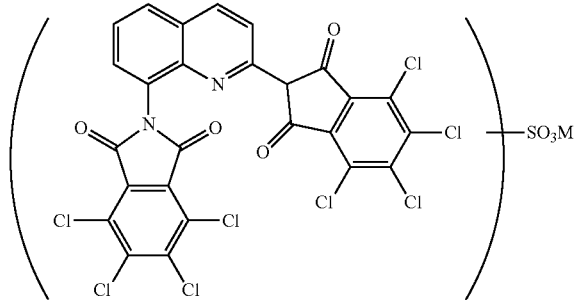
(A-10)
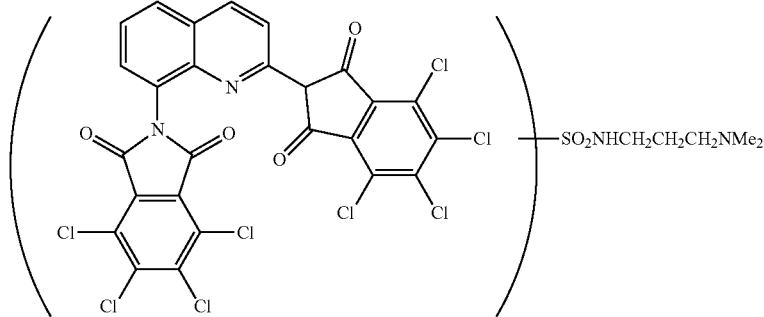

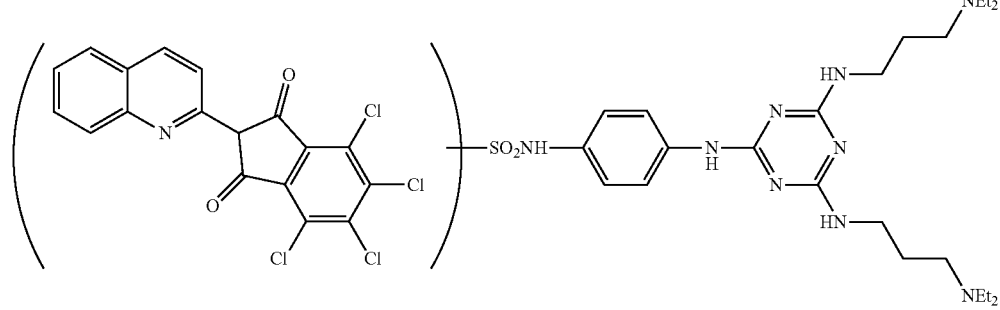
(A-11)
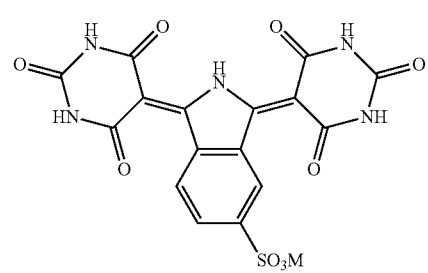
(A-12)
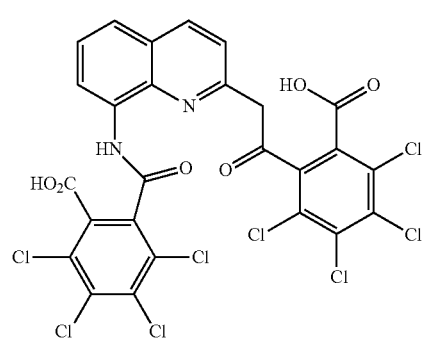
(A-13)
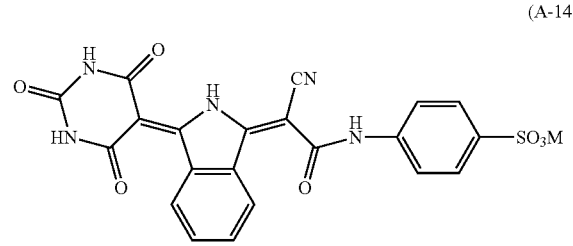
(A-14)
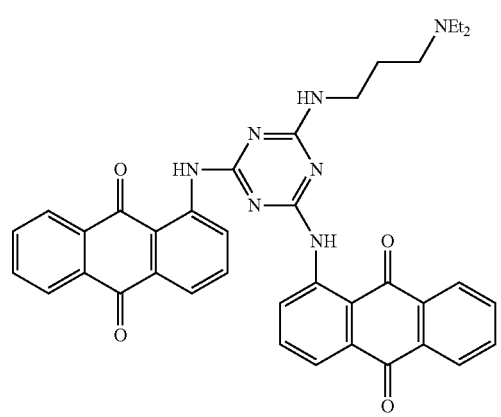
(A-15)
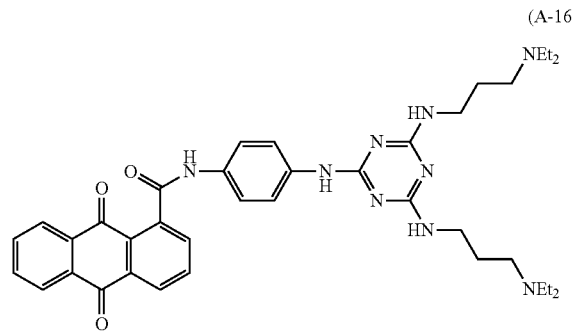
(A-16)
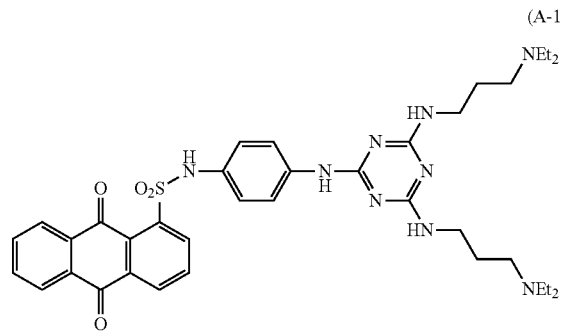
(A-17)

-continued
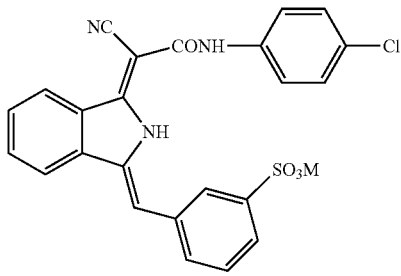
(A-18)
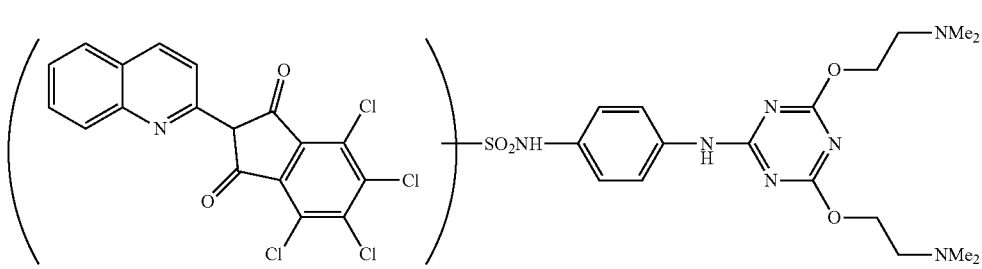
(A-19)
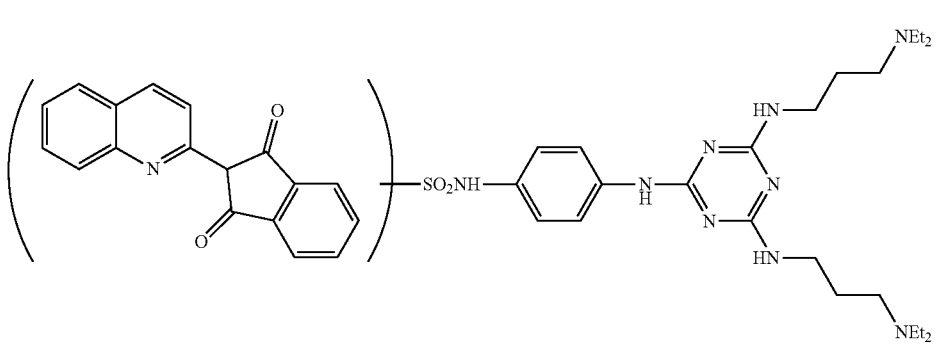
(A-20)
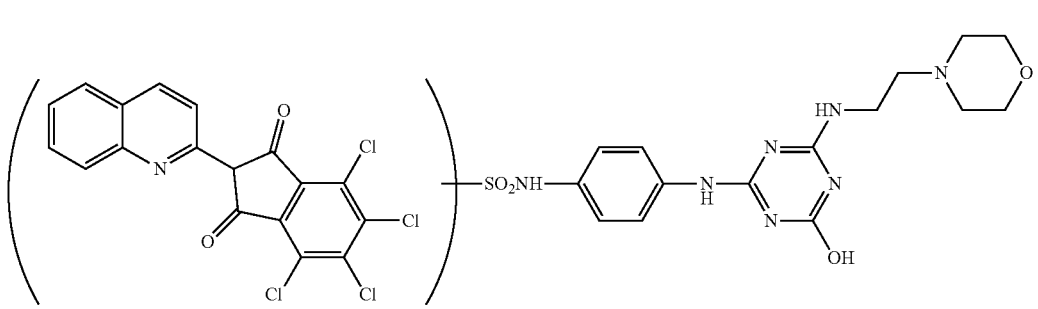
(A-21)
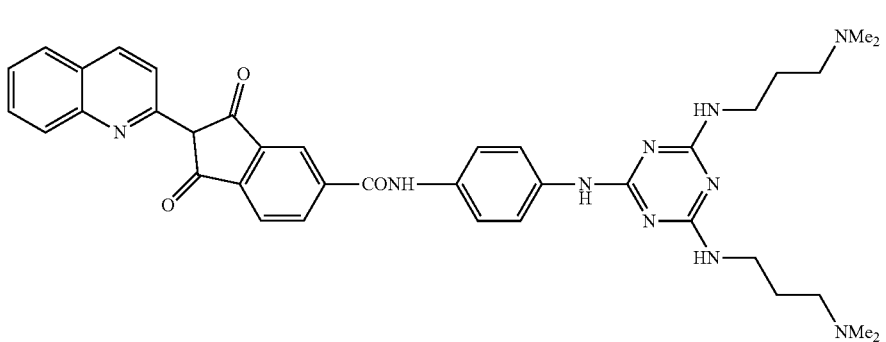
(A-22)

-continued
(A-23)
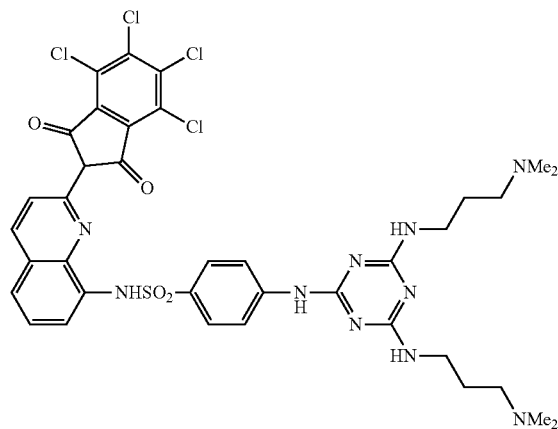
(A-24)
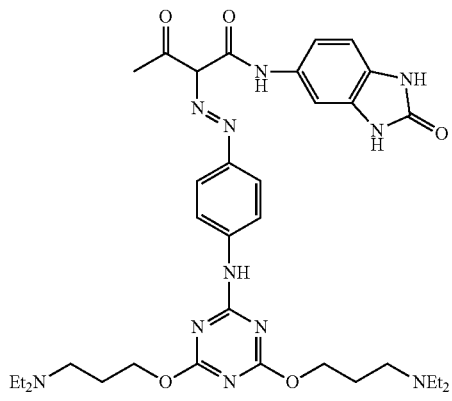
(A-25)
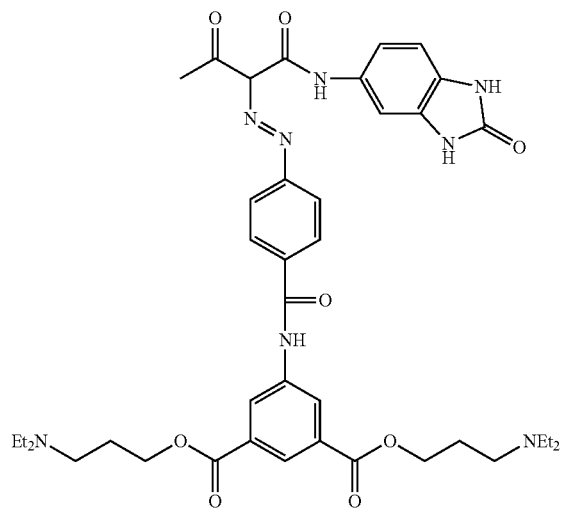
(A-26)
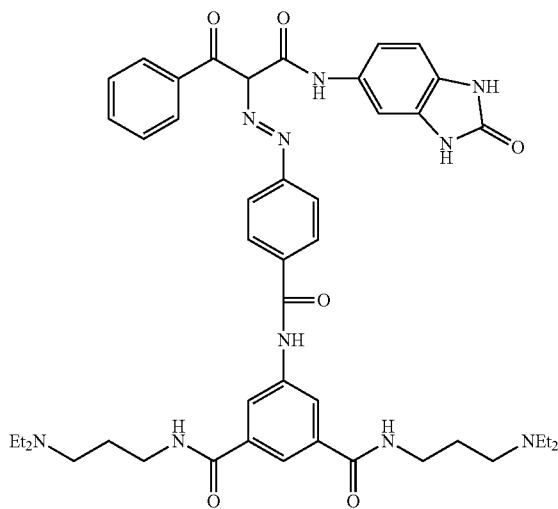
(A-27)
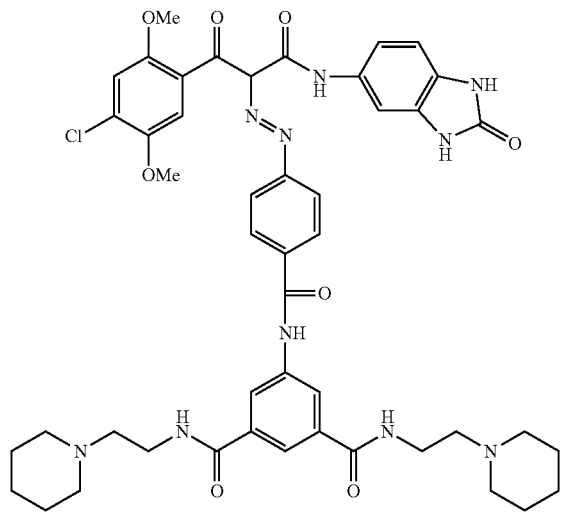
(A-28)
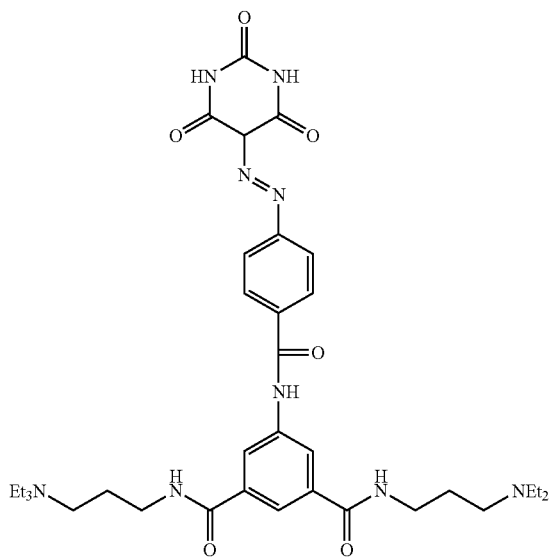

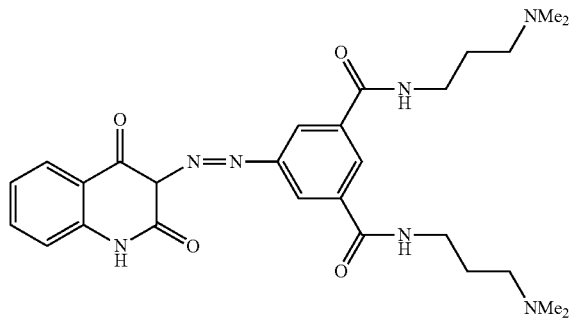

(A-29)

Of the pigment derivatives set forth above, (A-1), (A-2), (A-5), (A-9), (A-10), (A-11) (A-19), (A-20), (A-21), (A-22), (A-23), (A-24) and (A-25) are preferred, and (A-1), (A-2), (A-9), (A-10) and (A-23) are more preferred.

The content of the pigment derivative in the colored composition according to the invention is preferably from 1 to 30% by weight, more preferably from 3 to 20% by weight, based on the total weight of the color pigment. The pigment derivatives may be used individually or in a combination of two or more thereof.

[5] Acid Anhydride

The colored composition may contain an add anhydride. By incorporating the acid anhydride into the colored composition, the crosslinking property of the curable compound, particularly, the epoxy compound in the heat curing can be improved.

Examples of the acid anhydride include phthalic anhydride, nadic anhydride, maleic anhydride and succinic anhydride. Among them, phthalic anhydride is preferred in view of small impact to pigment dispersion.

As an epoxy curing agent, an amine compound is ordinarily used, because of advantage in that pot life is relatively long.

The content of the acid anhydride in the colored composition is preferably in a range from 10 to 40% by weight, more preferably in a range from 15 to 30% by weight, based on the content of the curable compound (particularly, the epoxy compound). When the content of the acid anhydride is 10% by weight or more, crosslinking density of the curable compound, particularly, the epoxy compound increases so that mechanical strength can be improved. When the content of the acid anhydride is 40% by weight or less, the heat curable component is inhibited in the coated layer to have an advantage in increasing the concentration of coloring agent.

[6] Solvent

The colored composition according to the invention may be ordinarily constituted using a solvent (ordinarily, an organic solvent). The organic solvent is basically not particularly restricted as long as the solubility of each component and the coating property of the colored curable composition are satisfied.

Preferred examples of the organic solvent include an ester, for example, ethyl acetate, n-butyl acetate, isobutyl acetate, amyl formate, isoamyl acetate, isobutyl acetate, butyl propionate, isopropyl butyrate, ethyl butyrate, butyl butyrate, methyl lactate, ethyl lactate, an alkyl oxyacetate (for example, methyl oxyacetate, ethyl oxyacetate, butyl oxyacetate (for example, methyl methoxyacetate, ethyl methoxyacetate, butyl methoxyacetate, methyl ethoxyacetate or ethyl ethoxyacetate)), an alkyl 3-oxypropionate (for example, methyl 3-oxypropionate or ethyl 3-oxypropionate (for example, methyl 3-methoxypropionate, ethyl 3-methoxypropionate, methyl 3-ethoxypropionate or ethyl 3-ethoxypropionate)), an alkyl 2-oxypropionate (for example, methyl 2-oxypropionate, ethyl 2-oxypropionate, propyl 2-oxypropionate (for example, methyl 2-methoxypropionate, ethyl 2-methoxypropionate, propyl 2-methoxypropionate, methyl 2-ethoxypropionate or ethyl 2-ethoxypropionate)), methyl 2-oxy-2-methylpropionate, ethyl 2-oxy-2-methylpropionate (for example, methyl 2-methoxy-2-methylpropionate or ethyl 2-ethoxy-2-methylpropionate), methyl pyruvate, ethyl pyruvate, propyl pyruvate, methyl acetoacetate, ethyl acetoacetate, methyl 2-oxobutanoate or ethyl 2-oxobutanoate; an ether, for example, diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate or propylene glycol monopropyl ether acetate; a ketone, for example, methyl ethyl ketone, cyclohexanone, 2-heptanone or 3-heptanone; and an aromatic hydrocarbon, for example, toluene or xylene.

From the standpoint, for example, of improving the coated surface state, an embodiment of mixing two or more of the organic solvents is also preferred. In this case, a mixed solution composed of two or more solvents selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether and propylene glycol methyl ether acetate is particularly preferred.

From the standpoint of coating property, the content of the solvent in the colored composition is an amount to make a total solid content concentration of the colored composition preferably from 5 to 80% by weight, more preferably from 5 to 60% by weight, and particularly preferably from 10 to 50% by weight.

[7] Various Additives

The colored composition according to the invention may contain various additives, for example, a binder, a polymerization initiator, a polymerizable compound, a surfactant, a curing agent, a curing catalyst, a polymerization inhibitor, a slime coupling agent, a filler, an adhesion accelerator, an antioxidant, an ultraviolet absorbing agent or a coagulation preventing agent, if desired, within the range where the effects of the invention are not impaired.

(Binder)

The binder may be added in the preparation of pigment dispersion liquid in many cases and it is not requested to be alkali-soluble and it is sufficient to be soluble in an organic solvent.

The binder is preferably a linear organic polymer and is preferably soluble in an organic solvent. Examples of such a linear organic polymer include a polymer having a carboxylic acid in its side chain, for example, a methacrylic acid copolymer, an acrylic acid copolymer, an itaconic acid copolymer, a crotonic acid copolymer, a maleic acid copolymer, a partially esterified maleic acid copolymer as described in JP-B-59-44615 (the term "JP-B" as used herein means an "examined Japanese patent publication"), JP-B-54-34327, JP-B-58-12577, JP-B-54-25957, JP-A-59-53836 and JP-A-59-71048. Also, an acidic cellulose derivative having a carboxylic acid in its side chain is useful.

Of the binders, a polyhydroxystyrene resin, a polysiloxane resin, an acrylic resin, an acrylamide resin or an acryl/acrylamide copolymer resin is preferred, and an acrylic resin, an acrylamide resin or an acryl/acrylamide copolymer resin is more preferred.

As the acrylic resin, a copolymer comprising a monomer selected, for example, from benzyl(meth)acrylate, (meth)acrylic acid, hydroxyethyl(meth)acrylate and (meth)acrylamide, for example, benzyl methacrylate/methacrylic acid copolymer, benzyl methacrylate/benzylmethacrylamide copolymer, KS RESIST-106 (produced by Osaka Organic Chemical Industry Ltd.) or CYCLOMER P Series (produced by Daicel Chemical Industries, Ltd.) is preferred.

By dispersing the coloring agent described above at high concentration in the binder, an adhesion property to an under layer or the like is impaired and the binder contributes to a surface state of layer at spin coat or slit coat (formation of colored layer).

(Polymerization initiator)

The colored composition according to the invention may further contain polymerization initiator.

As the polymerization initiator according to the invention, compounds known as polymerization initiators described below can be employed.

The polymerization initiator is not particularly restricted as long as it has an ability of initiating polymerization of the polymerizable compound described in detail hereinafter and may be appropriately selected from known polymerization initiators. For example, those having photosensitivity to light in the region from ultraviolet to visible are preferred. The initiator may also be an activator capable of causing a certain action with a photoexcited sensitizer to generate an active radical or an initiator capable of initiating cationic polymerization depending on the kind of the monomer.

Further, the polymerization initiator preferably contains at least one kind of a component having a molecular extinction coefficient of at least about 50 in the range from about 300 to about 800 nm (more preferably from 330 to 500 nm).

Examples of the polymerization initiator include a halogenated hydrocarbon derivative (for example, a compound having a triazine skeleton or a compound having an oxadiazole skeleton), an acylphosphine compound, for example, an acylphosphine oxide, a hexaarylbiimidazole, an oxime compound, for example, an oxime derivative, an organic peroxide, a thio compound, a ketone compound, an aromatic onium salt, a ketoxime ether, an aminoacetophenone compound and a hydroxyacetophenone.

Examples of the halogenated hydrocarbon compound having a triazine skeleton include compounds described in Wakabayashi et al., *Bull. Chem. Soc. Japan*, 42, 2924 (1969), compounds described in Britain Patent 1,388,492, compounds described in JP-A-53-133428, compounds described in Germany Patent 3337024, compounds described in F. C. Schaefer et al., *J. Org. Chem.*, 29, 1527 (1964), compounds described in JP-A-62-58241, compounds described in JP-A-5-281728, compounds described in JP-A-5-34920 and compounds described in U.S. Pat. No. 4,212,976.

The compounds described in U.S. Pat. No. 4,212,976 include, for example, a compound having an oxadiazole skeleton (e.g., 2-trichloromethyl-5-phenyl-1,3,4-oxadiazole, 2-trichloromethyl-5-(4-chlorophenyl)-1,3,4-oxadiazole, 2-trichloromethyl-5-(1-naphthyl)-1,3,4-oxadiazole, 2-trichloromethyl-5-(2-naphthyl)-1,3,4-oxadiazole, 2-tribromomethyl-5-phenyl-1,3,4-oxadiazole, 2-tribromomethyl-5-(2-naphthyl)-1,3,4-oxadiazole, 2-trichloromethyl-5-styryl-1,3,4-oxadiazole, 2-trichloromethyl-5-(4-chlorostyryl)-1,3,4-oxadiazole, 2-trichloromethyl-5-(4-methoxystyryl)-1,3,4-oxadiazole, 2-trichloromethyl-5-(1-naphthyl)-1,3,4-oxadiazole, 2-trichloromethyl-5-(4-n-buthoxystyryl)-1,3,4-oxadiazole, 2-tribromomethyl-5-styryl-1,3,4-oxadiazole).

Examples of the polymerization initiator other than those described above include an acridine derivative (e.g., 9-phenylacridine, 1,7-bis(9,9'-acridinyl)heptane), N-phenylglycine, a polyhalogen compound (e.g., carbon tetrabromide, phenyl, tribromomethyl sulfone or phenyl trichloromethyl ketone), a coumarin 3-(2-benzofuroyl)-7-diethylaminocoumarin, 3-(2-benzofuroyl)-7-(1-pyrrolidinyl)coumarin, 3-benzoyl-7-diethylaminocoumarin, 3-(2-methoxybenzoyl)-7-diethylaminocoumarin, 3-(4-dimethylaminobenzoyl)-7-diethylaminocoumarin, 3,3'-carbonylbis(5,7-di-n-propoxycoumarin), 3,3'-carbonylbis(7-diethylaminocoumarin), 3-benzoyl-7-methoxycoumarin, 3-(2-furoyl)-7-diethylaminocoumarin, 3-(4-diethylaminocinnamoyl)-7-diethylaminocoumarin, 7-methoxy-3-(3-pyridylcarbonyl)coumarin, 3-benzoyl-5,7-dipropoxycoumarin, 7-benzotriazol-2-ylcoumarin, coumarin compounds described, for example, in JP-A-5-19475, JP-A-7-271028, JP-A-2002-363206, JP-A-2002-363207, JP-A-2002-363208 and JP-A-2002-363209), an acylphosphine oxide (e.g., bis(2,4,6-trimethylbenzoyl)phenylphosphine oxide, bis(2,6-dimethoxybenzoyl)-2,4,4-trimethylpentylphenylphosphine oxide or Lucirin TPO), a metallocene (e.g., bis(η5-2,4-cyclopentadien-1-yl)-bis(2,6-difluoro-3-(1H-pyrrol-1-yl)phenyl)titanium or η5-cyclopentadienyl-η6-cumenyl-iron(1+)-hexafluorophosphate (1−)), and compounds described, for example, in JP-A-53-133428, JP-B-57-1819, JP-B-57-6096 and U.S. Pat. No. 3,615,455.

Examples of the ketone compound include benzophenone, 2-methylbenzophenone, 3-methylbenzophenone, 4-methylbenzophenone, 4-methoxybenzophenone, 2-chlorobenzophenone, 4-chlorobenzophenone, 4-bromobenzophenone, 2-carboxybenzophenone, 2-ethoxycarbonylbenzophenone, benzophenone tetracarboxylic acid or a tetramethyl ester thereof, a 4,4'-bis(dialkylamino)benzophenone (for example, 4,4'-bis(dimethylamino)benzophenone, 4,4'-bis(dicyclohexylamino)benzophenone, 4,4'-bis(diethylamino)benzophenone, 4,4'-bis(dihydroxyethylamino)benzophenone, 4-methoxy-4'-dimethylaminobenzophenone, 4,4'-dimethoxybenzophenone, 4-dimethylaminobenzophenone, 4-dimethylaminoacetophenone, benzyl, anthraquinone, 2-tert-butylanthraquinone, 2-methylanthraquinone, phenanthraquinone, xanthone, thioxanthone, 2-chlorothioxanthone, 2,4-diethylthioxanthone, fluorenone, 3-benzyl-2-dimethylamino-1-(4-morpholinophenyl)-1-butanone, 2-methyl-1-[4-(methylthio)phenyl]-2-morpholino-1-propanone, 2-hydroxy-2-methyl-[4-(1-methylvinyl)phenyl]propanol oligomer, benzoin, a benzoin ether (e.g., benzoin methyl ether, benzoin ethyl ether, benzoin propyl ether, benzoin isopropyl ether, benzoin phenyl ether, benzyl dimethyl ketal), acridone, chloroacridone, N-methylacridone, N-butylacridone and N-butyl-chloroacridone.

A hydroxyacetophenone compound, an aminoacetophenone compound and an acylphosphine compound may also be suitably used as the polymerization initiator. More specifically, for example, an aminoacetophenone initiator described in JP-A-10-291969 and an acylphosphine oxide initiator described in Japanese Patent 4225898 may be used.

As the hydroxyacetophenone initiator, IRGACURE-184, DAROCUR-1173, IRGACURE-500, IRGACURE-2959 and IRGACURE-127 (trade names, all produced by BASF) may be used. As the aminoacetophenone initiator, commercially available IRGACURE-907, IRGACURE-369 and IRGACURE-379 (trade names, all produced by BASF) may be used. As the aminoacetophenone initiator, compounds in which the absorption wavelength matches a light source having a long wavelength, for example, 365 nm or 405 in described in JP-A-2009-191179 may be also used. As the acylphosphine initiator, commercially available IRGACURE-819 and DAROCUR-TPO (trade names, both produced by BASF) may be used.

The polymerization initiator more preferably includes an oxime compound. Specific examples of the oxime initiator used include compounds described in JP-A-2001-233842, compounds describe in JP-A-2000-80068 and compounds described in JP-A-2006-342166.

Examples of the oxime compound, for example, an oxime derivative, which is suitably used as the polymerization initiator in the invention, include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one and 2-ethoxycarbonyloxyimino-1-phenylpropan-1-one.

Examples of the oxime compound include the compounds described in *J. C. S. Perkin II*, pp. 1653-1660 (1979), *J. C. S. Perkin II*, pp. 156-162 (1979), *Journal of Photopolymer Science and Technology*, pp. 202-232 (1995), JP-A-2000-66385, JP-A-2000-80068, JP-T-2004-534797 (the term "JP-T" as used herein means a published Japanese translation of a PCT patent application) and JP-A-2006-342166.

Commercially available IRGACURE-OXE01 (produced by BASF) and IRGACURE-OXE02 (produced by BASF) may be also suitably used.

As the oxime compound other than those described above, for example, compounds described in JP-T-2009-519904 where oxime is connected to N-position of carbazole, compounds described in U.S. Pat. No. 7,626,957 where a hetero substituent is introduced into a benzophenone moiety, compounds described in JP-A-2010-15025 and U.S. Patent Application Publication No. 2009-292039 where a nitro group is introduced into a dye moiety, ketoxime compounds described in WO 2009/131189, compounds containing a triazine skeleton and an oxime skeleton in the same molecule described in U.S. Pat. No. 7,556,910 and compounds having an absorption maximum at 405 nm and exhibiting good sensitivity to a g-ray light source described in JP-A-2009-221114 may be also used.

Furthermore, cyclic oxime compounds described in JP-A-2007-231000 and JP-A-2007-322744 may be also suitably used. Of the cyclic oxime compounds, cyclic oxime compounds fused to a carbazole dye described in JP-A-2010-

32985 and JP-A-2010-185072 are preferred from the standpoint of high light absorbing property and high sensitivity.

Also, compounds having an unsaturated bond at a specific site thereof described in JP-A-2009-242469 can be suitably used because they can achieve high sensitivity by regenerating an active radical from a polymerization inactive radical.

Most preferably, oxime compound having a specific substituent described in JP-A-2007-269779 and the oxime compound having a thioaryl group described in JP-A-2009-191061 are exemplified.

Specifically, the oxime polymerization initiator is preferably a compound represented by formula (OX-1) shown below. The oxime compound may be a compound where the N—O bond of oxime is (E) form, a compound where the bond is (Z) form or a compound where the bond is a mixture of (E) form and (Z) form.

In formula (OX-1), R and B each independently represents a monovalent substituent, A represents a divalent organic group, and Ar represents an aryl group.

In formula (OX-1), the monovalent substituent represented by R is preferably a monovalent nonmetallic atom group.

Examples of the monovalent nonmetallic atom group include an alkyl group, an aryl group, an acyl group, an alkoxycarbonyl group, an aryloxycarbonyl group, a heterocyclic group, an alkylthiocarbonyl group and an arylthiocarbonyl group. These groups may have one or more substituents. The substituent described above may be further substituted with other substituent.

Examples of the substituent include a halogen atom, an aryloxy group, an alkoxycarbonyl group, an aryloxycarbonyl group, an acyloxy group, an acyl group, an alkyl group and an aryl group.

The alkyl group which may have a substituent is preferably an alkyl group having from 1 to 30 carbon atoms, and specific examples thereof include a methyl group, an ethyl group, a propyl group, a butyl group, a hexyl group, an octyl group, a decyl group, a dodecyl group, an octadecyl group, an isopropyl group, an isobutyl group, a sec-butyl group, a tert-butyl group, a 1-ethylpentyl group, a cyclopentyl group, a cyclohexyl group, a trifluoromethyl group, a 2-ethylhexyl group, a phenacyl group, a 1-naphthoylmethyl group, a 2-naphthoylmethyl group, a 4-methylsulfanylphenacyl group, a 4-phenylsulfanylphenacyl group, a 4-dimethylaminophenacyl group, a 4-cyanophenacyl group, a 4-methylphenacyl group, a 2-methylphenacyl group, a 3-fluorophenacyl group, a 3-trifluoromethylphenacyl group and a 3-nitrophenacyl group.

The aryl group which may have a substituent is preferably an aryl group having from 6 to 30 carbon atoms, and specific examples thereof include a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, a quaterphenyl group, an o-tolyl group, an m-tolyl group, a p-tolyl group, a xylyl group, an o-cumenyl group, an m-cumenyl group, a p-cumenyl group, a mesityl group, a pentalenyl group, a binaphthalenyl group, a ternaphthalenyl group, a quaternaphthalenyl group, a heptalenyl group, a biphenylenyl group, an indacenyl group, a fluoranthenyl group, an acenaphthylenyl group, an aceanthrylenyl group, a phenalenyl group, a fluorenyl group, an anthryl group, a bianthracenyl group, a teranthracenyl group, a quateranthracenyl group, an anthraquinolyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group and an ovalenyl group.

The acyl group which may have a substituent is preferably an acyl group having from 2 to 20 carbon atoms, and specific examples thereof include an acetyl group, a propanoyl group, a butanoyl group, a trifluoroacetyl group, a pentanoyl group, a benzoyl group, a 1-naphthoyl group, a 2-naphthoyl group, a 4-methylsulfanylbenzoyl group, a 4-phenylsulfanylbenzoyl group, a 4-dimethylaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-tritfuoromethylbenzoyl group, a 3-cyanobenzoyl group, a 3-nitrobenzoyl group, a 4-fluorobenzoyl group, a 4-cyanobenzoyl group and a 4-methoxybenzoyl group.

The alkoxycarbonyl group which may have a substituent is preferably an alkoxycarbonyl group having from 2 to 20 carbon atoms, and specific examples thereof include a methoxycarbonyl group, an ethoxycarbonyl group, a propoxycarbonyl group, a butoxycarbonyl group, a hexyloxycarbonyl group, an octyloxycarbonyl group, a decyloxycarbonyl group, an octadecyloxycarbonyl group and a trifluoromethyloxycarbonyl group.

Specific examples of the aryloxycarbonyl group which may have a substituent include a phenoxycarbonyl group, a 1-naphthyloxycarbonyl group, a 2-naphthyloxycarbonyl group, a 4-methylsulfanylphenyloxycarbonyl group, a 4-phenylsulfanylphenyloxycarbonyl group, a 4-dimethylaminophenyloxycarbonyl group, a 4-diethylaminophenyloxycarbonyl group, a 2-chlorophenyloxycarbonyl group, a 2-methylphenyloxycarbonyl group, a 2-methoxyphenyloxycarbonyl group, a 2-butoxyphenyloxycarbonyl group, a 3-chlorophenyloxycarbonyl group, a 3-trifluoromethylphenyloxycarbonyl group, a 3-cyanophenyloxycarbonyl group, a 3-nitrophenyloxycarbonyl group, a 4-fluorophenyloxycarbonyl group, a 4-cyanophenyloxycarbonyl group and a 4-methoxyphenyloxycarbonyl group.

The heterocyclic group which may have a substituent is preferably an aromatic or aliphatic heterocyclic group containing a nitrogen atom, an oxygen atom, a sulfur atom or a phosphorus atom.

Specific examples thereof include a thienyl group, a benzo[b]thienyl group, a naphtho[2,3-b]thienyl group, a thianthrenyl group, a furyl group, a pyranyl group, an isobenzofuranyl group, a chromenyl group, a xanthenyl group, a phenoxathiinyl group, a 2H-pyrrolyl group, a pyrrolyl group, an imidazolyl group, a pyrazolyl group, a pyridyl group, a pyrazinyl group a pyrimidinyl group, a pyridazinyl group, an indolizinyl group, an isoindolyl group, a 3H-indolyl group, an indolyl group, a 1H-indazolyl group, a purinyl group, a 4H-quinolizinyl group, an isoquinolyl group, a quinolyl group, a phthalazinyl group, a naphthyridinyl group, a quinoxanilyl group, a quinazolinyl group, a cinnolinyl group, a pteridinyl group, a 4aH-carbazolyl group, a carbazolyl group, a β-carbolinyl group, a phenanthridinyl group, an acridinyl group, a perimidinyl group, a phenanthrolinyl group, a phenazinyl group, a phenarsazinyl group, an isothiazolyl group, a phenothiazinyl group, an isoxazolyl group, a furazanyl group, a phenoxazinyl group, an isochromanyl group, a chromanyl group, a pyrrolidinyl group, a pyrrolinyl group, an imidazolidinyl group, an imidazolinyl group, a pyrazolidinyl group, a pyrazolinyl group, a piperidyl group, a piperazinyl group, an indolinyl group, an isoindolinyl group, a quinuelidinyl group, a morpholinyl group and a thioxantholyl group.

Specific examples of the alkylthiocarbonyl group which may have a substituent include a methylthiocarbonyl group, a propylthiocarbonyl group, a butylthiocarbonyl group, a hexylthiocarbonyl group, an octylthiocarbonyl group, a decyl thiocarbonyl group, an oetadecylthiocarbonyl group and a trifluoromethylthiocarbonyl group.

Specific examples of the arylthiocarbonyl group which may have a substituent include a 1-naphthylthiocarbonyl group, a 2-naphthylthiocarbonyl group, a 4-methylsulfanylphenylthiocarbonyl group, a 4-phenylsulfanylphenylthiocarbonyl group, a 4-dimethylaminophenylthiocarbonyl group, a 4-diethylaminophenylthiocarbonyl group, a 2-chlorophenylthiocarbonyl group, a 2-methylphenylthiocarbonyl group, a 2-methoxyphenylthiocarbonyl group, a 2-butoxyphenylthiocarbonyl group, a 3-chlorophenylthiocarbonyl group, a 3-trifluoromethylphenylthiocarbonyl group, a 3-cyanophenylthiocarbonyl group, a 3-nitrophenylthiocarbonyl group, a 4-fluorophenylthiocarbonyl group, a 4-cyanophenylthiocarbonyl group and a 4-methoxyphenylthiocarbonyl group.

In formula (OX-1), the monovalent substituent represented by B represents an aryl group, a heterocyclic group, an arylcarbonyl group or a heterocyclic carbonyl group. These groups may have one or more substituents. Examples of the substituent include the substituents described above. Also, the substituent described above may be further substituted kith other substituent.

Among them structures shown below are particularly preferred.

In the structures below, Y, X and n have the same meanings as Y, X and n in Formula (OX-2) described below, and preferred examples thereof are also the same.

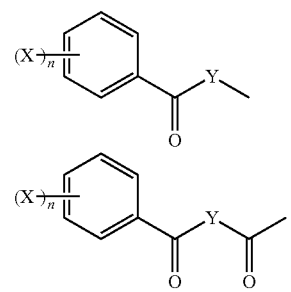

In formula (OX-1), examples of the divalent organic group represented by A include an alkylene group having from 1 to 12 carbon atoms, a cyclohexylene having from 6 to 12 carbon atoms) and an alkynylene group having from 2 to 12 carbon atoms). These groups may have one or more substituents. Examples of the substituent include the substituents described above. Also, the substituent described above may be further substituted with other substituent.

Among them, from the standpoint of increasing sensitivity and inhibiting coloration due to heating aging, A is preferably an unsubstituted alkylene group, an alkylene group substituted with an alkyl group (for example, a methyl group, an ethyl group, a tert-butyl group or a dodecyl group), an alkylene group substituted with an alkenyl group (for example, a vinyl group or an allyl group) or an alkylene group substituted with an aryl group (for example, a phenyl group, a p-tolyl group, a xylyl group, a cumenyl group, a naphthyl group, an anthryl group, a phenanthryl group or a styryl group).

In formula (OX-1), the aryl group represented by Ar is preferably an aryl group having from 6 to 30 carbon atoms and may have a substituent. Examples of the substituent are the same as those of the substituent introduced into the substituted aryl group described above as the specific example of the aryl group which may have a substituent.

Among them, from the standpoint of increasing sensitivity and inhibiting coloration due to heating aging, a substituted or unsubstituted phenyl group is preferred.

In formula (OX-1), the structure "SAr" formed by Ar and S adjacent thereto is preferably a structure shown below from the standpoint of sensitivity. In the structures below, Me represents a methyl group, and Et represents an ethyl group.

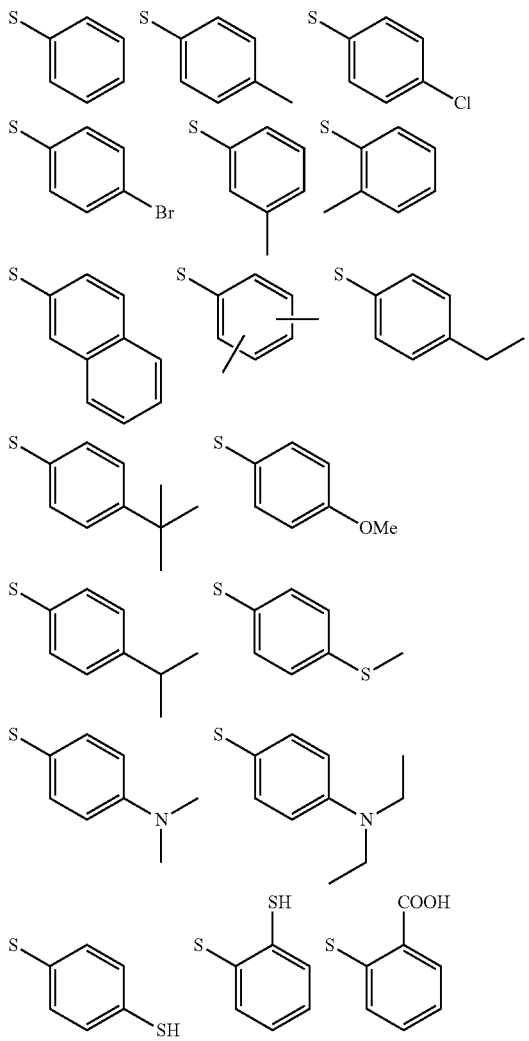

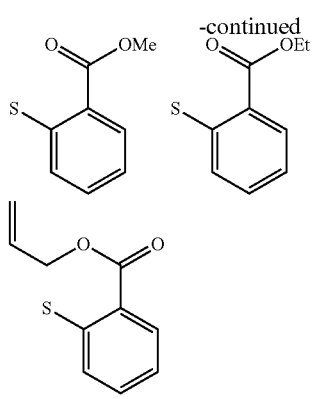

-continued

The oxime compound is preferably a compound represented by formula (OX-2) shown below.

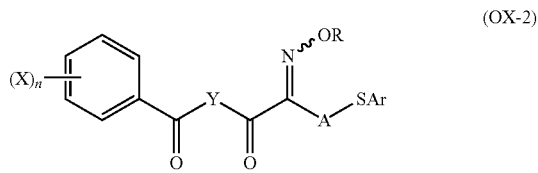

(OX-2)

In formula (OX-2), R and X each independently represents a monovalent substituent, A and Y each independently represent a divalent organic group, Ar represents an aryl group, and n represents an integer from 0 to 5.

In formula (OX-2), R, A and Ar have the same meanings as R, A and Ar in formula (1), and preferred examples thereof are also the same.

In formula (OX-2), examples of the monovalent substituent represented by X include an alkyl group, an aryl group, an alkoxy group, an aryloxy group, an acyloxy group, an alkoxycarbonyl group, an amino group, a heterocyclic group and a halogen atom. These groups may have one or more substituents. Examples of the substituent include the substituents described above. Also, the substituent described above may be further substituted with other substituent.

Among them, X in formula (OX-2) is preferably an alkyl group from the standpoint of solvent solubility and increase in absorption efficiency in the long wavelength region.

In formula (OX-2), n represents an integer from 0 to 5, and is preferably an integer from 0 to 2.

In formula (OX-2), examples of the divalent organic group represented by Y include structures shown below. In the groups shown below, * indicates a connecting position to the carbon atom adjacent to Y.

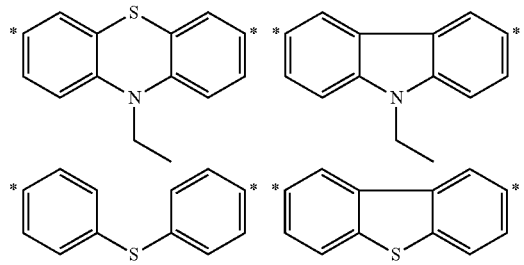

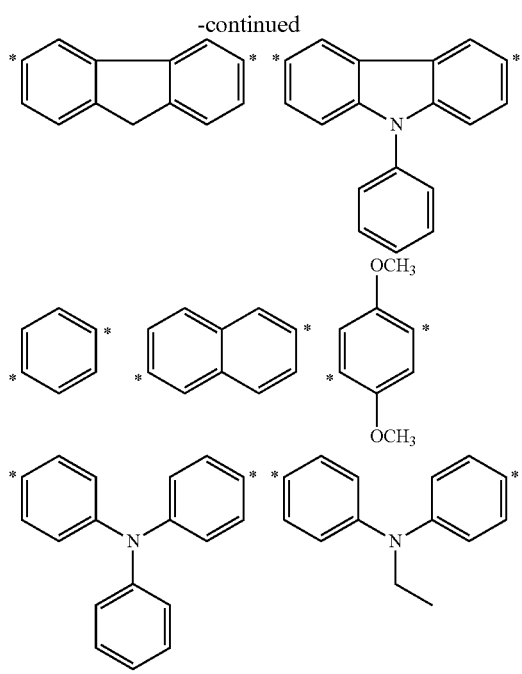

Among them, structures shown below are preferred from the standpoint of high sensitivity.

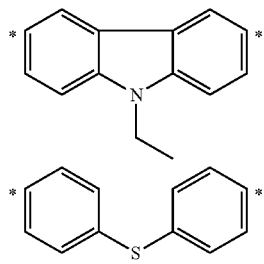

The oxime compound is more preferably a compound represented by formula (OX-3) shown below.

(OX-3)

In formula (OX-3), R and X each independently represents a monovalent substituent, A represents a divalent organic group, Ar represents an aryl group, and n is an integer from 0 to 5.

In formula (OX-3), R, X, A, Ar and n have the same meanings as R, X, A, Ar and n in formula (OX-2), and preferred examples thereof are also the same.

Specific examples (B-1) to (B-10) of the oxime compound suitably used are set forth below, but the invention should not be construed as being limited thereto.

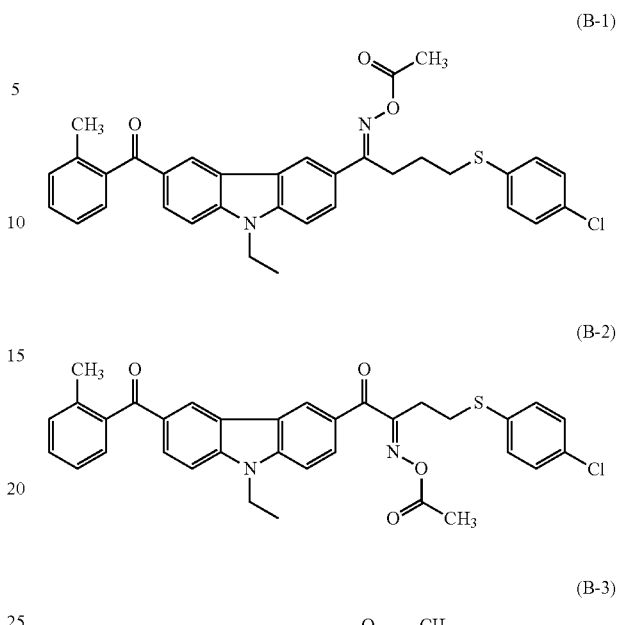

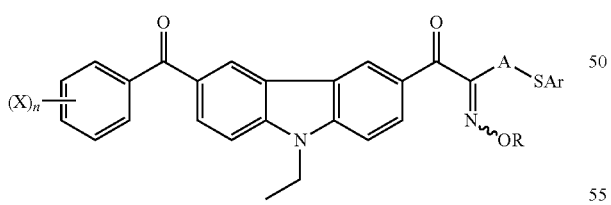

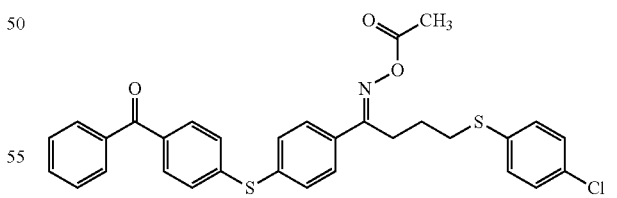

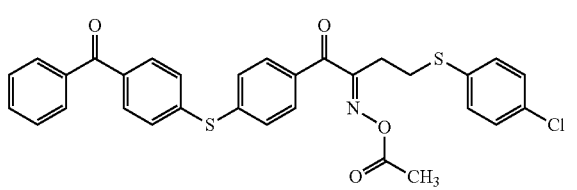

(B-7)

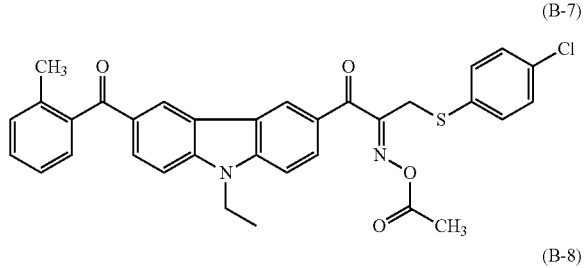

(B-8)

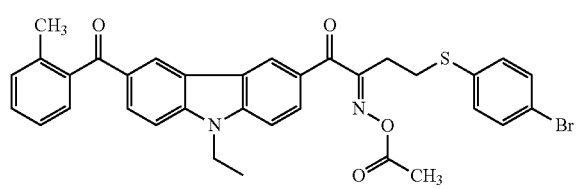

(B-9)

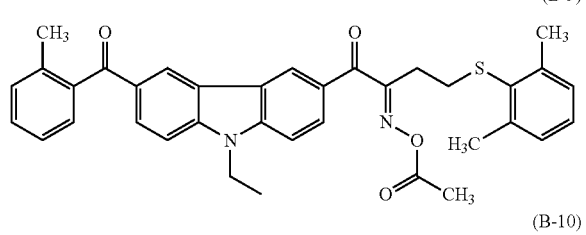

(B-10)

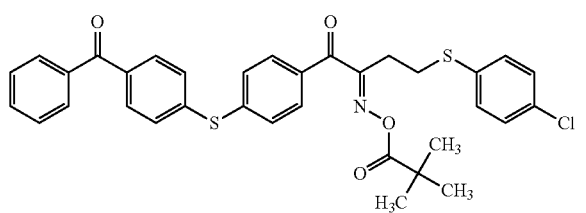

The oxime compound is a compound having a maximum absorption wavelength in the wavelength region from 350 to 500 nm, preferably a compound having an absorption wavelength in the wavelength region from 360 to 480 nm, and particularly preferably a compound having high absorbance at wavelengths of 365 nm and 455 nm.

The molar extinction coefficient at a wavelength of 365 nm or 405 nm of the oxime compound is preferably from 1,000 to 300,000, more preferably from 2,000 to 300,000, particularly preferably from 5,000 to 200,000, from the standpoint of sensitivity.

The molar extinction coefficient of the compound can be determined using a known method and specifically, for example, it is preferably measured at a concentration of 0.01 g/L using an ethyl acetate solvent in an ultraviolet-visible spectrophotometer (Carry-5 Spectrophotometer, produced by Varian, Inc.).

The polymerization initiators for use in the invention may be employed in combination of two or more thereof, if desired.

The polymerization initiator for use in the colored composition according to the invention is preferably a compound selected from the group consisting of a trihalomethyltriazine compound, a benzyldimethylketal compound, an α-hydroxyketone compound, an α-aminoketone compound, an acylphosphine compound, a phosphinoxide compound, a metallocene compound, an oxime compound, a triarylimidazole dimer, an onium compound, a benzothiazole compound, a benzophenone compound, an acetophenone compound or a derivative thereof cyclopentadiene-benzene-iron complex or a salt thereof, a halomethyloxadiazole compound and a 3-aryl-substituted coumarin compound.

It is more preferably a compound selected from the group consisting of a trihalomethyltriazine compound, an α-aminoketone compound, an acylphosphine compound, a phosphinoxide compound, an oxime compound, a triarylimidazole dimer, an onium compound, a benzophenone compound and an acetophenone compound, and most preferably a compound selected from the group consisting of a trihalomethyltriazine compound, an α-aminoketone compound, an oxime compound, a triarylimidazole dimer and a benzophenone compound.

The content (total content, in case of using two or more) of the polymerization initiator is preferably from 0.1 to 50% by weight, more preferably from 0.5 to 30% by weight, still more preferably from 1 to 20% by weight, based on the total solid content of the colored composition of the invention.

(Polymerizable Compound)

The polymerizable compound is selected from compounds having at least one terminal ethylenically unsaturated bond, preferably two or more terminal ethylenically unsaturated bonds. Such compounds are widely known in the field of art and these compounds can be used in the invention without any particular restriction. The compound may be in any of chemical forms, for example, a monomer, a prepolymer, specifically, a dimer, a trimer or an oligomer, and a mixture thereof or a multimer thereof. The polymerizable compounds according to the invention may be used individually or in combination, of two or more thereof.

More specifically, examples of the monomer and prepolymer thereof include an unsaturated carboxylic acid (for example, acrylic acid, methacrylic acid, itaconic acid, crotonic acid, isocrotonic acid or maleic acid), its esters and amides, and multimers thereof. Esters of an unsaturated carboxylic acid and an aliphatic polyhydric alcohol compound, amides of an unsaturated carboxylic acid and an aliphatic polyvalent amine compound, and multimers thereof are preferred. Also, an addition reaction product of an unsaturated carboxylic acid ester or amide having a nucleophilic substituent, for example, a hydroxy group, an amino group or a mercapto group, with a monofunctional or polyfunctional isocyanate or epoxy compound, and a dehydration condensation reaction product with a monofunctional or polyfunctional carboxylic acid may be also suitably used. Further, an addition reaction product of an unsaturated carboxylic acid ester or amide having an electrophilic substituent, for example, an isocyanate group or an epoxy group, with a monofunctional or polyfunctional alcohol, amine or thiol, and a substitution reaction product of an unsaturated carboxylic acid ester or amide having a releasable substituent, for example, a halogen atom or a tosyloxy group, with a monofunctional or polyfunctional alcohol, amine or thiol are also suitable. As other examples, compounds where the unsaturated carboxylic acid described above is replaced by an unsaturated phosphonic acid, a vinylbenzene derivative, for example, styrene, vinyl ether, allyl ether may be also used.

As to specific examples of the compound, compounds described in Paragraph Nos. [0095] to [0108] of JP-A-2009-288705 may be suitably used also in the invention.

As the polymerizable compound, a compound having at least one addition-polymerizable ethylene group and having a boiling point of 100° C. or more under normal pressure is also preferred. Examples thereof include a monofunctional acrylate or methacrylate for example, polyethylene glycol mono(meth)acrylate, polypropylene glycol mono(meth)

acrylate or phenoxyethyl(meth)acrylate; a polyfunctional acrylate or methacrylate, for example, polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate dipentaerythritol penta(meth)acrylate, dipentaerythritol hexa(meth)acrylate, hexanediol(meth)acrylate, trimethylolpropane tri(acryloyloxypropyl)ether, tri(acryloyloxyethyl)isocyanurate, a compound obtained by adding ethylene oxide or propylene oxide to a polyfunctional alcohol, for example, glycerin or trimethylolethane, followed by (meth)acrylation, an urethane(meth)acrylate as described in JP-B-48-41708, JP-B-50-6034 and JP-A-51-37193, a polyester acrylate described in JP-A-48-64183, JP-B-49-43191 and JP-B-52-30490, and an epoxy acrylate as a reaction product of an epoxy resin and (meth)acrylic acid; and a mixture thereof.

A polyfunctional (meth)acrylate obtained by reacting a polyfunctional carboxylic acid with a compound having a cyclic ether group and an ethylenically unsaturated group, for example, glycidyl(meth)acrylate is also exemplified.

As other preferred polymerizable compounds, compounds having a fluorene ring and difunctional or more ethylenically unsaturated groups described in JP-A-2010-160418, JP-A-2010-129825 and Japanese Patent 4364216, and a cardo resin may be also used.

As the compound having a boiling point of 100° C. or more under normal pressure and having at least one addition-polymerizable ethylenically unsaturated group, compounds described in Paragraph Nos. [0254] to [0257] of JP-A-2008-292970 are also suitable.

In addition, radical polymerizable monomers represented by formulae (MO-1) to (MO-5) shown below may be suitably used. In the formulae, when T is an oxyalkylene group, the terminal on the carbon atom side thereof is connected to R.

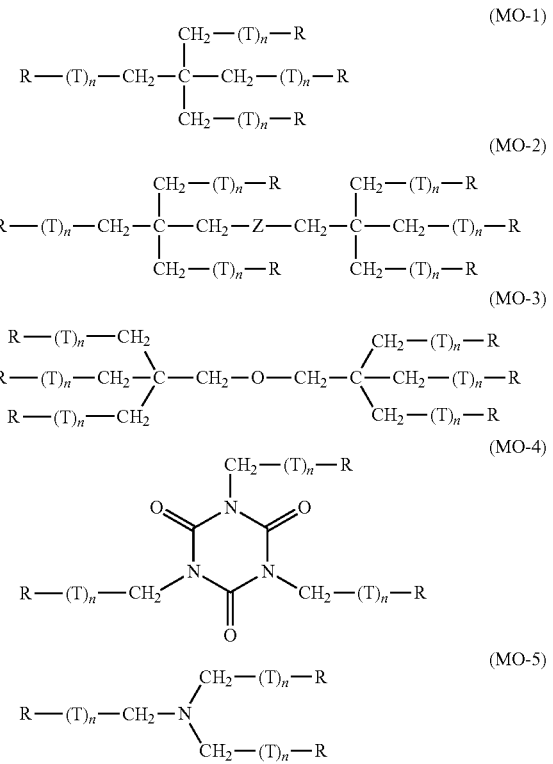

In the formulae above, n is from 0 to 14 and m is from 1 to 8. When plural Rs or plural Ts are present in one molecule, plural Rs or plural Ts may be the same or different from each other.

In each of the polymerizable compounds represented by formulae (MO-1) to (MO-5), at least one of plural Rs represents a group represented by —OC(=O)CH=CH$_2$ or —OC(=O)C(CH$_3$)=CH$_2$.

As to specific examples of the polymerizable compounds represented by formulae (MO-1) to (MO-5), compounds described in Paragraph Nos. [0248] to [0251] of JP-A-2007-269779 may be suitably used also in the invention.

Compounds obtained by adding ethylene oxide or propylene oxide to the above-described polyfunctional alcohol and then (meth)acrylating the adduct, described as formulae (1) and (2) together with their specific examples in JP-A-10-62986, may also be used as the polymerizable compound.

Among them, preferred polymerizable compounds include dipentaerythritol hexaacrylate (as a commercial product, KAYARAD D-330, produced by Nippon Kayaku Co., Ltd.), dipentaerythritol tetraacrylate (as a commercial product, KAYARAD D-320, produced by Nippon Kayaku Co., Ltd.), dipentaerythritol penta(meth)acrylate (as a commercial product, KAYARAD D-310, produced by Nippon Kayaku Co., Ltd.), dipentaerythritol hexa(meth)acrylate (as a commercial product, KAYARAD DPHA, produced by Nippon Kayaku Co., Ltd.), polyfunctional acrylate (as a commercial product, KAYARAD RP-1040, produced by Nippon Kayaku Co., Ltd.), and structures where the (meth)acryloyl group of the compounds described above are connected through an ethylene glycol or propylene glycol residue. Oligomer types of these compounds may also be used. Preferred embodiments of the polymerizable compound are described below.

The polymerizable compound may be a polyfunctional compound having an acid group, for example, a carboxyl group, sulfonic acid group or phosphoric acid group.

An ethylenic compound having an unreacted carboxyl group as in the case of the mixture described above may be used as it is, but, if desired, a non-aromatic carboxylic anhydride may be reacted with a hydroxy group of the ethylenic compound to introduce an acid group. In this case, specific examples of the non-aromatic carboxylic anhydride include tetrahydrophthalic anhydride, an alkylated tetrahydrophthalic anhydride, hexahydrophthalic anhydride, an alkylated hexahydrophthalic anhydride, succinic anhydride and maleic anhydride.

In the invention, the acid group-containing monomer is preferably a polyfunctional monomer which is an ester of an aliphatic polyhydroxy compound and an unsaturated carboxylic acid and obtained by reacting a non-aromatic carboxylic anhydride with an unreacted hydroxyl group of the aliphatic polyhydroxy compound to introduce the acid group, and particularly preferably the ester described above where the aliphatic polyhydroxy compound is pentaerythritol and/or dipentaerythritol. Examples of the commercial product thereof include polybasic acid-modified acryl oligomers M-510 and M-520 produced by Toagosei Co., Ltd.

One of the monomers may be used alone, but since it is difficult to use a single compound in view of production, two or more monomers may be used as a mixture. Also, as the monomer, a polyfunctional monomer having no acid group and an acid polyfunctional monomer having an acid group may be used in combination, if desired.

The acid value of the polyfunctional monomer having an acid group is preferably from 0.1 to 40 mg-KOH/g, and particularly preferably from 5 to 30 mg-KOH/g. In the case where two or more polyfunctional monomers having different acid values are used in combination or where a polyfunctional monomer having no acid group is used in combination, it is preferred to adjust the monomers such that the acid value as the total polyfunctional monomer falls within the range described above.

Also, it is a preferred embodiment as the polymerizable monomer to contain a polyfunctional monomer having a caprolactone structure.

The polyfunctional monomer having a caprolactone structure is not particularly restricted as long as it has a caprolactone structure in the molecule thereof, and includes, for example, an ε-caprolactone-modified polyfunctional (meth)acrylate obtained by esterification of a polyhydric alcohol, for example, trimethylolethane, ditrimethylolethane, trimethylolpropane, ditrimethylolpropane, pentaerythritol, dipentaerythritol, tripentaerythritol, glycerol, diglycerol or trimethylolamine with (meth)acrylic acid and ε-caprolactone. Among them, a polyfunctional monomer having a caprolactone structure represented by formula (Z-1) shown below is preferred.

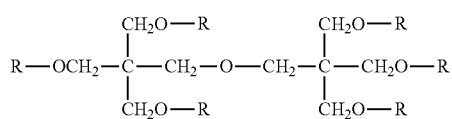
(Z-1)

In formula (Z-1), all of six Rs are groups represented by formula (Z-2) shown below, or one to five of six Rs are groups represented by formula (Z-2) shown below and the reminder is a group represented by formula (Z-3) shown below.

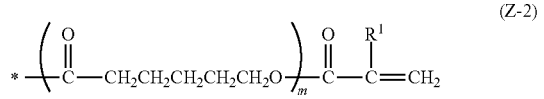
(Z-2)

In formula (Z-2), $R^1$ represents a hydrogen atom or a methyl group, m represents a number of 1 or 2, and * represents a connecting portion.

(Z-3)

In formula (Z-3), $R^1$ represents a hydrogen atom or a methyl group and * represents a connecting portion.

The polyfunctional monomer having a caprolactone structure is commercially available as KAYARAD DPCA Series from Nippon Kayaku Co., Ltd. and includes DPCA-20 (compound represented by formulae (Z-1) to (Z-3), wherein m is 1, a number of the group represented by formula (Z-2) is 2, and all of $R^1$ are hydrogen atoms), DPCA-30 (compound represented by formulae (Z-1) to (Z-3), wherein m is 1, a number of the group represented by formula (Z-2) is 3, and all of $R^1$ are hydrogen atoms), DPCA-60 (compound represented by formulae (Z-1) to (Z-3), wherein m is 1, a number of the group represented by formula (Z-2) is 6, and all of $R^1$ are hydrogen atoms) and DPCA-120 (compound represented by formulae (Z-1) to (Z-3), wherein m is 2, a number of the group represented by formula (Z-2) is 6, and all of $R^1$ are hydrogen atoms).

The polyfunctional monomers having a caprolactone structure may be used individually or as a mixture of two or more thereof in the invention.

It is also preferred that the polymerizable compound for use in the invention is at least one compound selected from the group consisting of compounds represented by formulae (Z-4) and (Z-5).

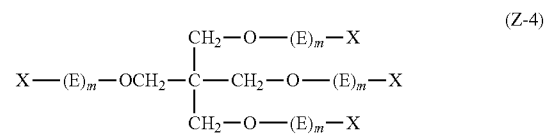
(Z-4)

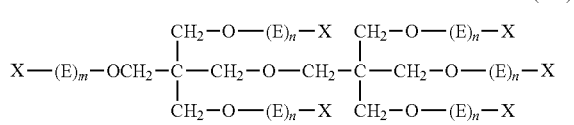
(Z-5)

In formulae (Z-4) and (Z-5), E each independently represents —((CH$_2$)$_y$CH$_2$O)— or —((CH$_2$)$_y$CH(CH$_3$)O)—, y each independently represents an integer from 0 to 10, and X each independently represents an acryloyl group, a methacryloyl group, a hydrogen atom or a carboxyl group.

In formula (Z-4), the total number of acryloyl groups and methacryloyl groups is 3 or 4, m each independently represents an integer from 0 to 10, and the total of each m is an integer from 0 to 40, provided that when the total of each m is 0, any one of Xs is a carboxyl group.

In formula (Z-5), the total number of acryloyl groups and methacryloyl group is 5 or 6, n each independently represents an integer from 0 to 10, and the total of each n is an integer from 0 to 60, provided that when the total of each n is 0, any one of Xs is a carboxyl group.

In formula (Z-4), m is preferably an integer from 0 to 6, and more preferably an integer from 0 to 4.

The total of each m is preferably an integer from 2 to 40, more preferably an integer from 2 to 16, and particularly preferably an integer from 4 to 8.

In formula (Z-5), n is preferably an integer from 0 to 6, more preferably an integer from 0 to 4.

The total of each n is preferably an integer from 3 to 60, more preferably an integer from 3 to 24, and particularly preferably an integer from 6 to 12.

In a preferred embodiment of —((CH$_2$)$_y$CH$_2$O)— or —((CH$_2$)$_y$CH(CH$_3$)O)— in formula (Z-4) or (Z-5), the terminal on the oxygen atom side is connected to X.

The compounds represented by formulae (Z-4) and (Z-5) may be used individually or in combination of two or more thereof. In particular, an embodiment where all of six Xs in formula (Z-5) are an acryloyl group is preferred.

The total content of the compound represented by formula (Z-4) or (Z-5) in the polymerizable compound is preferably 20% by weight or more, and more preferably 50% by weight or more.

The compound represented by formula (Z-4) or (Z-5) can be synthesized through a process of connecting a ring-opened skeleton of ethylene oxide or propylene oxide to pentaerythritol or dipentaerythritol by a ring-opening addition reaction, and a process of introducing a (meth)acryloyl group into the terminal hydroxyl group of the ring-opened skeleton by reacting, for example, (meth)acryloyl chloride, which are conventionally known steps. Each process is a well-known process and the compound represented by formula (Z-4) or (Z-5) can be easily synthesized by a person skilled in the art.

Of the compounds represented by formulae (Z-4) and (Z-5), a pentaerythritol derivative and/or a dipentaerythritol derivative are more preferred.

Specific examples of the compounds include compounds represented by formulae (a) to (f) shown below (hereinafter, also referred to as Compounds (a) to (f) sometimes), and Compounds (a), (b), (c) and (f) are preferred.

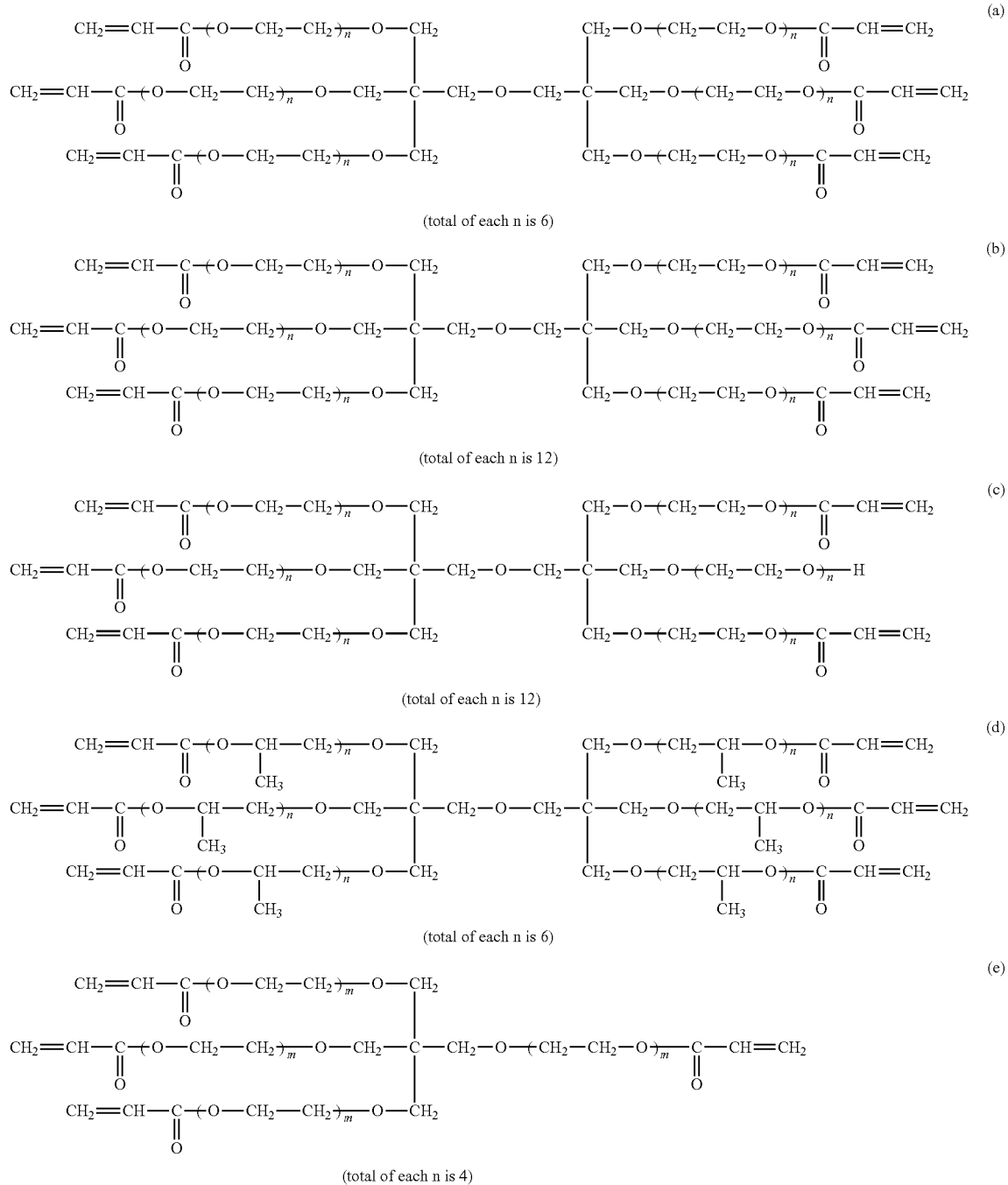

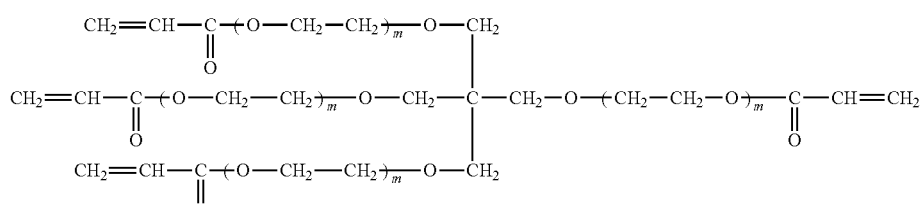

(f)

(total of each n is 12)

Examples of commercial product of the polymerizable compounds represented by formulae (Z-4) and (Z-5) include SR-494, which is a tetrafunctional acrylate having four ethyleneoxy chains, produced by Sartomer Company, and DPCA-60, which a hexafunctional acrylate having six pentyleneoxy chains and TPA-330, which is a trifunctional acrylate having three isobutyleneoxy chains, both produced by Nippon Kayaku Co., Ltd.

Furthermore, urethane acrylates as described in JP-B-48-41708, JP-A-51-37193, JP-B-2-32293 and JP-B-2-16765, and urethane compounds having an ethylene oxide skeleton described in JP-B-58-49860, JP-B-56-17654, JP-B-62-39417 and JP-B-62-39418 are also suitable as the polymerizable compound. In addition, by using as the polymerizable compound, an addition-polymerizable compound having an amino structure or a sulfide structure in the molecule thereof described in JP-A-63-277653, JP-A-63-260909 and JP-A-1-105238, a curable composition very excellent in photosensitive speed can be obtained.

Examples of commercial product of the polymerizable compound include urethane oligomers UAS-10 and UAB-140 (produced by Sanyo Kokusaku Pulp Co., Ltd.), UA-7200 (produced by Shin-Nakamura Chemical Co., Ltd.), DPHA-40H (produced by Nippon Kayaku Co., Ltd.). UA-306H, UA-306T, UA-306I, AH-600, T-600 and AI-600 (produced by Kyoeisha Chemical Co., Ltd.).

As to the polymerizable compound, details of the method of using thereof, for example, the structure thereof, individual or combination use or the amount thereof added can be appropriately determined in accordance with the final characteristic design of the colored composition. For example, from the standpoint of sensitivity, a structure having a large unsaturated group content per molecular is preferred, and in many cases, a difunctional or higher functional structure is preferred. From the standpoint of increasing the strength of colored cured film, a trifunctional or higher functional compound is preferred, a tetrafunctional or higher functional compound is more preferred, and a pentafunctional or higher functional compound is still more preferred. Further, a method of using compounds having different numbers of functional groups or different polymerizable groups (for example, an acrylate, a methacrylate, a styrene compound or a vinyl ether compound) in combination to control both the sensitivity and the strength is also effective. Moreover, a combination use of trifunctional or higher functional polymerizable compounds having different ethylene oxide chain length is preferred.

Furthermore, the selection and use method of the polymerizable compound are also important factors for the compatibility and dispersibility with other components (for example, a photopolymerization initiator, a coloring agent (pigment) or a binder polymer) contained in the colored composition. For example, the compatibility can be sometimes improved by using a low-purity compound or using two or more kinds of compounds in combination. Also, a specific structure may be selected for the purpose of improving the adhesion property to a hard surface of a support or the like.

The content of the polymerizable compound in the colored composition according to the invention is preferably from 0.1 to 90% by weight, more preferably from 1.0 to 80% by weight, particularly preferably from 2.0 to 70% by weight, based on the solid content of the colored composition.

(Surfactant)

To the colored composition according to the invention may be added various surfactants from the standpoint of improving a coating property. As the surfactant, various surfactants, for example, a fluorine-base surfactant, a nonionic surfactant, a cationic surfactant, an anionic surfactant and a silicone-based surfactant can be used.

In particular, when the colored composition according to the invention contains a fluorine-based surfactant, liquid characteristic (particularly, fluidity) of a coating solution prepared is more enhanced so that uniformity of the coating thickness or liquid saving property can be more improved.

Specifically, in the case of forming a film by using a coating solution prepared from the colored composition containing a fluorine-based surfactant, the interface tension between the surface in be coated and the coating solution is reduced, whereby wettability to the surface to be coated is improved and the coating property on the surface to be coated is enhanced. This is effective in that even when a thin film of about several μm is formed with a small liquid volume, a film less suffering thickness unevenness and having a uniform thickness can be more suitably performed.

The fluorine content in the fluorine-based surfactant is preferably from 3 to 40% by weight, more preferably from 5 to 30% by weight, and particularly preferably from 7 to 25% by weight. The fluorine-based surfactant having the fluorine content in the range described above is effective in view of the uniformity of the coating film thickness and the liquid saving property and the solubility thereof in the colored composition is good.

Examples of the fluorine-basal surfactant include MEGAFAC F171, MEGAFAC F172, MEGAFAC P173, MEGAFAC F176, MEGAFAC F177, MEGAFAC F141, MEGAFAC F142, MEGAFAC P143, MEGAFAC F144, MEGAFAC R30, MEGAFAC F437, MEGAFAC F475, MEGAFAC F479, MEGAFAC F482, MEGAFAC F554, MEGAFAC F780 and MEGAFAC F781 (all produced by DIC Corp.), FLUORAD FC430, FLUORAD FC431 and FLUORAD FC171 (all produced by Sumitomo 3M Ltd.), SURFLON S-382, SURFLON SC-101, SURFLON SC-103, SURFLON SC-104, SURFLON SC-105, SURFLON SC-1068, SURFLON SC-381, SURFLON SC-383, SURFLON S393 and SURFLON KH-40 (all produced by Asahi Glass Co., Ltd.).

Specific examples of the nonionic surfactant include glycerol, trimethylolpropane, trimethylolethane, ethoxylate and propoxylate thereof (for example, glycerol propoxylate or glycerol ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate and a sorbitan fatty add ester (for example, PLURONIC L10, L31, L61, L62, 10R5, 17R2 and 25R2, TETRONIC 304, 701, 704, 901, 904 and 150R1 (all produced by BASF) or SOLSPERSE 20000 (produced by Lubrizol Japan Ltd.)).

Specific examples of the cationic surfactant include a phthalocyanine derivative (EFKA-745, produced by Morishita & Co., Ltd.), organosiloxane polymer KP341 (produced by Skin-Etsu Chemical Co., Ltd.), (meth)acrylic acid (co)polymer (POLYFLOW No. 75, No. 90 and No. 95 (produced by Kyoeisha Chemical Co., Ltd.), and W001 (produced by Yusho Co., Ltd.).

Specific examples of the anionic surfactant include W004, W005 and W017 (all produced by Yusho Co., Ltd.).

Examples of the silicone-based surfactant include TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA and TORAY SILICONE SH8400 (all produced by Dow Corning Toray Silicone Co., Ltd.) TSF-4440, TSF-4300, TSF-4445, TSF-4460 and TSF-4452 (all produced by Momentive Performance Materials Inc.), KP341, KF6001 and KF6002 (all produced by Shin-Etsu Silicone Co., Ltd.), and BYK307, BYK323 and BYK330 (produced by Byk Chemie).

The surfactants may be used individually or in combination of two or more thereof.

The colored composition may or may not contain the surfactant and in the case of containing the surfactant, the amount added thereof is preferably from 0.001 to 2.0% by weight, more preferably from 0.005 to 1.0% by weight, based on the total weight of the colored composition.

(Curing Agent)

In the case where an epoxy resin is used as the curable compound, a curing agent is preferably added. A curing agent for epoxy resin has a wide variety and since property, usable time of a mixture of the resin and curing agent, viscosity, curing temperature, curing time, heat generation and the like are widely varied depending on the kind of the curing agent to be used, it is required to select an appropriate curing agent depending on the intended use, conditions for use and working conditions of the curing agent. With respect to the curing agent, detailed explanations are made in Hiroshi Kakiuchi ed., *Epoxy Jushi* (*Epoxy Resin*), Chapter 5 (Shoukoudo). Examples of the curing agent are shown below.

Examples of the curing agent acting catalytically include a tertiary amine and a boron trifluoride-amine complex; examples of the curing agent acting reacting stoichiometrically with a functional group of the epoxy resin include a polyamine and an acid anhydride; examples of the curing agent of normal temperature curing type include diethylenetriamine and a polyamide resin, examples of the curing agent of medium temperature curing type include diethylaminopropylamine and tris(dimethylaminomethyl)phenol; and examples of the curing agent of high temperature curing type include phthalic anhydride and meta-phenylenediamine. According to classification based on the chemical structure, with respect to an amine, examples of an aliphatic polyamine include diethylenetriamine; examples of an aromatic polyamine include meta-phenylenediamine; examples of a tertiary amine include tris(dimethylaminomethyl)phenol; examples of an acid anhydride include phthalic anhydride, a polyamide resin, a polysulfide resin and boron trifluoride-monoethylamine complex; examples of a synthetic resin precondensate include a phenolic resin; and examples of others include dicyandiamide.

The curing agent is reacted with an epoxy group by heating and polymerized to increase in crosslink density, thereby curing. Both the binder and the curing agent are preferably used in amounts as small as possible for the purpose of achieving the reduction in thickness, and particularly, with respect to the curing agent the amount thereof is 35% by weight or less, preferably 30% by weight or less, still more preferably 25% by weight or less, to the heat curable compound.

(Curing Catalyst)

In order to realize the composition having a high concentration of coloring agent, in addition to the curing by the reaction with the curing agent, curing by reaction of the epoxy groups mainly with each other is effective. Thus, a curing catalyst may be used without using the curing agent. With respect to the amount of the curing catalyst added, it is possible to cure by a slight amount as approximately from $1/10$ to $1/1,000$, preferably approximately from $1/20$ to $1/500$, more preferably approximately from $1/30$ to $1/250$, on a weight basis of an epoxy resin having epoxy equivalent of approximately from 150 to 200.

(Polymerization Inhibitor)

To the colored composition according to the invention, a small amount of a polymerization inhibitor is preferably added in order to inhibit unnecessary thermal polymerization of the polymerizable compound during production or preservation of the colored composition.

Examples of the polymerization inhibitor which can be used in the invention include hydroquinone, p-methoxyphenol, di-tert-butyl-p-cresol, pyrogallol, tert-butylcatechol, benzoquinone, 4,4'-thiobis(3-methyl-6-tert-butyl phenol), 2,2'-methylenebis(1-methyl-6-tert-butylphenol) and N-nitrosophenylhydroxyamine cerous salt.

The amount of the polymerization inhibitor added is preferably from about 0.01 to about 5% by weight based on the weight of the total composition.

(Silane Coupling Agent)

In the colored composition according to the invention, a slime coupling agent may be used from the standpoint of further improving an adhesion property to a substrate.

The silane coupling agent preferably has an alkoxy group as a hydrolyzable group capable of forming a chemical bond with an inorganic material. It is also preferred to have a group existing affinity to an organic resin by interaction or bond formation and such an group preferably includes a group having a (meth)acryloyl group, a phenyl group, a mercapto group, a glycidyl group or an oxetanyl group, and a group having a (meth)acryloyl group or a glycidyl group is more preferred.

Specifically, the silane coupling agent for use in the invention is preferably a compound having an alkoxysilyl group and a (meth)acryloyl group or a glycidyl group. Specific examples thereof include a (meth)acryloyl-trimethoxysilane compound and a glycidyl-trimethoxysilane compound having structures shown below.

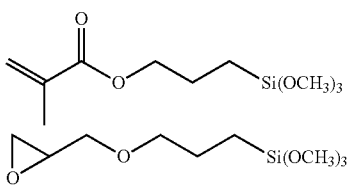

The silane coupling agent for use in the invention is also preferably a compound having at least two functional groups having different reactivities per molecule and particularly, a compound having as the functional group, an amino group and an alkoxy group is preferred. Such an silane coupling agent includes, for example, N-β-aminoethyl-γ-aminopropylmethyldimethoxysilane (KBM-602, trade name, produced by Shin-Etsu Chemical Co., Ltd.), N-β-aminoethyl-γ-aminopropyltrimethoxysilane (KBM-603, trade name, produced by Shin-Etsu Chemical Co., Ltd.), N-β-aminoethyl-γ-aminopropyltriethoxysilane (KBE-602, trade name, produced by Shirt-Etsu Chemical Co., Ltd.). γ-aminopropyltrimethoxysilane (KW-903, trade name, produced by Shin-Etsu Chemical Co., Ltd.) and γ-aminopropyltriethoxysilane (KBE-903, trade name, produced by Shin-Etsu Chemical Co., Ltd.).

In the case of using the silane coupling agent, the amount of the silane coupling agent added is preferably from 0.1 to 5.0% by weight, more preferably from 0.2 to 3.0% by weight, based on the total solid content of the colored composition according to the invention.

As described above, the colored composition for forming a green color filter according to the invention exhibits that a layer having a thickness of 0.6 μm formed from the colored composition has light transmittance of 80% or more at a wavelength of 550 nm and light transmittance of 50% or less at a wavelength of 450 nm.

The physical property that a layer having a thickness of 0.6 μm formed from the colored composition has light transmittance of 80% or more at a wavelength of 550 nm and light transmittance of 50% or less at a wavelength of 450 nm may be achieved by any means, but the dominant factor to the physical property is the content of the color pigment. Thus, the physical property is suitably achieved by adjusting the content of the color pigment to 60% by weight or more to the total solid content of the colored composition and, if desired, by finely regulating the kind of the color pigment and the kinds and contents of the components other than the color pigment. In particular, the physical property relating to the light transmittance described above can be more easily achieved by controlling the contents of the components other than the color pigment in the colored composition to the preferred ranges of the contents described above.

<Method of Preparing Colored Composition>

A preferred method of preparing a colored composition according to the invention will be described, but the invention should not be construed as being limited thereto.

For the colored composition according to the invention, a method of using pigment, as color pigment, which is microparticulated and has a sharp particle size distribution is suitable. Specifically, a method of using pigment comprising 75% by weight or more of pigment particles having an average particle size of approximately 0.01 μm and a particle size within a range of 0.01±0.005 μm is preferred. In order to adjust the particle size distribution of pigment to the range described above, a method of dispersing pigment is particularly important. Such a dispersing method includes, for example, a dispersing method where dry-type dispersion (kneading dispersion treatment) in which dispersion is conducted in a high viscosity state using a kneader or a roll mill, for example, a double roll and wet-type dispersion (fine dispersion treatment) in which dispersion is conducted in a relatively low viscosity state using, for example, a triple roll or a bead mill are used in combination. In the dispersing method described above, it is also preferred to disperse two or more kinds of pigments together, not to use a solvent or to use a solvent in an amount as small as possible in the kneading dispersion treatment or to use various dispersing agents. Further, in order to prevent solvent shock it is preferred to add the resin component dividedly to the kneading dispersion treatment and the line dispersion treatment (two-divided use), or in order to prevent re-aggregation of pigment particles at the transfer from the kneading dispersion treatment to the fine dispersion treatment it is preferred to use a resin component excellent in the solubility. Moreover, means of using ceramics having high hardness or means of using beads having a small particle size, as beads for the bead mill employed in the fine dispersion treatment are also effective.

In particular, in the case of using an epoxy compound as the heat curable compound, the colored composition according to the invention is preferably prepared by adding the heat curable compound and the curing catalyst or curing agent to the dispersion of pigment or solution of dye obtained as above, or when the binder used is the heat curable compound, adding the curing catalyst or curing agent to the dispersion of pigment or solution of dye obtained as above to impart the heat curable function, and if desired, adding a solvent.

<Filter Filtration>

The colored composition according to the invention is preferably filtered through a filter for the purpose of removing foreign substances or reducing defects.

As a filler for use in the filter filtration, a fitter conventionally used for filtration use or the like can be used without particular restriction.

Examples of material of the filter include a fluorine resin, for example, PTFE (polytetrafluoroethylene), a polyamide resin, for example, nylon-6 or nylon 6,6, and a polyolefin resin (including high-density polyolefin and ultrahigh-molecular weight polyolefin), for example, polyethylene or polypropylene (PP). Of the materials, polypropylene (including high-density polypropylene) is preferred.

A pore size of the filter is not particularly restricted and is, for example, approximately from 0.01 to 20.0 mμ, preferably approximately from 0.01 to 5 mμ, and more preferably approximately from 0.01 to 2.0 mμ.

By adjusting the pore size of filter in the range described above, fine particles can be more effectively removed and turbidity can be more reduced.

With respect to the pore size of filter, the nominal values of the filter makers can be referred to. As to the commercially available filter, the filter may be selected from various kinds of filters offered, for example, from Japan Pall Co., Ltd., Advantec Toyo Co., Ltd., Nihon Entegris K. K. (the former Nihon Mykrolis Ltd.) or Kitz Micro Filter Corp.

In the filter filtration, two or more filters may be used in combination.

For example, the filtration is initially conducted using a first filter and then the filtration is conducted using a second filter having a pore size different from that of the first filter.

The filtering with the first filter and filtering with the second filter may be conducted only one time or two or more times, respectively.

As the second filter, a filter formed of the same material or the like as the first filter may be used.

<Color Filter and Method of Producing Thereof>

In the color filter according to the invention, of the patterns which constitutes the color filter, at least one kind of the patterns is a colored pattern formed from the colored composition according to the invention described above. The color filter according to the invention is not particularly restricted as long as at least one kind of the patterns is a colored pattern formed from the colored composition according to the invention described above and is preferably produced according to the method of producing a color filter according to the invention described below.

In the method of producing a color filter according to the invention, a first colored layer is formed using the colored composition (also referred to as a first colored composition) according to the invention described above.

Since the first colored layer is formed from the colored composition according to the invention, it is the green color layer highly excellent in color separation as described above.

Further, in the case of forming a green pixel according to a step of conducting dry etching on the first colored layer as described hereinafter, a difference between the spectral characteristic of the green color layer and the spectral characteristic of the green color pixel is small and the excellent color separation characteristic expressed by the green color layer can be surely passed to the green color pixel. As a result, the performance of color filter finally obtained can be made excellent.

In particular, it is effective for producing a color filter for a solid-state imaging device in which a minute size, for example, of 0.7 µm or less in thickness and/or 2 µm or less (for example, from 0.5 to 2.0 µm) in pixel pattern size (length of one side of a square pattern) is required.

With respect to the solid-state imaging device, one example is briefly described with reference to FIG. 1.

As shown in FIG. 1, a solid-state imaging device 10 is composed of a photo detector (photo diode) 42 provided on a silicon substrate, a color filter 13, a planarizing film 14, a microlens 14 and the like. According to the invention, the planarization film 14 is not always necessarily provided. In FIG. 1, in order to clarify each of the parts, the ratio between the thickness and width is disregarded and partly exaggerated.

As a support, in addition to the silicon substrate, any support used for a color filter may be employed without particular restriction. For instance, soda glass, borosilicate glass and quartz glass and those obtained by attaching a transparent conductive film thereto used for a liquid crystal display element or the like and a photoelectric conversion element substrate, for example, an oxidized film, silicon nitride used for a solid-state imaging device or the like are exemplified. Also, an intermediate layer or the like may be provided between the support and the color filter 13 as long as the advantage of the invention is not impaired.

On the silicon substrate is formed a P well 41 and the P well has a photodiode 42 in a portion of the surface thereof. The photodiode 42 is formed by ion-implantation of n-type impurity, for example, P or As and then conducting a heat treatment. Also, an impurity diffusion layer 43 having an n-type impurity concentration which is higher than that of the photodiode 42 is formed in a region of the surface of the P well 41 of silicon substrate which is different from the portion described above. The impurity diffusion layer 43 is formed by ion-implantation of n-type impurity, for example, P or As and then conducting a heat treatment and plays a role of a floating diffusion layer for transferring charges generated upon receiving incident light by the photodiode 42. In addition to use the composition wherein the well 41 functions as a p-type impurity layer and the photodiode 42 and the impurity diffusion layer 43 function as n-type impurity layers, a composition wherein the well 41 functions as an n-type impurity layer and the photodiode 42 and the impurity diffusion layer 43 function as p-type impurity layers can also be practiced.

On the P well 41, the photodiode 42 and the impurity diffusion layer 43, an insulating film 47 composed, for example, of $SiO_2$ or $SiO_2/SiN/SiO_2$ is formed. On the insulating film 47, an electrode 44 composed, for example, of poly Si, tungsten, tungsten silicide, Al or Cu is provided. The electrode 44 plays a role of a gate of a gate MOS transistor and can play a role of a transfer gate for transferring the charges generated in the photodiode 42 to the impurity diffusion layer 43. Above the electrode 44, further, a wiring layer 45 is formed. Above the wiring layer 45, further, a BPSG film 46 and P—SiN film 48 are formed. An interface between the BPSG film 46 and the P—SiN film 48 is formed in the form of curving downward above the photodiode 42, and plays a role of an interlayer lens for efficiently guiding incident light to the photodiode 42. On the BPSG film 46 is formed a planarizing layer 49 for the purpose of planarizing the surface of the P—SiN film 48 and irregular portions other than the pixel area.

On the planarizing layer 49 is formed a color filter 13. In the description below, a colored film formed on a silicon, substrate without partitioning areas (a so-called solid film) is referred to as a "colored (colored radiation-sensitive) layer" and a colored film formed with partitioning areas into a pattern (for example, a film patterned in a stripe shape) is referred to as a "colored pattern". Also, of the colored patterns, a colored pattern (for example, a colored pattern patterned in a square shape or a rectangle shape) which is an element constituting the color filter 13 is referred to as a "colored (red color, green color or blue color) pixel".

The color filter 13 is constituted from a plurality of green color pixels (first colored pixels) 20G, red color pixels (second colored pixels) 20R and blue color pixels (third colored pixels) 20B two-dimensionally arrayed. The colored pixel 20R, 20G and 20B are formed at the position above the photo detectors 42, respectively. The green color pixel 20G is formed in a checkered pattern and the blue color pixel 20B and the red color pixel 20R are formed between the respective green color pixels 20G. In FIG. 1, for the purpose of explaining that the color filter 13 is constituted from the three color pixels, the colored pixel 20R, 20G and 20B are arranged in a row.

The planarizing film 14 is formed so as to cover above the color filter 13 to planarize a surface of the color filter. In the case where the planarization treatment is conducted at the final stage of the production method of a color filter, the planarizing film is not always necessary.

The microlens 15 is a condenser lens arranged so as to direct the convex surface thereof upward and is provided above the planarizing film 14 (or color filter when the planarizing film is not formed) and the photo detectors 42. Each of the microlenses 15 efficiently guides light from the object to each of the photo detectors 42.

Now, methods of producing a color filter according to the first to fifth embodiments of the invention are described.

Figure 2:
FIG. 2 is a schematic cross-sectional view of a first colored layer.

In the method of producing a color filter according to the first embodiment of the invention, first of all, a first colored layer 11 is formed (step (A)) with a first colored composition as shown in the schematic cross-sectional view of FIG. 2. The first colored composition used is the colored composition for forming a green color filter according to the invention described hereinbefore. Therefore, the first colored layer 11 is a green color transmission layer.

The formation of the first colored layer 11 is conducted by coating the colored composition on a support by a coating method, for example, a spin coating method, a slit coating method or a spray coating method and drying to form a colored layer.

The thickness of the first colored layer 11 is preferably in a range from 0.3 to 1 μm, more preferably in a range from 0.35 to 0.8 μm, and still more preferably in a range from 0.35 to 0.7 μm.

In the case where the first colored composition contains a curable compound, it is preferred that the first colored layer 11 is heated to be cured by a heating device, for example, a hot plate or an oven. The heating temperature is preferably from 120 to 250° C., and more preferably from 160 to 230° C. Although the heating time may be varied depending on the heating means, in case of heating on a hot plate, it is ordinarily approximately from 3 to 30 minutes and in case of heating in an oven, it is ordinarily approximately from 30 to 90 minutes.

Then, the first colored layer 11 is subjected to patterning with dry etching so as to form a through-hole group (step (B)). Thus, a first colored pattern is formed. According to this method, the through-hole group having the desired configuration is more steadily formed in comparison with a case where a first colored layer is formed with the colored radiation-sensitive composition and the first colored layer is exposed and developed to provide a through-hole group. This is because that in a colored radiation-sensitive composition in which a content of the coloring agent is 60% by weight or more based on the total solid content of the composition, the space for adding components contributing to the developing ability is limited to result in difficulty in the steady patterning.

The first colored pattern may be a colored pattern, provided on a support as a first color or a colored pattern provided on a support having a previously provided pattern, as a pattern, for example, a second colored pattern or a third or more order colored pattern.

Figure 3:
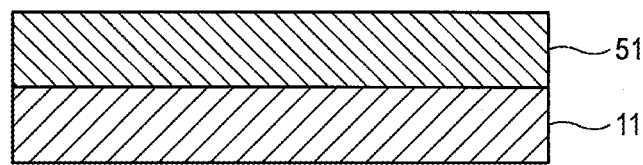
FIG. 3 is a schematic cross-sectional view showing a state in which a photoresist layer is formed on the first colored layer.

The dry etching of the first colored layer 11 is conducted with etching gas using a patterned photoresist layer as a mask. For example, as shown in the schematic cross-sectional view of FIG. 3, a photoresist layer 51 is first formed on the first colored layer 11.

Specifically, a positive or negative radiation-sensitive composition is coated on the colored layer and dried to from a photoresist layer. In the formation of the photoresist layer 51, it is preferred to further conduct a prebake treatment. In particular, as a process for forming a photoresist, a configuration in which a heat treatment after exposure (PEB) or a heat treatment after development (postbake treatment) is conducted is desirable.

As the photoresist, for example, a positive radiation-sensitive composition is used. As the positive radiation-sensitive composition, a positive resist composition suitable for a positive photoresist, which responds to radiation, for example, an ultraviolet ray (g-ray, h-ray or i-ray), a far ultraviolet ray including an excimer laser or the like, an electron beam, an ion beam or an X-ray, is used. Of the radiations, g-ray, h-ray or i-ray is preferred and i-ray is more preferred for the exposure.

Specifically, as the positive radiation-sensitive composition, a composition containing a quinonediazide compound and an alkali-soluble resin is preferred. The positive radiation-sensitive composition containing a quinonediazide compound and an alkali-soluble resin utilizes that a quinonediazide group is decomposed into a carboxyl group by light irradiation with a wavelength of 500 nm or less and as a result, the quinonediazide compound is shifted from an alkali-insoluble state to an alkali-soluble state. Since this positive photoresist is remarkably excellent in the resolving power, it is used for producing an integrated circuit, for example, IC or LSI. Examples of the quinonediazide compound include a naphthoquinonediazide compound.

The thickness of the photoresist layer 51 is preferably from 0.1 to 3 μm, more preferably from 0.2 to 2.5 μm, and still more preferably from 0.3 to 2 μm. The coating of the photoresist layer 51 is suitably conducted using the coating method described with respect to the first colored layer 11.

Figure 4:
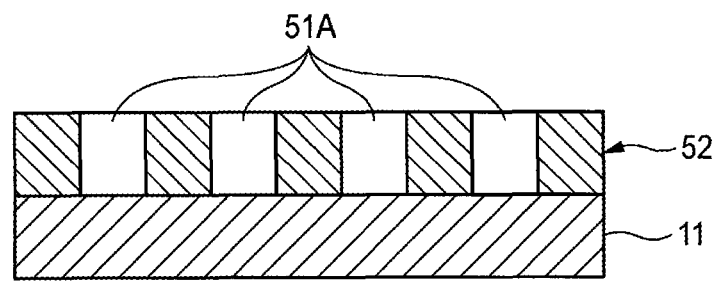
FIG. 4 is a schematic cross-sectional view showing a state in which a resist pattern is formed on the first colored layer.

Then, as shown in the schematic cross-sectional view of FIG. 4, a resist pattern (patterned photoresist layer) 52 provided with a resist through-hole group 51A is formed by exposure and development of the photoresist layer 51.

The formation of the resist pattern 52 is not particularly restricted and on be conducted by appropriately optimizing heretofore known techniques of photolithography. By providing the resist through-hole group 51A in the photoresist layer 51 by exposure and development, the resist pattern 52 which is used as a etching mask in a subsequent etching process is provided on the first colored layer 11.

The exposure of the photoresist layer 51 can be conducted by exposing a positive or negative radiation-sensitive composition to g-ray, h-ray or i-ray, preferably to i-ray through a predetermined mask pattern. After the exposure, development processing is conducted using a developer to remove the photoresist corresponding to the region where a colored pattern is to be formed.

As the developer, any developer which does not affect the first colored layer containing a coloring agent and dissolves the exposed area of the positive resist or the uncured area of the negative resist may be used and, for example, a combination of various organic solvent or an aqueous alkaline solution is used. As the aqueous alkaline solution, an aqueous alkaline solution prepared by dissolving an alkaline compound so as to have concentration from 0.001 to 10% by weight, and preferably from 0.01 to 5% by weight is suitable. Examples of the alkaline compound include sodium hydroxide, potassium hydroxide, sodium carbonate, sodium silicate, sodium metasilicate, aqueous ammonia, ethylamine, diethylamine, dimethylethanolamine, tetramethylammonium hydroxide, tetraethylammonium hydroxide, choline, pyrrole, piperidine and 1,8-diazabicyclo-[5.4.0]-7-undecene. When an aqueous alkaline solution is used as the developer, a washing treatment with water is ordinarily conducted after the development.

Figure 5:
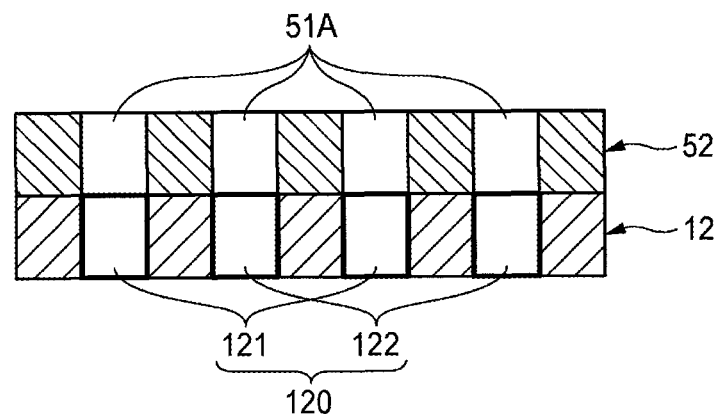
FIG. 5 is a schematic cross-sectional view showing a state in which a first colored pattern is formed by providing a through-hole group in the first colored layer with etching.

Then, as shown in the schematic cross-sectional view of FIG. 5, the first colored layer 11 is subjected to patterning with dry etching so as to form a through-hole group 120 in the first colored layer 11 using the resist pattern 52 as an etching mask. Thus, a first colored pattern 12 is formed. The through-hole group 120 has a first through-hole portion group 121 and a second through-hole portion group 122.

The through-hole group 120 is provided checkerwise in the first colored layer. Thus, the first colored pattern 12 composed of the through-hole group 120 provided in the first colored layer 11 has checkerwise plural quadrangular first colored pixels.

Specifically, the dry etching is conducted by dry etching the first colored layer 11 using the resist pattern 52 as an etching mask. Representative examples of the city etching include methods described in JP-A-59-126506, JP-A-59-46628, JP-A-58-9108, JP-A-58-2809, JP-A-57-148706 and JP-A-61-41102.

The dry etching is preferably conducted in a configuration described below from the standpoint of forming a pattern cross-section closer to that of a rectangle and further reducing damage to a support.

The configuration is preferred which includes a first stage etching of etching up to an area (depth) where the support is not revealed by using mixed gas of fluorine-based gas and oxygen gas ($O_2$), a second stage etching of preferably etching up to the vicinity of an area (depth) where the support is revealed by using mixed gas of nitrogen gas (N) and oxygen gas ($O_2$) after the first stage etching, and an over-etching conducted after the support has been revealed. A specific manner of the dry etching as well as the first stage etching, the second stage etching and the over-etching are described below.

The dry etching is conducted with previously obtaining the etching conditions in the manner described below.
(1) An etching rate (nm/min) in the first stage etching and an etching rate (nm/min) in the second stage etching are calculated respectively.
(2) A time for etching a predetermined thickness in the first stage etching and a time for etching a predetermined thickness in the second stage etching are calculated respectively.
(3) The first stage etching is conducted according to the etching time calculated in (2) above.
(4) The second stage etching is conducted according to the etching time calculated in (2) above. Alternatively, an etching time is determined by endpoint detection, and the second stage etching may be conducted according to the etching time determined.
(5) The over-etching time is calculated in response to the total time of (3) and (4) above, and the over-etching is conducted according to the etching time determined.

The mixed gas used in the first stage etching step preferably contains fluorine-based gas and oxygen gas ($O_2$) from the standpoint of processing an organic material of the film to be etched into a rectangle shape. The first stage etching step may avoid damage to the support by adopting the configuration of etching up to an area where the support is not revealed.

After the etching is conducted up to an area where the support is not revealed by the mixed gas of fluorine-based gas and oxygen gas in the first stage etching step, etching treatment in the second stage etching step and etching treatment in the over-etching step is preferably conducted by using the mixed gas of nitrogen gas and oxygen gas from the standpoint of avoiding damage to the support.

It is important that a ratio between the etching amount in the first stage etching step and the etching amount in the second stage etching step is determined so as not to deteriorate the rectangularity by the etching treatment in the first stage etching step. The ratio of the etching amount in the second stage etching step in the total etching amount (the sum of the etching amount in the first stage etching step and the etching amount in the second stage etching step) is preferably in a range of more than 0% and 50% or less, and more preferably from 10 to 20%. The etching amount means an amount determined by the difference between a remaining film thickness of the film etched and a film thickness of the film before the etching.

Further, the etching preferably includes an over-etching treatment. The over-etching treatment is preferably conducted by determining an over-etching rate. The over-etching rate is preferably calculated from an etching treatment time which is conducted at first. Although the over-etching rate may be appropriately determined, it is preferably 30% or less, more preferably from 5 to 25%, particularly preferably from 10 to 15%, of the etching processing time in the etching steps from the standpoint of etching resistance of photoresist and preservation of the rectangularity of the etching pattern.

Figure 6:
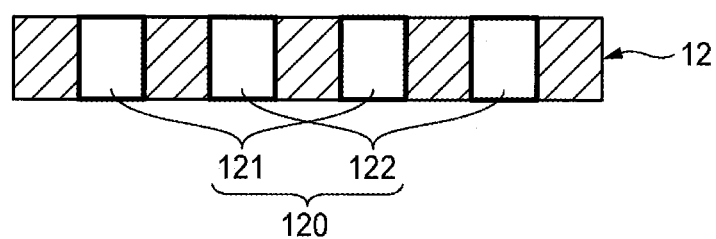
FIG. 6 is a schematic cross-sectional view showing a state in which the resist pattern in FIG. 5 is removed.

Then, as shown in the schematic cross-sectional view of FIG. 6, the resist pattern (that is, etching mask) 52 remaining after the etching is removed. The removal of the resist pattern 52 preferably includes a step of supplying a stripping solution or a solvent on the resist pattern 52 to make the resist pattern 52 a removable state, and a step of removing the resist pattern 52 using washing water.

The step of supplying a stripping solution or a solvent on the resist pattern 52 to make the resist pattern 52 a removable state includes, for example, a step of paddle development by supplying a stripping solution or a solvent at least on the resist pattern 52 and retaining for a predetermined time. The time for retaining the stripping solution or a solvent is net particularly restricted and is preferably from several tens of seconds to several minutes.

The step of removing the resist pattern 52 using washing water includes, for example, a step of removing the resist pattern 52 by spraying washing water from a spray nozzle of spray type or shower type onto the resist pattern 52. As the washing water, pure water is preferably used. The spray nozzle includes a spray nozzle a spray area of which covers entire the support and a mobile spray nozzle a mobile area of which covers entire the support. In the case where the spray nozzle is a mobile spray nozzle, the resist pattern 52 can be more effectively removed by moving the mobile spray nozzle twice or more from the center of support to the edge of the support to spray washing water in the step of removing the resist pattern 52.

The stripping solution ordinarily contains an organic solvent and may further contain an inorganic solvent. The organic solvent includes, for example, 1) a hydrocarbon compound, 2) a halogenated hydrocarbon compound, 3) an alcohol compound, 4) an ether or acetal compound, 5) a ketone or aldehyde compound, 6) an ester compound, 7) a polyhydric alcohol compound, 8) a carboxylic acid or an acid anhydride compound thereof, 9) a phenol compound, 10) a nitrogen-containing compound, 11) a sulfur-containing compound, and 12) a fluorine-containing compound. The stripping solution preferably contains a nitrogen-containing compound, and more preferably contains an acyclic nitrogen-containing compound and a cyclic nitrogen-containing compound.

The acyclic nitrogen-containing compound is preferably an acyclic nitrogen-containing compound having a hydroxy group. Specifically, for example, monoisopropanolamine, diisopropanolamine, triisopropanolamine, N-ethylethanolamine, N,N-dibutylethanolamine, N-butylethanolamine, monoethanolamine, diethanolamine or triethanolamine is exemplified, and monoethanolamine, diethanolamine or triethanolamine is preferred and monoethanolamine ($H_2NCH_2CH_2OH$) is more preferred. The cyclic nitrogen-containing compound includes, for example, isoquinoline, imidazole, N-ethylmorpholine, ϵ-caprolactam, quinoline, 1,3-dimethyl-2-imidazolidinone, α-picoline, α-picoline, γ-picoline, 2-pipecoline, 3-pipecoline, 4-pipecoline, piperazine, piperidine, pyrazine, pyridine, pyrrolidine, N-methyl-2-pyrrolidinone, N-phenyl morpholine, 2,4-lutidine and 2,6-lutidine. N-methyl-2-pyrrolidinone or N-ethyl morpholine is preferred and N-methyl-2-pyrrolidinone (NMP) is more preferred.

The stripping solution preferably contains both the acyclic nitrogen-containing compound and the cyclic nitrogen-containing compound, more preferably contains at least one selected from monoethanolamine, diethanolamine and triethanolamine as the acyclic nitrogen-containing compound and at least one selected from N-methyl-2-pyrrolidinone and N-ethyl morpholine as the cyclic nitrogen-containing compound, and still more preferably contains monoethanolamine and N-methyl-2-pyrrolidinone.

In the removal with the stripping solution, it is sufficient that the photoresist pattern 52 formed on the first colored pattern 12 is removed, and in a case where a deposit of an etching product is attached to the side wall of the first colored pattern 12, the deposit is not always necessary to be completely removed. The deposit means an etching product attached and deposited to the side wall of colored layer.

It is preferred that the content of the acyclic nitrogen-containing compound is from 9 to 11 parts by weight based on 100 parts by eight of the snipping solution, and the content of the cyclic nitrogen-containing compound is from 65 to 70 parts by weight based on 100 parts by weight of the stripping solution. The stripping solution is preferably that prepared by diluting a mixture of the acyclic nitrogen-containing compound and the cyclic nitrogen-containing compound with pure water.

Figure 7:
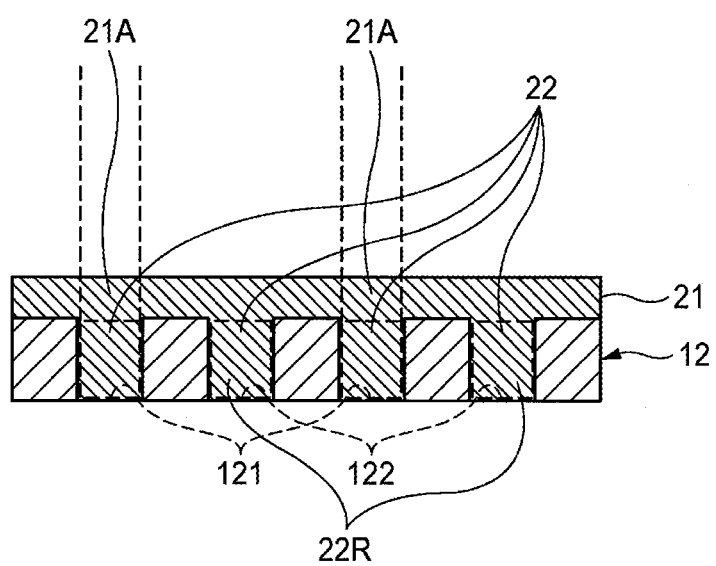
FIG. 7 is a schematic cross-sectional view showing a state in which a second colored pattern and a second colored radiation-sensitive layer are formed.

Then, as shown in the schematic cross-sectional view of FIG. 7, a second colored radiation-sensitive layer 21 is stacked using a second colored radiation-sensitive composition on the first colored layer (that is, the first colored pattern 12 having a through-hole group 120 formed in the first colored layer 11) so as that an inside of each through-hole of the first through-hole part group 121 and second through-hole part group 122 is filled with the second colored radiation-sensitive composition to form a plurality of second colored pixels (step (C)). Thus, a second colored pattern 22 having the plurality of second colored pixels is formed in the through-hole group 120 in the first colored layer 11. The second colored pixel is a pixel having a square shape. The formation of the second colored radiation-sensitive layer 21 can be carried out in the same manner as in the method of forming the first colored layer 11 described above.

The thickness of the second colored radiation-sensitive layer 21 is preferably in a range from 0.3 to 1 μm, more preferably in a range from 0.35 to 0.8 μm, and still more preferably in a range front 0.35 to 0.7 μm.

Figure 8:
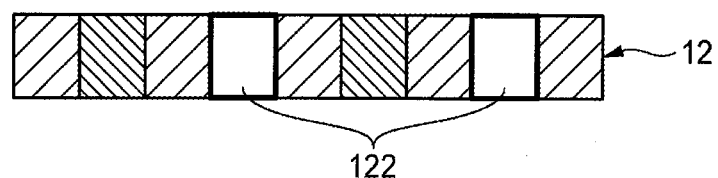
FIG. 8 is a schematic cross-sectional view showing a state in which the second colored radiation-sensitive layer and a part of a second colored pixel constituting the second colored pattern in FIG. 7 are removed.

Then, the second colored radiation-sensitive layer 21 and the plurality of second colored pixels 22R formed in the inside of each through-hole of the second through-hole part group 122 are removed by exposing and developing a position 21A of the second colored radiation-sensitive layer 21 corresponding to the first through-hole part group 121 provided in the first colored layer 11 (step (D)) (see the schematic cross-sectional view of FIG. 8.).

Figure 9:
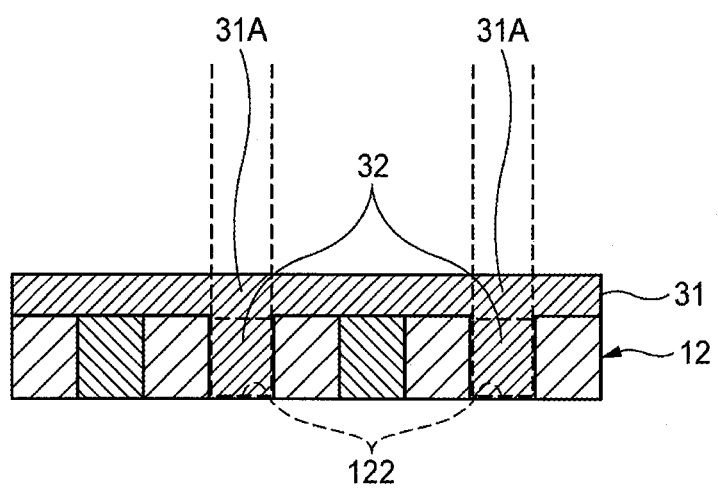
FIG. 9 is a schematic cross-sectional view showing a state in which a third colored pattern and a third colored radiation-sensitive layer are formed.

Then, as shown in the schematic cross-sectional view of FIG. 9, a third colored radiation-sensitive layer 31 is formed using a third colored radiation-sensitive composition on the first colored layer (that is, the first colored pattern 12 having the second colored pattern 22 formed in the first through-hole part group 121) so as that an inside of each through-hole of the second through-hole part group 122 is filled with the third colored radiation-sensitive composition to form a plurality of third colored pixels (step (E)). Thus, a third colored pattern 32 having the plurality of third colored pixels is formed in the second through-hole part group 122 in the first colored layer 11. The third colored pixel is a pixel having a square shape. The formation of the third colored radiation-sensitive layer 31 can be carried out in the same manner as in the method of forming the first colored layer 11 described above.

The thickness of the third colored radiation-sensitive layer 21 is preferably in a range from 0.3 to 1 μm, more preferably in a range from 0.35 to 0.8 μm, and still more preferably in a range from 0.35 to 0.7 μm.

Figure 10:
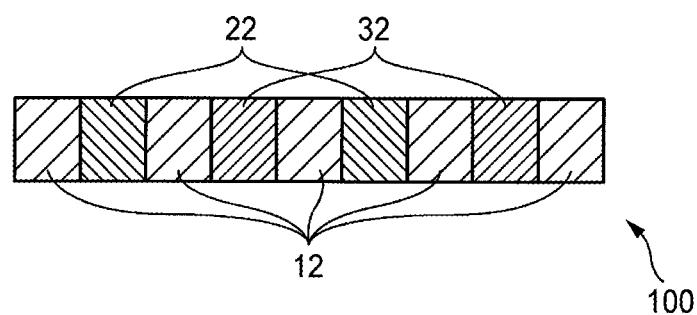
FIG. 10 is a schematic cross-sectional view showing a state in which the third colored radiation-sensitive layer in FIG. 9 is removed.

Then, the third colored radiation-sensitive layer 31 is removed by exposing and developing a position 31A of the third colored radiation-sensitive layer 31 corresponding to the second through-hole part group 122 provided in the first colored layer 11 (step (D)), whereby, as shown in the schematic cross-sectional view of FIG. 10, a color filter 100 having the first colored pattern 12, the second colored pattern 22 and the third colored pattern 32 is produced.

Next, methods of producing a color filter according to the second embodiment and the third embodiment of the invention are described.

In the method of producing a color filter according to the second embodiment or the third embodiment of the invention, first of all, a first colored layer is formed using a colored composition (first colored composition) described above according to the invention in the same manner as in step (A) of the first embodiment described above.

Then, the first colored layer is subjected to patterning with dry etching so as to form a plurality of first through-holes as a through-hole group (step (B)). Thus, a first colored pattern is formed.

The dry etching of the first colored layer 11 is conducted with etching gas using a patterned photoresist layer as a mask. In the same manner as in the first embodiment, for example, as shown in the schematic cross-sectional view of FIG. 3, a photoresist layer 51 is first formed on the first colored layer 11. The method of forming photoresist layer, materials for the photoresist layer and preferred thickness of the photoresist layer are same as those described in the first embodiment.

Figure 11:
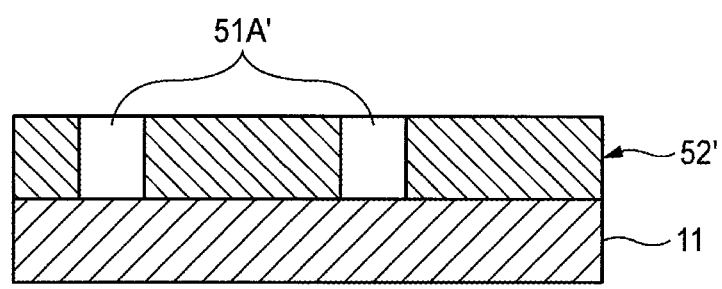
FIG. 11 is a schematic cross-sectional view showing a state in which a resist pattern is formed on the first colored layer.

According to the second embodiment or the third embodiment, as shown in the schematic cross-sectional view of FIG. 11, a resist pattern (patterned photoresist layer) 52' provided with a plurality of resist through-holes 51A' is formed by exposure and development of the photoresist layer 51.

The formation of the resist pattern 52' is not particularly restricted and can be conducted by appropriately optimizing heretofore known techniques of photolithography. By providing the plurality of resist through-holes 51A' in the photoresist layer 51 by exposure and development, the resist pattern 52' which is used as a etching mask in a subsequent etching process is provided on the first colored layer 11.

Figure 12:
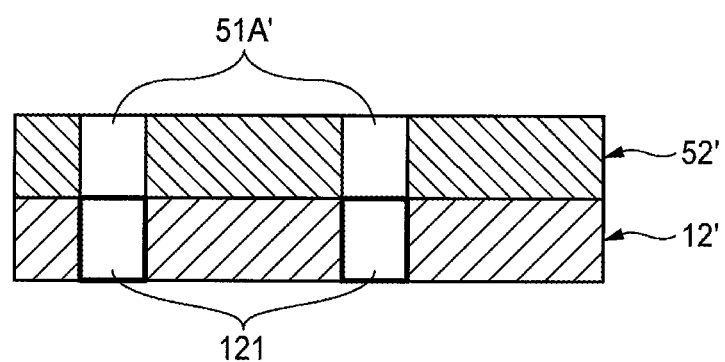
FIG. 12 is a schematic cross-sectional view showing a state in which a first colored pattern is formed by providing a plurality of through-holes in the first colored layer with etching.

Then, as shown in the schematic cross-sectional view of FIG. 12, the first colored layer 11 is subjected to patterning with dry etching so as to form a plurality of first through-holes 121 in the first colored layer 11 using the resist pattern 52' as an etching mask. Thus, a first colored pattern 12' is formed. The first through-hole 121 corresponds to the first through-hole portion group 121 in the first embodiment. Therefore, the plurality of first through holes 121 formed in the first colored layer 11 each has preferably a square shape.

The method of obtaining the resist pattern 52' by patterning including the formation, exposure and development of the photoresist layer and preferred embodiments thereof and the method of dry etching and preferred embodiments thereof are same as the methods and preferred embodiments thereof described in the first embodiment.

Figure 13:
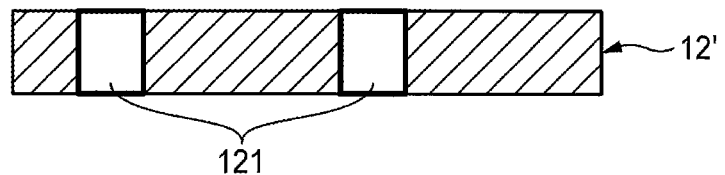
FIG. 13 is a schematic cross-sectional view showing a state in which the resist pattern in FIG. 12 is removed.

Then, as shown in the schematic cross-sectional view of FIG. 13, the resist pattern (that is, etching mask) 52' remaining after the etching is preferably removed. The removal of the resist pattern 52' can be conducted in the same manner as in the removal of the resist pattern 52 described in the first embodiment.

Figure 14:
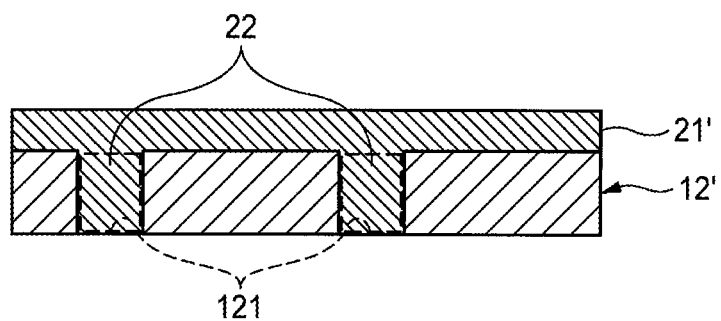
FIG. 14 is a schematic cross-sectional view showing a state in which a second colored pattern and a second colored layer are formed.

Then, as shown in the schematic cross-sectional view of FIG. 14, a second colored layer 21' is stacked using a second colored composition on the first colored layer so as that an inside of each through-hole of the first through-hole 121 is filled with the second colored composition to form a plurality of second colored pixels (step (C')). Thus, a second colored pattern 22 having the plurality of second colored pixels is formed in the first through-hole group 121 in the first colored layer 11.

The second colored pixel is preferably a pixel having a square shape. The formation of the second colored layer 21' can be carried out in the same manner as in the method of forming the first colored layer 11 described above.

Preferred ranges of the thickness of second colored layer 21' is same as the preferred ranges of the thickness of second colored radiation-sensitive layer described in the first embodiment.

Then, a plurality of first colored pixel is formed by patterning with dry etching so as to form a plurality of second through-holes different from the plurality of first through-holes in the first colored layer (step (D')).

Before conducting the step (D') or after conducting the step (D'), a step of conducting a planarization treatment (step (D")) is conducted.

Due to the difference whether the step of conducting a planarization treatment (step (D")) is conducted before conducting the step (D') or the step of conducting a planarization treatment (step (D")) is conducted after conducting the step (D'), there are two embodiments. Hereinafter, an embodiment wherein the step of conducting a planarization treatment (step (D")) is conducted before conducting the step (D') is referred to as a second embodiment and an embodiment where the step of conducting a planarization treatment (step (D")) is conducted after conducting the step (D') is referred to as a third embodiment.

First, the second embodiment where the planarization treatment is conducted before conducting the step (D') and after the step (C') of stacking the second colored layer in the method of producing a color filter according to the invention is explained.

In the second embodiment, the step (D") of conducting a planarization treatment of the second colored layer until at least the first colored layer is revealed before conducting the step (D') of forming a plurality of first colored pixels by patterning with dry etching so as to form a plurality of second through-holes different front the plurality of first through-holes in the first colored layer.

Figure 15:
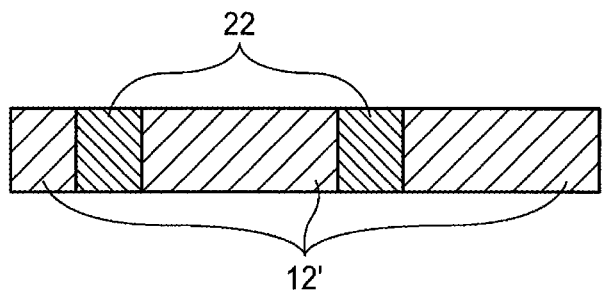
FIG. 15 is a schematic cross-sectional view showing a state in which the second colored layer in FIG. 14 is removed by a planarization treatment.

Thus, the second colored layer 21' shown in the schematic cross-sectional view of FIG. 14 can be removed. The cross-sectional view of FIG. 15 indicates a state where the second colored layer 21' shown in the schematic cross-sectional view of FIG. 14 is removed by the planarization treatment.

The planarization treatment includes, for example, an etch-back treatment where the entire surface is subjected to dry etching or a polishing treatment, for example, a chemical mechanical polishing (CMP) treatment where the entire surface is subjected to chemical and mechanical polishing.

As a slurry used for the polishing (CMP) treatment, an aqueous solution having pH from 9 to 11 and containing from 0.5 to 20% by weight of $SiO_2$ abrasive grain having a particle size from 10 to 100 nm is preferably used. As a polishing pad, a soft type, for example, continuously foamed urethane is preferably used. The polishing is performed by using the slurry and polishing pad described above under the conditions of a slurry flow rate from 100 to 250 ml/min, a wafer pressure from 0.2 to 5.0 psi and a retainer ring pressure from 1.0 to 2.5 psi. After the completion of the polishing treatment, a cleaning process where the polished surface is subjected to a precision cleaning treatment and a dehydration treatment process where the cleaned surface is subjected to a dehydration bake treatment (preferably at temperature from 100 to 200° C. for 1 to 5 minutes) (dehydration treatment) are conducted.

Figure 16:
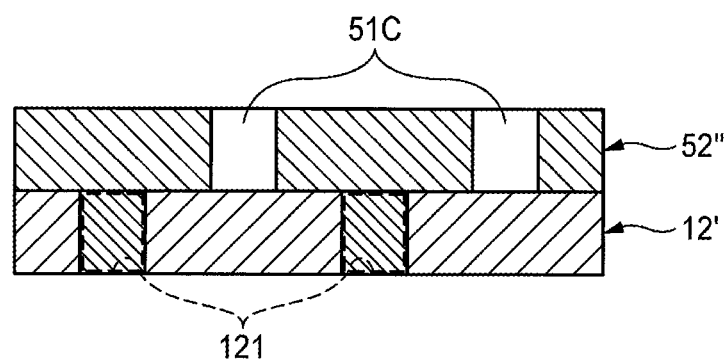
FIG. 16 is a schematic cross-sectional view showing a state in which the second colored layer in FIG. 14 is removed by a planarization treatment and a resist pattern is formed on the first color layer.
Figure 17:
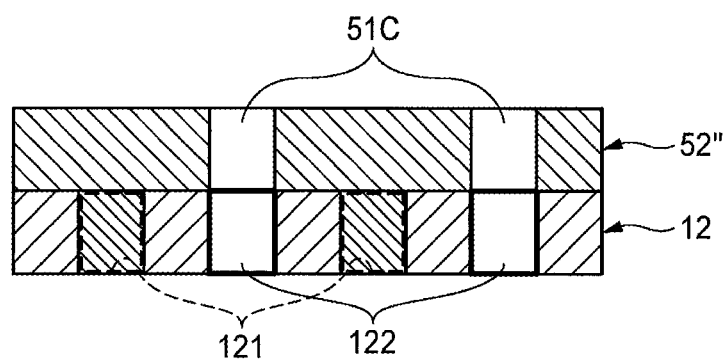
FIG. 17 is a schematic cross-sectional view showing a state in which a plurality of through-holes are further provided in the first colored layer with etching.

Then, the step (D') is conducted by a step of obtaining a resist pattern 52" having a plurality of resist through-holes 51C by patterning the photoresist layer with conducting exposure and development as shown in the schematic cross-sectional view of FIG. 16 and a step of dry etching the first colored layer 11 using the resist pattern 52" as an etching mask as shown in the schematic cross-sectional view of FIG. 17. Thus, a plurality of second through-holes 122 is formed in the first colored pattern 12'. As a result, the plurality of first through-holes 121 and the plurality of second through-holes 122 are provided checkerwise in the first colored layer 11 and the first colored pattern 12 obtained has a plurality of first colored pixels each having a square shape.

The method of obtaining the resist pattern 52" by patterning including the formation, exposure and development of the photoresist layer and preferred embodiments thereof and the method of dry etching and preferred embodiments thereof are same as the methods and preferred embodiments thereof described in the first embodiment.

Then, as shown in the schematic cross-sectional view of FIG. 8, the resist pattern (that is, etching mask) 52" remaining after the etching is removed. The removal of the resist pattern 52" can be conducted in the same manner as in the method described for the removal of the resist pattern 52' above.

Next, the third embodiment where the planarization treatment is conducted after conducting the step (D') and before a step (E) of stacking a third colored radiation-sensitive layer described hereinafter is explained.

Figure 18:
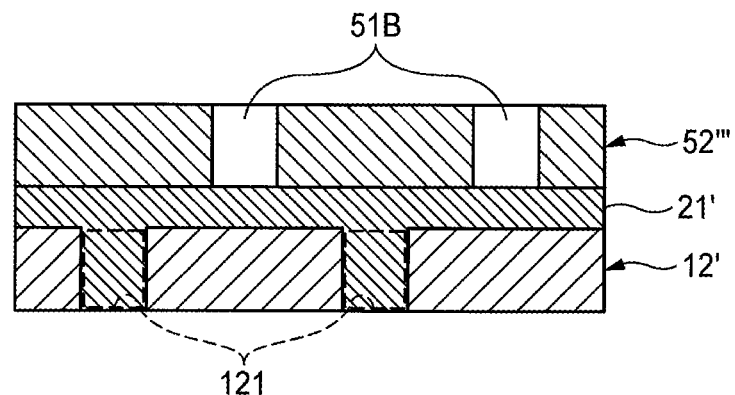
FIG. 18 is a schematic cross-sectional view showing a state in which a resist pattern is formed on the second colored layer.
Figure 19:
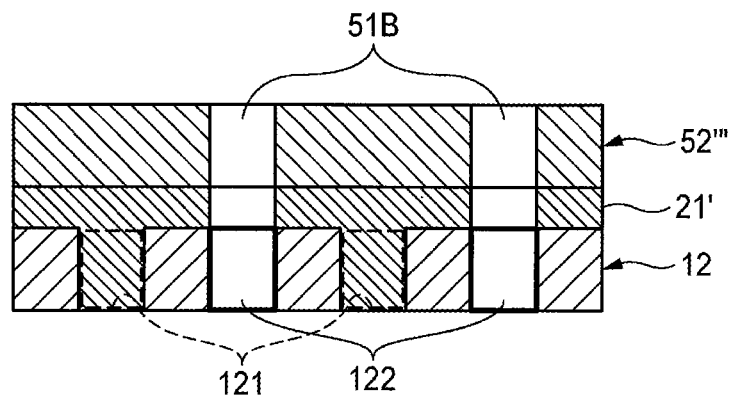
FIG. 19 is a schematic cross-sectional view showing a state in which a plurality of through-holes are provided in the first colored layer and the second colored layer with etching.

In the third embodiment, as shown in the schematic cross-sectional view of FIG. 18, the step (D') is conducted by a step of obtaining a resist pattern 52''' having a plurality of resist through-holes 51B by patterning the photoresist layer with conducting exposure and development as shown in the schematic cross-sectional view of FIG. 18 and a step of dry etching the first colored layer 11 using the resist pattern 52''' as an etching mask as shown in the schematic cross-sectional view of FIG. 19. Thus, a plurality of second through-holes 122 is formed in the first colored pattern 12'. As a result, the plurality of first through-holes 121 and the plurality of second through-holes 122 are provided checkers in the first colored layer 11 and the first colored pattern 12 obtained has a plurality of first colored pixels each having a square shape.

The method of obtaining the resist pattern 52''' by patterning including the formation, exposure and development of the photoresist layer and preferred embodiments thereof and the method of dry etching and preferred embodiments thereof are same as the methods and preferred embodiments thereof described above.

Figure 20:
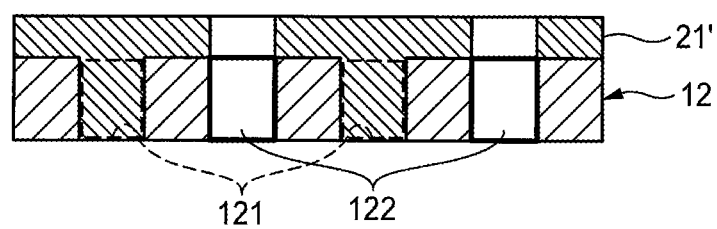
FIG. 20 is a schematic cross-sectional view showing a state in which the resist pattern in FIG. 19 is removed.

Then, as shown in the schematic cross-sectional view of FIG. 20, the resist pattern (that is, etching mask) 52''' remaining after the etching is removed. The removal of the resist pattern 52''' can be conducted in the same manner as in the method described for the removal of the resist pattern 52' above.

Then, the second colored layer 21' shown in the schematic cross-sectional view of FIG. 20 is removed by conducting the planarization treatment. Thus, the second colored layer 21' in the schematic cross-sectional view of FIG. 20 is removed by the planarization treatment to obtain the state shown in the schematic cross-sectional view of FIG. 8 same as in the first embodiment or the second embodiment.

The method of the planarization treatment and preferred embodiments thereof are same as those described above.

Then, as to the first colored layer 11 having the plurality of second through-holes 122 obtained by the second embodiment or the third embodiment as shown in the schematic cross-sectional view of FIG. 8, the third colored radiation-sensitive layer 31 is stacked using the third colored radiation-sensitive composition on the first colored layer (that is, the first colored pattern 12 having the second colored pattern 22 formed in the first through-hole part group 121) so as that an inside of each through-hole of the second through-holes 122 is filled with the third colored radiation-sensitive composition to form a plurality of third colored pixels (step (E)) same as in the first embodiment, as shown in the schematic cross-sectional view of FIG. 9. Thus, a third colored pattern 32 having the plurality of third colored pixels is formed in the second through-hole 122 in the first colored layer 11.

The third colored pixel is preferably a pixel having a square shape. The formation of the third colored radiation-sensitive layer 31 can be carried out in the same manner as in the method of funning the first colored layer 11 described above.

Preferred ranges of the thickness of the third colored radiation-sensitive layer 31 are same as the preferred ranges of the thickness of the third colored radiation-sensitive layer 31 in the first embodiment.

Then, the third colored radiation-sensitive layer 31 is removed by exposing and developing a position 31A of the third colored radiation-sensitive layer 31 corresponding to the second through-hole 122 provided in the first colored layer 11 (step (D)) same as in the first embodiment. Thus, as shown in the schematic cross-sectional view of FIG. 10, a color filter 100 having the first colored pattern 12, the second colored pattern 22 and the third colored pattern 32 is produced.

Next a method of producing a color filter according to the fourth embodiment of the invention is described.

In the fourth embodiment of the invention, the first colored layer 12 as shown in the schematic cross-sectional view of FIG. 8, that is, the first colored pattern 12 having the second colored pattern 22 formed in the first through-hole part group (plurality of the first through-holes) 121 and the plurality of second through-holes 122 formed is formed according to the method same as in the second embodiment.

Figure 21:
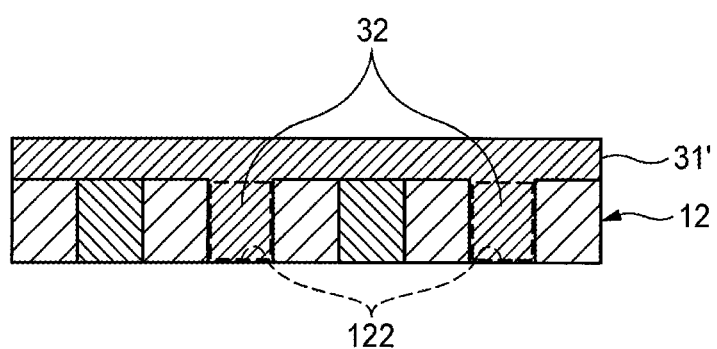
FIG. 21 is a schematic cross-sectional view showing a state in which a third colored pattern and a third colored layer are funned.

Then, as shown in the schematic cross-sectional view of FIG. 21, a step (E') is conducted wherein a third colored radiation-sensitive layer 31' is formed using a third colored radiation-sensitive composition on the first colored layer (that is, the first colored pattern 12 having the second colored pattern 22 formed in the first through-hole part group 121) so as that an inside of each through-hole of the second through-hole 122 is filled with the third colored radiation-sensitive composition to form a plurality of third colored pixels. Thus, a third colored pattern 32 having the plurality of third colored pixels is formed in the second through-hole 122 in the first colored layer 11.

The third colored pixel is preferably a pixel having a square shape. The formation of the third colored radiation-sensitive layer 31' can be carried out in the same manner as in the method of forming the first colored layer 11 described above.

Preferred ranges of the thickness of the third colored layer 31' are same as the preferred ranges of the thickness of the third colored radiation-sensitive layer 31 in the first embodiment.

Then, the third colored layer 31' stacked on the first colored layer (that is, the first colored pattern 12 wherein the second colored pattern 22 and the third colored pattern 32 are formed in the first through-hole part group 121 and the second through-hole part group 122, respectively) is subjected to a step of conducting a planarization treatment until at least the first colored layer is revealed (step (F')) to be removed.

The method of the planarization treatment and preferred embodiments thereof are same as the method of the planarization treatment and preferred embodiments thereof described in the second embodiment and the third embodiment.

Thus, as shown in the schematic cross-sectional view of FIG. 10, a color filter 100 having the first colored pattern 12, the second colored pattern 22 and the third colored pattern 32 is produced.

Next, a method of producing a color filter according to the fifth embodiment of the invention is described.

The fifth embodiment of the invention is an embodiment wherein the planarization treatment in not conducted before conducting the step (D') of forming a plurality of first colored pixels by patterning with dry etching so as to form a plurality of second through-holes different from the plurality of first through-holes in the first colored layer in the fourth embodiment. In other words, in the fifth embodiment, a state just after conducting the step (D') is same as the state shown in the schematic cross-sectional view of FIG. 20 described in the third embodiment.

Figure 22:
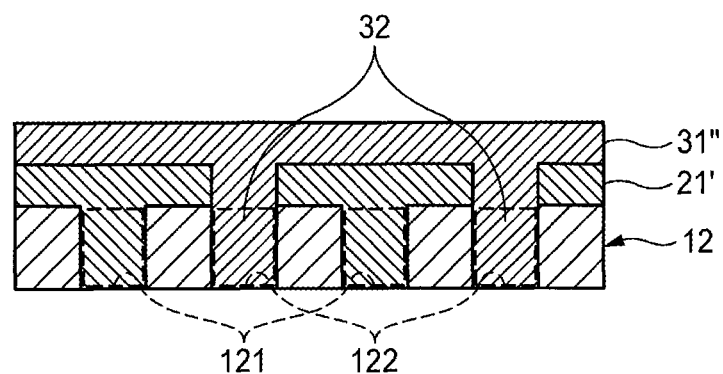
FIG. 22 is a schematic cross-sectional view showing a state in which a third colored pattern and a third colored layer are formed.

Then, as shown in the schematic cross-sectional view of FIG. 22, a layer composed of the second colored layer 21' and the third colored layer 31" formed using a third colored radiation-sensitive composition is stacked on the first colored layer (that is, the first colored pattern 12 having the second colored pattern 22 formed in the first through-hole part group 121) so as that an inside of each through-hole of the second through-hole 122 is filled with the third colored composition to form a plurality of third colored pixels (step (E').

The third colored pixel is preferably a pixel having a square shape. The formation of the third colored layer 31" can be conducted in the same manner as in the method of forming the first colored layer 11 described above.

Preferred ranges of the thickness of the third colored layer 31" are same as the preferred ranges of the thickness of the third colored radiation-sensitive layer 31 in the first embodiment.

Then, the layer composed of the second colored layer 21' and the third colored layer 31" stacked on the first colored layer (that is, the first colored pattern 12 wherein the second colored pattern 22 and the third colored pattern 32 are formed in the first through-hole part group 121 and the second through-hole part group 122, respectively) is subjected to conducting a planarization treatment until at least the first colored layer is revealed (step (F')) to be removed.

Thus, as shown in the schematic cross-sectional view of FIG. 10, a color filter 100 having the first colored pattern 12, the second colored pattern 22 and the third colored pattern 32 is produced.

The method of the planarization treatment and preferred embodiments thereof are same as the method of the planarization treatment and preferred embodiments thereof described in the second embodiment and the third embodiment.

The second colored composition (including a configuration of the second colored radiation-sensitive composition) and the third colored composition (including a configuration of the third colored radiation-sensitive composition) contains coloring agents, respectively. Although as to the coloring agents, those described above in the colored composition according to the invention are similarly exemplified, it is preferred that one of the second colored pixel and the third colored pixel is a red color transmission part and the other is a blue color transmission part portion. The colored agent contained in the colored composition for forming the red color transmission part is preferably one or more coloring agents selected from C. I. Pigment Orange 2, 5, 13, 16, 17:1, 31, 34, 36, 38, 43, 46, 48, 49, 51, 52, 55, 59, 60, 61, 62, 64, 71 and 73 and C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272 and 279, and the colored agent contained in the colored composition for forming the blue color transmission part is preferably one or more coloring agents selected from C. I. Pigment Violet 1, 19, 23, 27, 32, 37 and 42 and C. I. Pigment Blue 1, 2, 15, 15:1, 15:2, 15:3, 15:4, 15:6, 16, 22, 60, 64, 66, 79 and 80.

The second colored composition and the third colored composition may contain as components other than the coloring agent, the components other than the coloring agent in the colored composition according to the invention described above, respectively. Preferred ranges of the contents of the components other than the coloring agent based on the total solid content of the colored composition are same as the ranges described in the colored composition according to the invention above.

As the second colored radiation-sensitive composition and the third colored radiation-sensitive composition, negative radiation-sensitive compositions are preferably used, respectively. As the negative radiation-sensitive composition, a negative radiation-sensitive composition, which responds to radiation, for example, an ultraviolet ray (g-ray, h-ray or i-ray), a far ultraviolet ray including an excimer laser or the like, an electron beam, an ion beam or an X-ray, is used. Of the radiations, g-ray, h-ray or i-ray is preferred and i-ray is more preferred for the exposure.

Specifically, the negative radiation-sensitive composition is preferably a composition containing, for example, a photopolymerization initiator, a polymerization component (polymerizable compound) and a binder resin (for example, an alkali-soluble resin) is preferred and includes, for example, compositions described in Paragraph Nos. [0017] to [0064] of JP-A-2005-326453. It is utilized that in such a negative radiation-sensitive composition, due to irradiation of radiation the photopolymerization initiator initiates a polymerization reaction of the polymerizable compound and as a result, the composition is changed from an alkali-soluble state to an alkali-insoluble state.

The exposure of the second colored radiation-sensitive layer 21 or the third colored radiation-sensitive layer 31 can be conducted by exposure, for example, to g-ray, h-ray or i-ray, preferably exposure to i-ray.

The development carded out after the exposure is ordinarily conducted by development processing with a developer. As the developer, those same as the developers described for the exposure and development of the photoresist layer 51 are exemplified.

When an aqueous alkaline solution is used as the developer, a washing treatment with water is ordinarily conducted after the development.

In each of the second colored pixel and the third colored pixel, the content of the coloring agent to the pixel is preferably 30% by weight or more, more preferably 35% by weight or more, and still more preferably 40% by weight or more. Also, the content of the coloring agent to the pixel is ordinarily 90% by weight or less, and preferably 80% by weight or less.

Specifically, the content of the coloring agent based on the total solid content of the colored composition for liming each of the second colored pixel and the third colored pixel is preferably in the range described above.

A length of a side of the first colored pixel, second colored pixel or third colored pixel (indicating a length of a short side when the pixel is a rectangle and a length of a side when the pixel is a square) is preferably from 0.5 to 1.7 μm, more preferably from 0.6 to 1.5 μm, from the standpoint of image resolution.

As described above, according to the method of producing a color filter of the invention, the green color layer for forming a green color pixel can be formed in a state where the color separation is highly excellent by using the colored composition for forming a green color filter according to the invention. Further, in the case of forming a green color pixel by applying dry etching to the green color layer, a difference between the spectral characteristic of the green color layer and the spectral characteristic of the green color pixel is small and the excellent color separation characteristic expressed by the green color layer can be surely passed to the green color pixel. As a result, the color filter of high performance can be produced.

The color filter obtained from the colored composition according to the invention can be suitably used for a liquid crystal display device (LCD) or a solid-state imaging device (for example, CCD or CMOS). Also, it can be suitably used for an image display device, for example, electronic paper or an organic EL. In particular, the color filter according to the invention can be suitably used for a solid-state imaging device, for example, CCD or CMOS.

Further, the color filter according to the invention is suitable as a color filter for a liquid crystal display device. The liquid crystal display device equipped with the color filter can display images of high image quality having good tint and excellent display characteristics.

The definition of the display device and details of the respective display devices are described, for example, in Akio Sasaki, *Denshi Display Device (Electronic Display Device)*, published by Kogyo Chosakai Publishing Co., Ltd. (1990) and Sumiaki Ibuki, *Display Device (Display Device)*, published by Sangyo-Tosho Publishing Co., Ltd. (1989). The liquid crystal display devices are described, for example, in Tatsuo Uchida, ed., *Jisedai Ekisho Display Gijustu (Next Generation Liquid Crystal Display Techniques)*, published by Kogyo Chosakai Publishing Co., Ltd. (1994). The liquid crystal display device to which the invention can be applied is not specifically restricted and the invention can be applied to liquid crystal display devices of various systems described, for example, in *Jisedai Ekisho Display Gijustu (Next Generation Liquid Crystal Display Techniques)* above.

The color filter according to the invention is useful for color TFT liquid crystal display devices. The color TFT Liquid crystal display device is described, for example, in *Color TFT Ekisho Display* (*Color TFT Liquid Crystal Display*), published by Kyoritsu Shuppan Co., Ltd. (1996). Further, the invention can also be applied to liquid crystal display devices with enlarged viewing angle, for instance, of a transverse electric field driving system, for example, IPS or of a pixel division system, for example, MVA, and STN, TN, VA, OCS, FFS and R-OCB.

Moreover, the color filter according to the invention is applicable to a COA (Color-filter On Array) system with brightness and high definition.

In a colored layer formed in the COA system, it is necessary to farm a conductive path, for example, a rectangular through-hole having a length of a side approximately from 1 to 15 μm or a reversed C-shaped recess in order to bring an ITO electrode arranged on the colored layer and a terminal of a driving substrate below the colored layer into conduction. The dimension of the conductive path (that is, length of a side) is particularly preferably set to 5 μm or less, and it is also possible to form a conductive path of 5 μm or less by using the invention. These image display systems are described, for example, in *EL, PDP, LCD Display—Gijutsu to Shijo no Saishin Doko—*(*EL, PDP, LCD Display—Current Trend of Techniques and Markets—*), published by Investigative Research Department, Toray Research Center, Inc. (2001), page 43.

The liquid crystal display device according to the invention is composed of as well as the color filter according to the invention, various members, for example, an electrode substrate, a polarizing film, a retardation film, a backlight, a spacer or a viewing angle compensation film. The color filter according to the invention is applied to liquid crystal display devices composed of these known members. These members are described, for example, in Kentaro Shima, '94 *Ekisho Display Shuhen Zairyo Chemicals no Shijo* ('94 *Markets of Peripheral Materials and Chemicals for Liquid Crystal Display*), published by CMC Publishing Co., Ltd. (1994) and Ryokichi Omote, 2003 *Ekisho Kanren Shijo no Genjyo to Shourai Tenbo* (*Gekan*) (2003 *Liquid Crystal Related Market and Future Outlook* (*Last Volume*), published by Fuji Chimera Research Institute Inc. (2003).

The backlight is described, for example, in A. Konno et al., *SID Meeting Digest* 1380 (2005) and *Gekkan Display* (*Monthly Display*), December, 2005, pages 18 to 24 (Yasuhiro Shima) and pages 25 to 30 (Takaaki Yagi).

In case of using the color filter according to the invention in the liquid crystal display device, a high contrast is achieved when combined with a heretofore known three-wavelength cold-cathode tube. In addition, by using LED light sources (RGB-LED) of red, green and blue as the backlight, a liquid crystal display device having high brightness and good color reproducibility with high color purity can be provided.

EXAMPLES

The present invention will be specifically described below with reference to the following examples, but the invention should not be construed as being limited thereto. Unless otherwise particularly indicated, "part" and "%" are on a weight basis. In case of conducting a treatment using a commercially available treating solution in each step, unless otherwise particularly indicated, the treatment is conducted according to the method specified by the maker.

Examples 1 to 11 and Comparative Examples 1 to 6

Preparation of Colored Composition for Forming Green Color Filter

The components shown in Table 1 were dissolved in the solvent shown in Table 1 and mixed and dispersed by a bead mill for 15 hours to prepare a colored composition for forming a green color filter having a total solid content of 17% by weight.

TABLE 1

| | Color Pigment (weight ratio) | Percent by Weight | Dispersing Agent | Percent by Weight | Curable Compound | Percent by Weight | Solvent | Light Transmittance of Green Color Layer at Wavelength of 450 nm | Light Transmittance of Green Color Layer at Wavelength of 550 nm |
|---|---|---|---|---|---|---|---|---|---|
| Example 1 | PG36 | 60 | A | 35 | EHPE3150 | 5 | PGMEA | 44 | 92 |
| Example 2 | PG36/PY139 (60/40) | 60 | A | 35 | EHPE3150 | 5 | PGMEA | 4.1 | 93 |
| Example 3 | PG36/PY150 (60/40) | 60 | A | 35 | EHPE3150 | 5 | PGMEA | 8 | 92 |
| Example 4 | PG36/PY185 (60/40) | 60 | A | 35 | EHPE3150 | 5 | PGMEA | 8 | 90 |
| Example 5 | PG58 | 60 | A | 35 | EHPE3150 | 5 | PGMEA | 38 | 88 |
| Example 6 | PG58 | 65 | A | 30 | EHPE3150 | 5 | PGMEA | 35 | 89 |
| Example 7 | PG58 | 70 | A | 25 | EHPE3150 | 5 | PGMEA | 32 | 90 |
| Example 8 | PG58/PY139 (60/40) | 60 | A | 35 | EHPE3150 | 5 | PGMEA | 7.4 | 92 |
| Example 9 | PG58/PY150 (60/40) | 60 | A | 35 | EHPE3150 | 5 | PGMEA | 7.3 | 93 |
| Example 10 | PG58/PY185 (60/40) | 60 | A | 35 | EHPE3150 | 5 | PGMEA | 7.2 | 92 |
| Example 11 | PG58/PY185 (60/40) | 60 | B | 35 | EHPE3150 | 5 | PGMEA | 7.2 | 93 |
| Comparative Example 1 | PG36 | 35 | A | 60 | EHPE3150 | 5 | PGMEA | 62 | 90 |

TABLE 1-continued

| | Color Pigment (weight ratio) | Percent by Weight | Dispersing Agent | Percent by Weight | Curable Compound | Percent by Weight | Solvent | Light Transmittance of Green Color Layer at Wavelength of 450 nm | Light Transmittance of Green Color Layer at Wavelength of 550 nm |
|---|---|---|---|---|---|---|---|---|---|
| Comparative Example 2 | PG58 | 35 | A | 60 | EHPE3150 | 5 | PGMEA | 57 | 94 |
| Comparative Example 3 | PG36/PG58 (50/50) | 35 | A | 60 | EHPE3150 | 5 | PGMEA | 59 | 93 |
| Comparative Example 4 | PG58/PY185 (60/40) | 35 | A | 60 | EHPE3150 | 5 | PGMEA | 22 | 93 |
| Comparative Example 5 | PG36/PY185 (60/40) | 35 | A | 60 | EHPE3150 | 5 | PGMEA | 23 | 92 |
| Comparative Example 6 | PG58/PY139 (60/40) | 35 | A | 60 | EHPE3150 | 5 | PGMEA | 14.7 | 94 |

The abbreviations and compounds described in Table 1 are shown below.
(Color pigment)
PG36: C.I. Pigment Green 36
PG58: C.I. Pigment Green 58
PY139: C.I. Pigment Yellow 139
PY150: C.I. Pigment Yellow 150
PY185: C.I. Pigment Yellow 185

(Dispersing Agent)
In Dispersing Agent A shown below, the numerical value attached to each structural unit (the numerical value attached to the repeating unit of the main chain) indicates the content (% by weight: shown as (wt %)) of the structural unit. The numerical value attached to the repeating portion of the side chain indicates the number of repetitions of the repeating portion.

Also, 3.5 and 2.5 in Dispersing Agent B each represents a number of the partial structure shown in the parentheses.
Dispersing Agent A:

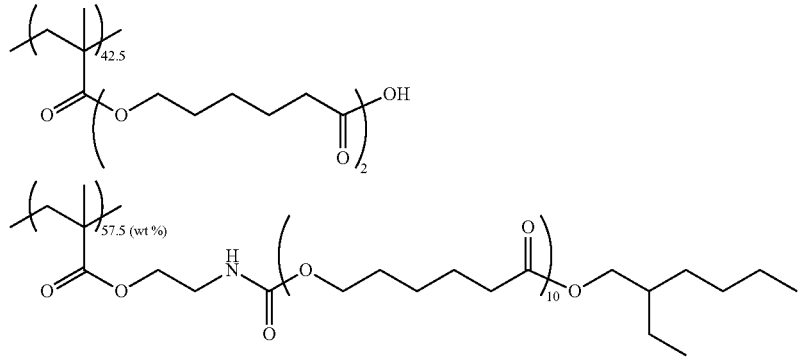

Mw=20,000, Acid value=77 mgKOH/g
Dispersing Agent B:

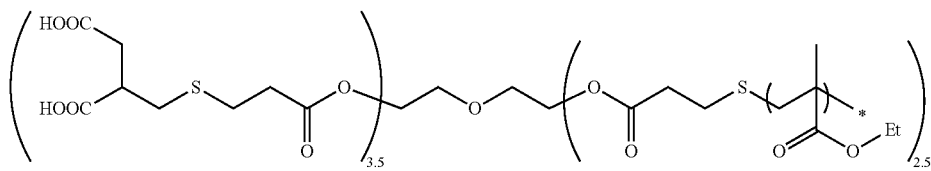

Mw=20,000, Acid value=22 mgKOH/g
(Curable Compound)
EHPE3150: Trade name of epoxy resin produced by Daicel Corp.
(Solvent)
PGMEA: Propylene glycol monomethyl ether acetate <Step of Forming Green Color Pattern (Green Color Pixel) by Dry Etching>
(Formation of Green Color Layer)
The colored composition for forming green color filter for each of the examples and comparative examples was coated on a glass wafer by a spin coater so as to form a layer having a thickness of 0.6 μm, dried by a hot plate at 100° C. for 180 seconds and then subjected to a heat treatment (post bake) using a hot plate at 200° C. for 300 seconds to form a green color layer. The thickness of the green color layer was 0.6 μm.

(Coating of Resist for Mask)

Then, a positive resist (FHi622BC, produced by FUJIFILM Electronic Materials Co., Ltd.) was coated on the green color layer and subjected to pre bake to form a photoresist layer having a thickness of 0.8 μm.

(Pattern Exposure and Development of Resist for Mask)

Then, the photoresist layer was subjected to pattern exposure using an i-ray stepper (produced by Canon Inc.) in an exposure amount of 350 mJ/cm$^2$ and then heat treatment for one minute at temperature at which the temperature of the photoresist layer or ambient temperature reached 90° C. Then, development processing was conducted using a developer (FHD-5, produced by FUJIFILM Electronic Materials Co., Ltd.) for one minute and then a post back treatment was conducted at 110° C. for one minute to from a resist pattern. The resist pattern formed was a pattern in which square resist films each having one side length of 1.25 μm were arranged checkerwise, in consideration of an etching conversion difference (decrease in a pattern width by etching).

(Dry Etching)

Then, using the resist pattern as an etching mask, dry etching of the green color layer was conducted in the procedure described below.

A first stage etching treatment was conducted for 80 seconds using a dry etching device (U-621, produced by Hitachi, Ltd.) under the conditions of RP power: 800 W; antenna bias: 400 W; wafer bias: 200 W; inner pressure of chamber: 4.0 Pa; substrate temperature: 50° C.; and the kind and flow rate of mixed gas: $CF_4$: 80 ml/min, $O_2$: 40 ml/min and Ar: 800 ml/min.

The scraping amount of the green color layer under the conditions described above was 534 nm (etching amount of 89%) and about 58 nm of the green color layer remained.

Then, a second stage etching treatment and an over etching treatment were conducted with an over-etching ratio of 20% to the total etching using the same etching device under the conditions of RF power: 600 W; antenna bias: 100 W; wafer bias: 250 W; inner pressure of chamber: 2.0 Pa; substrate temperature: 50° C.; and the kind and flow rate of mixed gas: $N_2$: 500 ml/min, $O_2$: 50 ml/min and Ar: 500 ml/min ($N_2/O_2$/Ar=10/1/10).

The etching rate of the green color layer under the conditions of second stage etching treatment was 600 nm/min or more and it took a period of about 10 seconds to etch the remaining green color layer. By adding 10 seconds of the etching time for the second stage etching treatment to 80 seconds of the etching time for the first stage etching treatment, the etching time was calculated. As a result, the etching time was 80+10=90 seconds, the over-etching time was 90×0.2=18 seconds, and the total etching time was 90+18=108 seconds.

After conducting the dry etching under conditions described above, a stripping treatment was conducted using a photoresist stripping solution (MS230C, produced by FUJIFILM Electronic Materials Co., Ltd.) for 120 seconds to remove the resist pattern, and then washing with pure water and spin drying were conducted. Thereafter, a dehydration baking treatment was conducted at 100° C. for 2 minutes. Thus, a green color pattern in which square green color pixels each having one side length of 1.2 μm were arranged checkerwise was obtained.

<Evaluation Method>

(1) Measurement of Light Transmittance of Green Color Layer

The light transmittance at a wavelength of 450 nm (hereinafter, referred to as "$T_{l(450)}$") and light transmittance at a wavelength of 550 nm of the green color layer formed by the formation of green color layer above were measured by a spectrophotometer (UV-3600 UV-VIS-NIR Spectrophotometer, produced by Shimadzu Corp.). The results of measurement are shown in Table 1.

(2) Measurement of Light Transmittance of Green Color Pixel Formed after Dry Etching The light transmittance at a wavelength of 450 nm (hereinafter, referred to as "$T_{p(450)}$") of the green color pixel formed by the dry etching above was measured by a spectrophotometer (UV-3600 UV-VIS-NIR Spectrophotometer, produced by Shimadzu Corp.). An amount of light transmission change (%) represented by formula: $T_{p(450)}-T_{l(450)}$ was shown in Table 2. The smaller amount of light transmission change means that a difference between the spectral characteristic of the green color layer and the spectral characteristic of the green color pixel is smaller and the color separation characteristic expressed by the green color layer is passed better to the green color pixel. The results of measurement are shown in Table 2.

TABLE 2

| | Amount of Light Transmission Change at Wavelength of 450 nm (%) |
|---|---|
| Example 1 | 7 |
| Example 2 | 6 |
| Example 3 | 6 |
| Example 4 | 5 |
| Example 5 | 4 |
| Example 6 | 4 |
| Example 7 | 3 |
| Example 8 | 3 |
| Example 9 | 2 |
| Example 10 | 1 |
| Example 11 | 1 |
| Comparative Example 1 | 15 |
| Comparative Example 2 | 14 |
| Comparative Example 3 | 14 |
| Comparative Example 4 | 13 |
| Comparative Example 5 | 14 |
| Comparative Example 6 | 13 |

As is apparent from Table 1 above, the colored compositions for forming green color filter for Examples 1 to 11 can form the green color layer for forming green color pixel in a state where color separation is highly excellent in comparison with the colored compositions for forming green color filter for Comparative Example 1, because the light transmittance at a wavelength of 550 nm of the layer having a thickness of 0.6 μm formed from the colored composition was 80% or more and the light transmittance at a wavelength of 450 nm of the layer was 50% or less.

Further, as is apparent from Table 2 above, as to the colored compositions for forming green color filter for Examples 1 to 11, a difference between the light transmittance at a wavelength of 450 nm of the green color layer and the light transmittance at a wavelength of 450 nm of the green color pixel is small and the color separation characteristic expressed by the green color layer can be surely passed to the green color pixel and as a result, the color filter having the excellent performance can be produced in comparison with the colored compositions for forming green color filter for Comparative Example 1. The effect is particularly remarkable in Examples 5 to 11 using C. I. Pigment Green 58 as the color pigment.

(Preparation of Red Pigment Dispersion)

A mixed solution composed of 8.3 parts by weight of C. I. Pigment Red 254 and 3.7 parts by weight of C. I. Pigment Yellow 139 as pigments, 4.8 parts by weight of BYK-161 (produced by BYK Chemie) as a pigment dispersing agent and 83.2 parts by weight of PGMEA was mixed and dispersed in a bead mill for 15 hours to prepare Red pigment dispersion R1.

(Preparation of Blue Pigment Dispersion)

A mixed solution composed of 9.5 parts by weight of C. I. Pigment Blue 15:6 and 2.4 parts by weight of C. I. Pigment Violet 23 as pigments, 5.6 parts by weight of BYK-161 (produced by BYK Chemie) as a pigment dispersing agent and 82.5 parts by weight of PGMEA was mixed and dispersed in a bead mill for 15 hours to prepare Blue pigment dispersion B1.

(Preparation of Colored Radiation-Sensitive Composition for Forming Red Filter)

| | |
|---|---|
| Pigment dispersion: Red pigment dispersion R1 described above | 51.2 parts |
| Photopolymerization initiator: IRGACURE OXE-01 (produced by BASF) | 0.87 parts |
| Polymerizable compound: KAYARAD RP-1040 (produced by Nippon Kayaku Co., Ltd.) | 4.7 parts |
| Binder: ACA230AA (produced by Daicel Corp.) | 7.4 parts |
| Polymerization inhibitor: p-Methoxyphenol | 0.002 parts |
| Additive: PIONIN D-6112-W (produced by Takemoto Oil & Fat Co., Ltd.) | 0.19 parts |
| Silane coupling agent: 0.9% Cyclohexanone solution of KBM-602 (produced by Shin-Etsu Chemical Co., Ltd.) | 10.8 parts |
| Organic solvent: PGMEA | 14.3 parts |
| Organic solvent: Cyclohexanone | 6.4 parts |
| Fluorine-based surfactant: 0.2% Cyclohexanone solution of F-781 (produced by DIC Corp.) | 4.2 parts |

(Preparation of Colored Radiation-Sensitive Composition for Forming Blue Filter)

| | |
|---|---|
| Pigment dispersion: Blue pigment dispersion B1 described above | 51.2 parts |
| Photopolymerization initiator: IRGACURE OXE-01 (produced by BASF) | 0.87 parts |
| Polymerizable compound: KAYARAD RP-1040 (produced by Nippon Kayaku Co., Ltd.) | 4.7 parts |
| Binder: ACA230AA (produced by Daicel Corp.) | 7.4 parts |
| Polymerization inhibitor: p-Methoxyphenol | 0.002 parts |
| Additive: PIONIN D-6112-W (produced by Takemoto Oil & Fat Co., Ltd.) | 0.19 parts |
| Silane coupling agent: 0.9% Cyclohexanone solution of KBM-602 (produced by Shin-Etsu Chemical Co., Ltd.) | 10.8 parts |
| Organic solvent: PGMEA | 14.3 parts |
| Organic solvent: Cyclohexanone | 6.4 parts |
| Fluorine-based surfactant: 0.2% Cyclohexanone solution of F-781 (produced by DIC Corp.) | 4.2 parts |

Each green color pattern in which square green color pixels each having one side length of 1.2 μm were arranged checkerwise and which was prepared using the colored composition for forming green color filter of each of the examples in the step of framing green color pattern (green color pixel) by dry etching was prepared. The colored radiation-sensitive composition for forming red filter was coated on the green color pattern so as that an inside of each through-hole of the green color pattern was filled with the colored radiation-sensitive composition for forming red filter and that the thickness after drying and post bake became 0.40 μm to obtain a stacked color filter composed of the red color radiation-sensitive layer formed on the green color layer (corresponding to the state shown in FIG. 7).

The red color radiation-sensitive layer of the stacked color filter thus-obtained was subjected to pattern exposure using an i-ray stepper (produced by Canon Inc.) in an exposure amount of 350 mJ/cm$^2$. The exposed areas were areas corresponding to the through-halls located in even lines in the checkered green color pattern (corresponding to the position 21A in the second colored radiation-sensitive layer 21 corresponding to the first through-hole part group 121 formed in the first colored layer 11 (refer to FIG. 7)).

Then, the stacked color filter after exposure was mounted on a horizontal rotary table of a spin shower developing machine (Model DW-30, produced by Chemitronics Co., Ltd.) and subjected to puddle development at 23° C. for 60 seconds using a 60% diluted solution of CD-2000 (produced by FUJIFILM Electronic Materials Co., Ltd.). Then, the color filter was fixed on the horizontal rotary table with a vacuum chuck system, and subjected to a rinse treatment by supplying a shower of pure water from a jet nozzle above the center of rotation while the color fitter was rotated by a rotator at a rotation speed of 50 rpm, followed by spray drying.

Thus, a color filter precursor in which the red color radiation-sensitive layer and the red color pixels formed in the inside of the through-holes located in odd lines in the checkered green color pattern were removed was obtained (corresponding to the state shown in FIG. 8).

As to the green color pixel of the color filter precursor, the light transmittance at a wavelength of 450 nm was measured according to the method described above and the measured value was almost same as the measured value of $T_{p(450)}$ described above.

Then, the colored radiation-sensitive composition for forming blue filter was coated on the color filter precursor so as that an inside of each through-hole of the green color pattern of the color filter precursor was filled with the colored radiation-sensitive composition for forming blue filter and that the thickness after drying and post bake became 0.40 μm to obtain a stacked color filter composed of the blue color radiation-sensitive layer formed on the green color layer (corresponding to the state shown in FIG. 9).

The blue color radiation-sensitive layer of the stacked color filter thus-obtained was subjected to pattern exposure using an i-ray stepper (produced by Canon Inc.) in an exposure amount of 350 mJ/cm$^2$. The exposed areas were areas corresponding to the through-halls located in odd lines in the checkered green color pattern (corresponding to the position 31A in the third colored radiation-sensitive layer 31 corresponding to the second through-hole part group 122 formed in the first colored layer 11 (refer to FIG. 9)).

Then, the stacked color filter after exposure was mounted on a horizontal rotary table of a spin shower developing machine (Model DW-30, produced by Chemitronics Co., Ltd.) and subjected to puddle development at 23° C. for 60 seconds using a 60% diluted solution of CD-2000 (produced by FUJIFILM Electronic Materials Co., Ltd.). Then, the color filter was fixed on the horizontal rotary table with a vacuum chuck system, and subjected to a rinse treatment by supplying a shower of pure water from a jet nozzle above the center of rotation while the color filter was rotated by a rotator at a rotation speed of 50 rpm, followed by spray drying.

Thus, a color filter in which the blue color radiation-sensitive layer in the stacked color filter was removed was obtained (corresponding to the state shown in FIG. 10).

As to the green color pixel of the color filter, the light transmittance at a wavelength of 450 nm was measured according to the method described above and the measured value was almost same as the measured value of $T_{p(450)}$ described above.

Specifically, after the production of the color filter precursor described above and after the production of the final color filter described above, the light transmittance at a wavelength of 450 nm was almost same as the measured value of $T_{p(450)}$ described above, and it can be seen that the excellent color separation characteristic expressed by the green color layer is surely passed to the green color pixel in the color filter finally obtained.

This application is based on Japanese Patent application JP 2011-190185, filed on Aug. 31, 2011, the entire content of which is hereby incorporated by reference, the same as if fully set forth herein.

The invention claimed is:

1. A method of producing a color filter comprising (A) a step of forming a first colored layer comprising a first colored composition and (B) a step of patterning with dry etching so as to form a through-hole group in the first colored layer, wherein:
the first colored composition is a colored composition for forming a green color filter, comprising a color pigment, wherein the content of the color pigment to the total solids content of the colored composition is 60% by weight or more, and a layer having a thickness of 0.6 μm formed from the colored composition has light transmittance of 80% or more at a wavelength of 550 nm and light transmittance of 50% or less at a wavelength of 450 nm; and
the through-hole group comprises a first through-hole part group and a second through-hole part group and the method further comprises (C) a step of stacking a second colored radiation-sensitive layer comprising a second colored radiation-sensitive composition on the first colored layer so as that an inside of each through-hole of the first through-hole part group and second through-hole part group is filled with the second colored radiation-sensitive composition to form a plurality of second colored pixels, (D) a step of exposing a position of the second colored radiation-sensitive layer corresponding to the first through-hole part group provided in the first colored layer to cure the second colored radiation-sensitive layer, and removing an unexposed portion of the second colored radiation-sensitive layer and the plurality of second colored pixels formed in the inside of each through-hole of the second through-hole part group provided in the first colored layer with development, (E) a step of stacking a third colored radiation-sensitive layer comprising a third colored radiation-sensitive composition on the first colored layer so as that an inside of each through-hole of the second through-hole part group is filled with the third colored radiation-sensitive composition to form a plurality of third colored pixels, and (F) a step of exposing a position of the third colored radiation-sensitive layer corresponding to the second through-hole part group provided in the first colored layer to cure the third colored radiation-sensitive layer, and removing an unexposed portion of the third colored radiation-sensitive layer with development.

2. The method of producing a color filter as claimed in claim 1, wherein the color pigment in the first colored composition is a green pigment.

3. The method of producing a color filter as claimed in claim 2, wherein the green pigment in the first colored composition is one or more pigments selected from the group consisting of C. I. Pigment Green 7, C. I. Pigment Green 36 and C. I. Pigment Green 58.

4. The method of producing a color filter as claimed in claim 3, wherein the green pigment in the first colored composition is C. I. Pigment Green 58.

5. The method of producing a color filter as claimed in claim 2, wherein the first colored composition further comprises a yellow pigment.

6. The method of producing a color filter as claimed in claim 5, wherein the yellow pigment in the first colored composition is one or more pigments selected from the group consisting of C. I. Pigment Yellow 139, C. I. Pigment Yellow 150 and C. I. Pigment Yellow 185.

7. The method of producing a color filter as claimed in claim 1 wherein the first colored layer is a green color transmission layer.

8. The method of producing a color filter as claimed in claim 1, wherein one of the second colored pixel and the third colored pixel is a red color transmission part and the other is a blue color transmission part.

9. The method of producing a color filter as claimed in claim 1, wherein the content of the coloring agent to the second colored pixel is 30% by weight or more and the content of the coloring agent to the third colored pixel is 30% by weight or more.

10. The method of producing a color filter as claimed in claim 1, wherein the first colored composition contains a graft polymer containing a structural unit represented by any of formulae (1) to (4):

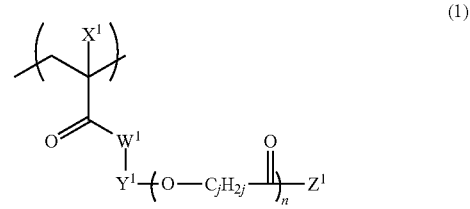

(1)

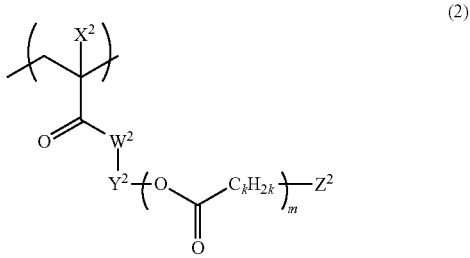

(2)

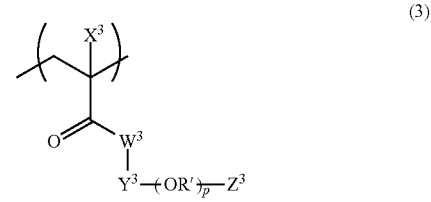

(3)

-continued

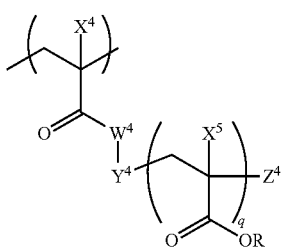

(4)

wherein:
in formulae (1) to (4), $X^1$, $X^2$, $X^3$, $X^4$ and $X^5$ each independently represents a hydrogen atom or a monovalent organic group;
$W^1$, $W^2$, $W^3$ and $W^4$ each independently represents an oxygen atom or NH;
$Y^1$, $Y^2$, $Y^3$ and $Y^4$ each independently represents a divalent connecting group;
$Z^1$, $Z^2$, $Z^3$ and $Z^4$ each independently represents a hydrogen atom or a monovalent substituent; and n, m, p and q each represents an integer from 1 to 500;
in formulae (1) and (2), j and k each independently represents an integer from 2 to 8;
in formula (3), R' represents a branched or strait-chain alkylene group, with the proviso that two or more R's having different structures may be used as a mixture in the graft polymer; and
in formula (4), R represents a hydrogen atom or a monovalent organic group, with the proviso that two or more Rs having different structures may be used as a mixture in the graft polymer.

11. The method of producing a color filter as claimed in claim 1, wherein the first colored composition contains a green pigment and a yellow pigment, and the weight ratio of the green pigment to the yellow pigment is in a range from 100:20 to 100:150.

12. The method of producing a color filter as claimed in claim 11, wherein the green pigment is C. I. Pigment Green 58.

* * * * *